(12) United States Patent
Komatsu et al.

(10) Patent No.: US 10,079,055 B2
(45) Date of Patent: *Sep. 18, 2018

(54) SEMICONDUCTOR INTEGRATED CIRCUIT DEVICE AND SYSTEM

(71) Applicant: Renesas Electronics Corporation, Tokyo (JP)

(72) Inventors: Shigenobu Komatsu, Kodaira (JP); Masanao Yamaoka, White Plains, NY (US); Noriaki Maeda, Tachikawa (JP); Masao Morimoto, Koganei (JP); Yasuhisa Shimazaki, Kodaira (JP); Yasuyuki Okuma, Hachioji (JP); Toshiaki Sano, Tachikawa (JP)

(73) Assignee: Renesas Electronics Corporation, Tokyo (*) Notice: Subject to any disclaimer, the term of this patent is extended or adjusted under 35 U.S.C. 154(b) by 0 days.

This patent is subject to a terminal disclaimer.

(21) Appl. No.: 15/648,702

(22) Filed: Jul. 13, 2017

(65) Prior Publication Data

US 2017/0309327 A1 Oct. 26, 2017

Related U.S. Application Data

(63) Continuation of application No. 15/050,074, filed on Feb. 22, 2016, now Pat. No. 9,734,893, which is a (Continued)

(30) Foreign Application Priority Data

Sep. 14, 2009 (JP) .................................. 2009-211335

(51) Int. Cl.
*G11C 5/14* (2006.01)
*G11C 11/417* (2006.01)
(Continued)

(52) U.S. Cl.
CPC .............. *G11C 11/417* (2013.01); *G11C 5/06* (2013.01); *G11C 5/14* (2013.01); *G11C 11/413* (2013.01);
(Continued)

(58) Field of Classification Search
CPC ....... G11C 11/417; G11C 5/14; G11C 11/413; G11C 5/06; H01L 27/1104; H01L 27/092
See application file for complete search history.

(56) References Cited

U.S. PATENT DOCUMENTS 5,986,923 A 11/1999 Zhang et al.
7,400,546 B1 7/2008 Barth et al.
(Continued)

FOREIGN PATENT DOCUMENTS

JP 04-038698 2/1992
JP 2000-059200 2/2000
(Continued)

OTHER PUBLICATIONS

Yusuke Kanno et al., "Hierarchical Power Distribution With Power Tree in Dozens of Power Domains for 90-nm Low-Power Multi-CPU SoCs", IEEE Journal of Solid-State Circuits, vol. 42, No. 1, Jan. 2007, pp. 74-83.
(Continued)

*Primary Examiner* — Khamdan Alrobaie
(74) *Attorney, Agent, or Firm* — Shapiro, Gabor and Rosenberger, PLLC

(57) ABSTRACT

A semiconductor integrated circuit which can respond to changes of the amount of retained data at the time of standby is provided. The semiconductor integrated circuit comprises a logic circuit (logic) and plural SRAM modules. The plural SRAM modules perform power control independently of the logic circuit, and an independent power control is performed among the plural SRAM modules. Specifically, one terminal
(Continued)

and the other terminal of a potential control circuit of each SRAM module are coupled to a cell array and a local power line, respectively. The local power line of one SRAM module and the local power line of the other SRAM module share a shared local power line. A power switch of one SRAM module and a power switch of the other SRAM module are coupled in common to the shared local power line.

9 Claims, 23 Drawing Sheets

Related U.S. Application Data continuation of application No. 14/692,566, filed on Apr. 21, 2015, now Pat. No. 9,368,194, which is a continuation of application No. 14/490,461, filed on Sep. 18, 2014, now Pat. No. 9,053,975, which is a continuation of application No. 12/855,691, filed on Aug. 12, 2010, now Pat. No. 8,854,869.

(51) Int. Cl.
H01L 27/11 (2006.01)
G11C 5/06 (2006.01)
G11C 11/413 (2006.01)
H01L 27/092 (2006.01)

(52) U.S. Cl.
CPC ........ H01L 27/092 (2013.01); H01L 27/1104 (2013.01)

(56) References Cited

U.S. PATENT DOCUMENTS

| | | | |
|---|---|---|---|
| 8,854,869 | B2 | 10/2014 | Komatsu et al. |
| 9,053,975 | B2 | 6/2015 | Komatsu et al. |
| 9,251,875 | B1* | 2/2016 | Atallah ................ G11C 11/419 |
| 9,368,194 | B2 | 6/2016 | Komatsu et al. |
| 2003/0076705 | A1 | 4/2003 | Yamamoka et al. |
| 2004/0071032 | A1 | 4/2004 | Yamamoka et al. |
| 2004/0125681 | A1 | 7/2004 | Yamamoka et al. |
| 2004/0215869 | A1 | 10/2004 | Mekkittikul et al. |
| 2005/0232054 | A1 | 10/2005 | Yamaoka et al. |
| 2006/0268647 | A1 | 11/2006 | Yamaoka et al. |
| 2007/0040575 | A1 | 2/2007 | Afghahi et al. |
| 2007/0097756 | A1 | 5/2007 | Hirota et al. |
| 2007/0159874 | A1 | 7/2007 | Yamaoka et al. |
| 2008/0019205 | A1 | 1/2008 | Yamaoka et al. |
| 2008/0151604 | A1 | 6/2008 | Suzuki |
| 2008/0224729 | A1 | 9/2008 | Afghahi et al. |
| 2008/0316800 | A1 | 12/2008 | Yamaoka et al. |
| 2009/0097302 | A1 | 4/2009 | Yamaoka et al. |
| 2009/0189685 | A1 | 7/2009 | Terzioglu et al. |
| 2009/0273960 | A1 | 11/2009 | Kim et al. |
| 2010/0080046 | A1 | 4/2010 | Yamaoka et al. |
| 2010/0308897 | A1 | 12/2010 | Evoy et al. |
| 2011/0012206 | A1 | 1/2011 | Yamaoka et al. |
| 2011/0216579 | A1 | 9/2011 | Yamaoka et al. |
| 2012/0195110 | A1 | 8/2012 | Yamaoka et al. |
| 2013/0170287 | A1 | 7/2013 | Walsh et al. |
| 2014/0003132 | A1 | 1/2014 | Kalkarni et al. |
| 2014/0112429 | A1 | 4/2014 | Bhatia et al. |
| 2016/0042783 | A1* | 2/2016 | Masuoka ............ H01L 27/092 365/154 |
| 2016/0126953 | A1* | 5/2016 | Ishii .................. H03K 19/0016 327/547 |

FOREIGN PATENT DOCUMENTS

| | | |
|---|---|---|
| JP | 2003-132683 | 5/2003 |
| JP | 2004-206745 | 7/2004 |
| JP | 2005-011166 | 1/2005 |
| JP | 2006-085786 | 3/2006 |
| JP | 2007-150761 | 6/2007 |
| JP | 2009-505588 | 2/2009 |

OTHER PUBLICATIONS

Office Action dated Feb. 13, 2014 for Japanese Application No. 2013-143233.
Office Action dated Jan. 31, 2013 for Japanese Application No. 2009-211335.
Office Action dated Sep. 24, 2015 for Japanese Application No. 2014-217143.
Office Action dated Apr. 14, 2016 for Japanese Application No. 2014-217143.

* cited by examiner

SEMICONDUCTOR INTEGRATED CIRCUIT DEVICE AND SYSTEM

CLAIM OF PRIORITY

The present application claims priority from Japanese patent application JP 2009-211335 filed on Sep. 14, 2009, and the content of which is hereby incorporated by reference into this application.

FIELD OF THE INVENTION

The present invention relates to a semiconductor integrated circuit and an operation method for the same, especially to technology which is effective in responding to changes of the amount of retained data in a standby state.

BACKGROUND OF THE INVENTION

According to miniaturization in a semiconductor manufacturing process, the number of MOSFETs which are integrated in a single LSI (LSI: Large Scale Integrated circuits) has increased, with an accompanied increase of leakage current. Especially in the mobile use, under the limited battery capacity, a system on a chip (SoC) of this family needs to satisfy a demand for a strict leakage current. According to Non-patent Document 1 cited below, the effective method in such a situation is cutting off a power supply to a standby IP, while maintaining a power supply to a necessary IP. Therefore, the fine grained power gating system which employs many power domains is needed, in order to realize a low power consumption LSI for a mobile SoC.

Patent Document 1 cited below describes an information processing device in which, in order to manage to balance a low standby current by power gating and a high-speed return from a standby mode by interruption, a first area comprises a central processing unit and a peripheral circuit module and a second area comprises an internal memory and a backup register, and current supply is controlled by a first power switch in the first area and current supply is controlled by a second power switch in the second area. When shifting to a standby mode, internal information is evacuated to the internal memory or the backup register, then the first power switch is set to an off state to stop current supply to the first area, and the second power switch is set to an off state to maintain the internal information evacuated to the second area.

Patent Document 2 cited below describes that, in order to reduce the leakage current of an SRAM circuit, a switch, a diode coupling MOS transistor, and a resistor are coupled in parallel between a source line to which a source electrode of a drive MOS transistor is coupled and the ground potential line. At the time of standby, the switch coupled between the source line and the ground potential line is controlled into an off state, and the potential of the source line is set to a level higher than the ground potential by the relation of the leakage current of the memory cell, the diode coupling MOS transistor, and the resistor; accordingly, the leakage current is reduced. A switch MOS transistor is coupled between the ground potential and the ground-potential-side power source line of the peripheral circuit of SRAM except a word driver. The switch MOS transistor is controlled into an off state by a control signal at the time of standby. Therefore, the potential of the ground-potential-side power source line of the peripheral circuit of SRAM rises, and the leakage current of the peripheral circuit at the time of standby is reduced.

Patent Document 3 cited below describes that a leakage current reduction circuit is coupled between a low potential terminal of a latch circuit or an SRAM cell comprising a CMOS, and a ground potential. The leakage current reduction circuit comprises an NMOS switching transistor, a control PMOS transistor, and a control NMOS transistor. A drain-to-source path of the NMOS switching transistor is coupled between the low potential terminal and the ground potential. A source, a gate, and a drain of the control PMOS transistor are coupled to a power supply voltage, a standby signal terminal, and a gate of the NMOS switching transistor, respectively. A drain, a gate, and a source of the control NMOS transistor are coupled to the low potential terminal, a gate of the NMOS switching transistor, and the standby signal terminal, respectively. At the time of operation of the circuit, in response to a low level signal of the standby signal terminal, the control PMOS transistor, the control NMOS transistor, and the NMOS switching transistor are set to an on state, an off state, and an on state, respectively, and the low potential terminal is coupled to the ground potential through a low impedance. Therefore, the latch circuit or SRAM cell comprising a CMOS performs a normal operation. At the time of standby, in response to a high level signal of the standby signal terminal, the control PMOS transistor and the control NMOS transistor are set to an off state and an on state, respectively. The NMOS switching transistor operates like an MOS diode with the leakage current of the latch circuit or the SRAM cell comprising a CMOS as a bias current, thereby keeping the potential of the low potential terminal to a constant potential higher than the ground potential. Accordingly, the leakage current at the time of standby is reduced.

Patent Document 4 cited below describes that, in order to manage to balance a static noise margin and a write-in margin even at a low power source voltage in a static type RAM, a voltage supplying circuit is coupled between a power supply voltage line and a memory cell power source line. At the time of writing, a high-level control signal is supplied to a gate of a P-channel MOSFET of the voltage supplying circuit, and the P-channel MOSFET is set to an off state; accordingly, a voltage of the memory cell power source line is reduced. Therefore, the static noise margin is reduced and the write-in margin is improved.

(Patent Document 1) Japanese Patent Laid-open No. 2005-011166.
(Patent Document 2) Japanese Patent Laid-open No. 2004-206745.
(Patent Document 3) Japanese Patent Laid-open No. 2007-150761.
(Patent Document 4) Japanese Patent Laid-open No. 2006-085786.
(Non-patent Document 1) Yusuke Kanno et al, "Hierarchical Power Distribution With Power Tree in Dozens of Power Domains for 90-nm Low-Power Multi-CPU SoCs", IEEE JOURNAL OF SOLID-STATE CIRCUITS, VOL. 42, NO. 1, JANUARY 2007, PP. 74-83.

SUMMARY OF THE INVENTION

The present inventors were engaged in research and development of a semiconductor integrated circuit with low power consumption in advance of the present invention.

FIG. 2 illustrates a configuration of a semiconductor integrated circuit examined by the present inventors in advance of the present invention.

A semiconductor integrated circuit illustrated in FIG. 2 comprises a logic circuit (logic), static type RAMs (SRAM1, SRAM2, SRAM3), and power switches PWSW21 and PWSW22. Each of the static type RAMs (SRAM1, SRAM2, SRAM3) comprises a cell array (cell_array), a peripheral circuit (peripheral), a source line potential control circuit (arvss_control), and peripheral circuit power switches PESW21, PESW22 and PESW23.

Since a control signal cnt21 falls at the time of power gating, a power switch PWSW21 coupled to the logic circuit (logic) and the static type RAM (SRAM1) is set to an off state. Therefore, potential of a local power source vssl21 inside a power source domain rises to a power supply potential Vdd, and the logic circuit (logic) and the static type RAM (SRAM1) which are coupled to the local power source vssl21 are brought to a cut-off state. Therefore, all stored data of the static type RAM (SRAM1) coupled to the local power source vssl21 are destroyed. Therefore, data which needs to be saved is stored in other static type RAMs (SRAM2, SRAM3) coupled to another local power source vssm22, and another power switch PWSW22 is maintained in an on state also at the time of power gating. As a result, the another local power source vssm22 is maintained at a ground potential Vss.

On the other hand, at the time of power gating, by a control circuit (RSCNT) of the peripheral circuit (peripheral) of the other static type RAMs (SRAM2, SRAM3) coupled to the other local power source vssm22, the peripheral circuit power switches PESW22 and PESW23 are controlled into an off state, and the source line potential control circuit arvss_control sets potential of the cell array source lines arvss22, arvss23 of the cell arrays (cell_array) of the other static type RAMs (SRAM2, SRAM3) to a little higher level than the ground potential Vss. Therefore, due to the off state of the peripheral circuit power switches PESW22, PESW23, it is possible to cut off a leakage current of the peripheral circuits (peripheral) other than a control circuit (RSCNT) and a part of circuits such as a word driver. Furthermore, due to the potential of a little higher level than the ground potential Vss of the cell array source lines arvss22 and arvss23, it is possible to reduce current of the cell array (cell_array) of the other static type RAMs (SRAM2, SRAM3) to such an extent that retained data of the cell array (cell_array) are not destroyed.

FIG. 3 illustrates a configuration of the source line potential control circuit (arvss_control) of the other static type RAMs (SRAM2, SRAM3) of the semiconductor integrated circuit, illustrated in FIG. 2, examined by the present inventors in advance of the present invention.

In FIG. 3, the cell array (cell_array) and the source line potential control circuit (arvss_control) are illustrated, and the peripheral circuit (peripheral) and the peripheral circuit power switch PESW are also illustrated. As illustrated in FIG. 3, the source line potential control circuit (arvss_control) comprises a power switch SW1, a resistor RN1, and a diode coupling MOS transistor MN1, which are coupled in parallel between a cell array source line arvss and the ground potential Vss. In response to falling of a control signal rs, the peripheral circuit power switch PESW is set to an off state, and a leakage current of the peripheral circuit (peripheral) other than the control circuit (RSCNT) and a word driver is cut off, and the power switch SW1 of the source line potential control circuit (arvss_control) is also set to an off state. As a result, due to a current path through the resistor RN1 and the diode coupling MOS transistor MN1 of the source line potential control circuit (arvss_control), the potential of the cell array source line arvss is set to a potential of a little higher level than the ground potential Vss, and current of the cell array (cell_array) of the other static type RAM (SRAM23) is reduced to such an extent that retained data of the cell array (cell_array) are not destroyed.

FIG. 4 illustrates an operating waveform of each part of the source line potential control circuit (arvss_control) of the other static type RAMs (SRAM2, SRAM3) of the semiconductor integrated circuit illustrated in FIG. 2, examined by the present inventors in advance of the present invention.

Since control signals rsb21, rsb22, and rsb23 fall when control signals rs21, rs22, and rs23 rise, the peripheral circuit power switches PESW21, PESW22, and PESW23 are set to an off state. In this way, by setting the peripheral circuit power switches PESW21, PESW22, and PESW23 to an off state, a current path from the peripheral circuit (peripheral) of each of the SRAM modules (SRAM1, SRAM2, SRAM3) to the ground potential Vss is cut off, and the potential of the local power lines vssp21, vssp22, and vssp23 of the peripheral circuit (peripheral) of the SRAM modules (SRAM1, SRAM2, SRAM3) rises to the power supply voltage Vdd or its neighborhood. However, control circuits (rscnt, RSCNT) which generate control signals rsb21, rsb22, rsb23 for controlling the peripheral circuit power switches PESW21, PESW22, and PESW23 are coupled not to the local power lines vssp21, vssp22, and vssp23, but to the other local power sources, vssl21, vssm22 directly, because it is necessary to output a low-level signal. In addition, a circuit which needs to output a low-level signal, like a word driver, is coupled to the other local power sources vssl21 and vssm22 directly, in a similar way. In response to falling of the control signals rsb21, rsb22, and rsb23, the source line potential control circuit (arvss_control) rises voltage of cell array source lines arvss21, arvss22, and arvss23. However, the voltage is risen to such a level that the retained data of the cell array cell_array of SRAM1, SRAM2, and SRAM3 are not destroyed (for example, hundreds of mV). Accordingly, it become possible to reduce a leakage current of SRAM1, SRAM2, and SRAM3, while keeping the retained data of SRAM1, SRAM2, and SRAM3.

Furthermore, when the logic circuit (logic) of a logic circuit part does not need to operate, a power supply to the logic circuit (logic) is cut off, by setting the control signal cnt21 to a low level to bring the power switch PWSW21 to an off state. As a result, the local power line vssl21 of the logic circuit (logic) goes up to the power supply voltage Vdd or its neighborhood. Since the cell array source line arvss21 of the cell array (cell_array) of the static type RAM (SRAM1) coupled to the local power line vssl21 goes up to the power supply voltage Vdd or its neighborhood at this time, the static type RAM (SRAM1) cannot hold the retained data any more.

Furthermore, when a control signal cnt22 is set at a low level in order to reduce power consumption, a deep standby state is realized. The power switch PWSW22 coupled to the other static type RAMs (SRAM2, SRAM3) is set to an off state, and the other local power source vssm22 also goes up to the power supply voltage Vdd or its neighborhood. As a result, it becomes possible to reduce a leakage current of the other static type RAMs (SRAM2, SRAM3).

As explained above, it is possible to reduce the consumption current of a semiconductor integrated circuit which comprises built-in plural SRAM modules like a system on a chip (SoC), with the control system illustrated in FIG. 2 through FIG. 4. However, according to the control system illustrated in FIG. 4, the plural SRAM modules are brought to a deep standby state collectively. According to the examination performed by the present inventors, it has been clarified that, in a semiconductor integrated circuit like a system on a chip (SoC), the amount of retained data of plural SRAM modules in a deep standby state changes greatly depending on an operating state or an operation program. It is also clarified by the examination by the present inventors that it is difficult for the control system illustrated in FIG. 4 to respond to changes in the amount of retained data in a deep standby state.

The present invention has been made as a result of the examination described above by the present inventors in advance of the present invention.

Therefore, the present invention intends to provide a semiconductor integrated circuit which can respond to changes in the amount of retained data in a standby state.

The present invention also intends to reduce a chip area of a semiconductor integrated circuit.

The above and other purposes and new features will become clear from description of the specification and the accompanying drawings of the present invention.

The following explains briefly typical inventions to be disclosed by the present application.

That is, a typical embodiment of the present invention is a semiconductor integrated circuit comprising a logic circuit (logic) and plural SRAM modules (SRAM2, SRAM3) which can store data related to the logic circuit.

The plural SRAM modules (SRAM2, SRAM3) can perform power control independently of the logic circuit (logic).

An independent power control can be performed among the plural SRAM modules (SRAM2, SRAM3) (refer to FIG. 5 and FIG. 11).

Specifically, one terminal (arvss) and another terminal (vssm) of a potential control circuit (arvss_control) of each SRAM module of the plural SRAM modules (SRAM2, SRAM3) are coupled to the cell array (cell_array) and a local power line (vssm), respectively.

A local power line (vssm) of one SRAM module of the plural SRAM modules (SRAM2, SRAM3) and a local power line (vssm) of another SRAM module of the plural SRAM modules (SRAM2, SRAM3) share a shared local power line (vssm22).

A power switch (PWSW22) of the one SRAM module of the plural SRAM modules (SRAM2, SRAM3) and a power switch (PWSW23) of the another SRAM module of the plural SRAM modules (SRAM2, SRAM3) are coupled in common to the shared local power line (vssm22) (refer to FIG. 11).

The following explains briefly an effect obtained by the typical inventions disclosed in the present application.

That is, according to the present invention, it is possible to provide a semiconductor integrated circuit which can respond to changes in the amount of retained data in a standby state.

DETAILED DESCRIPTION OF THE PREFERRED EMBODIMENTS

1. Summary of the Preferred Embodiments

Figure 1:
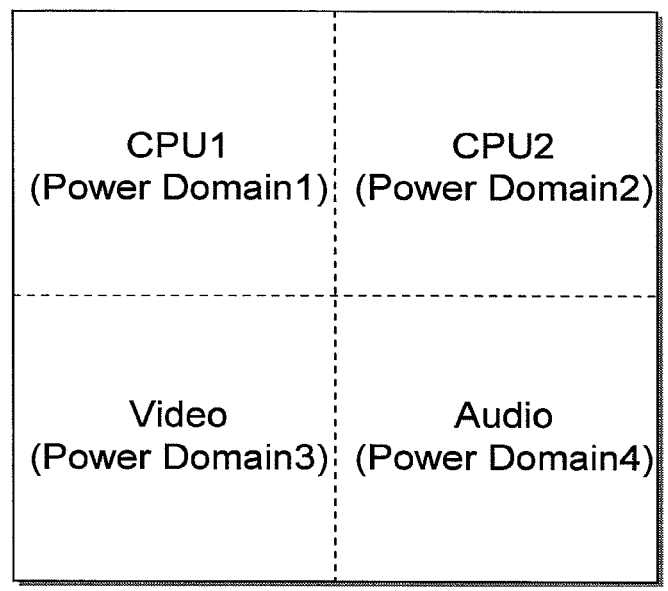
FIG. 1 is a drawing illustrating an example of a configuration of a semiconductor integrated circuit according to Embodiment 24 of the present invention which comprises three built-in SRAM modules (SRAM1, SRAM2, SRAM3) according to one of Embodiment 1 through Embodiment 23 of the present invention.

First, a summary is explained about typical embodiments of the invention disclosed in the present application. A reference symbol in parentheses referring to a component of the drawing in the summary explanation about the typical embodiments only illustrates what is included in the concept of the component to which the reference symbol is attached.

(1) A typical embodiment of the present invention is a semiconductor integrated circuit comprising a logic circuit (logic) and plural SRAM modules (SRAM2, SRAM3) which can store data related to the logic circuit.

The plural SRAM modules (SRAM2, SRAM3) can perform power control independently of the logic circuit (logic).

Figure 5:
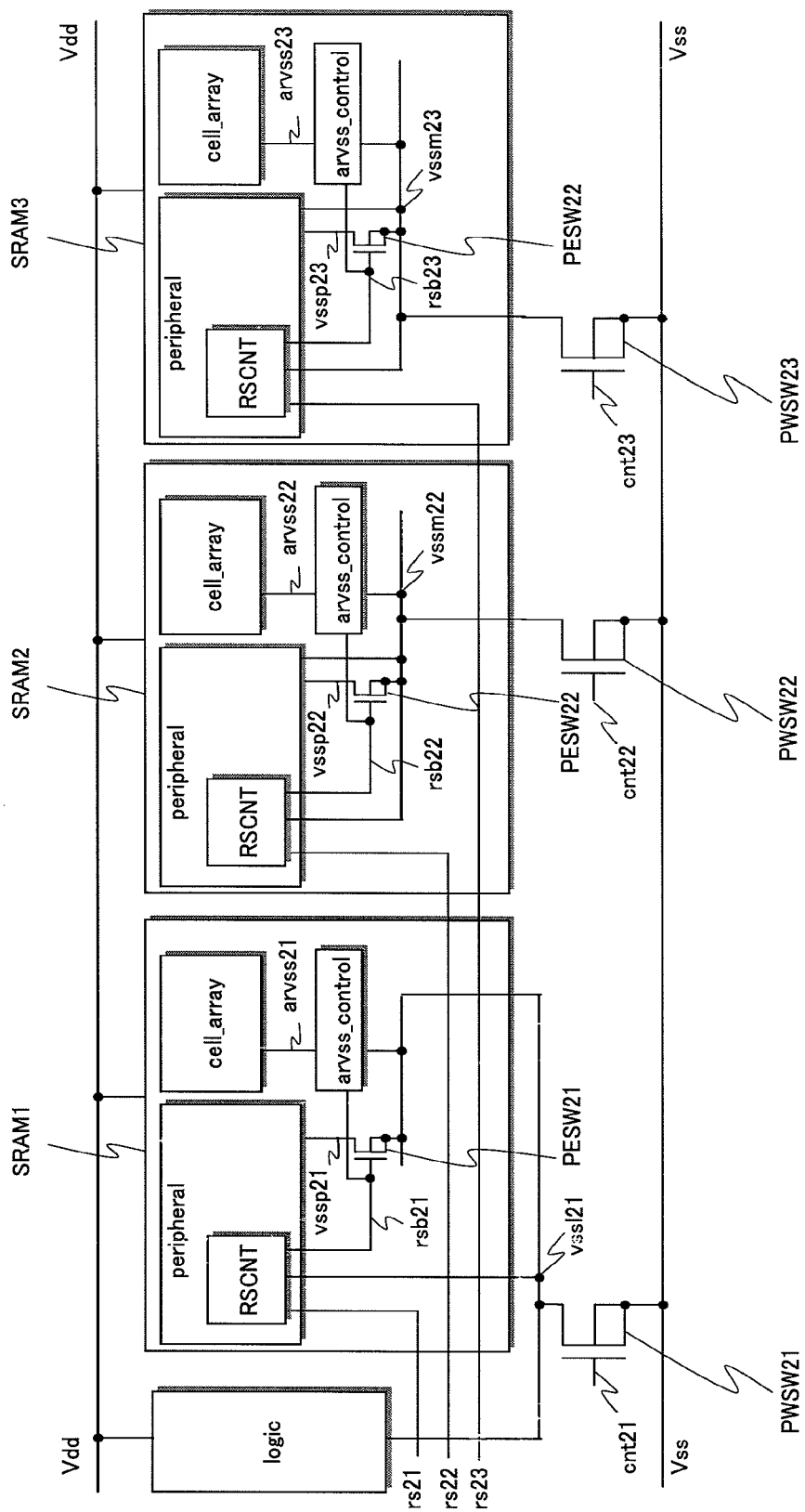
FIG. 5 is a drawing illustrating a configuration of a semiconductor integrated circuit according to Embodiment 1 of the present invention.
Figure 11:
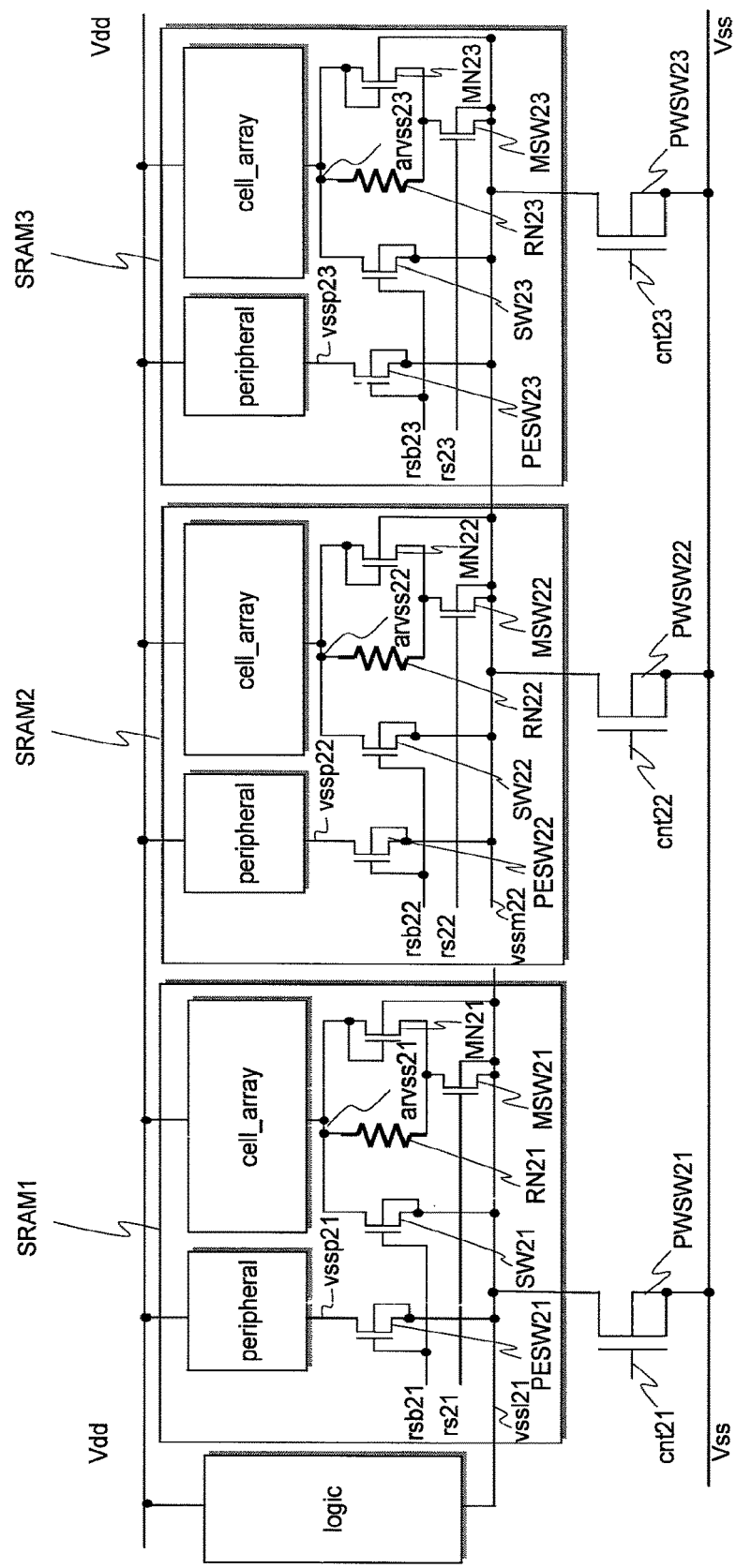
FIG. 11 is a drawing illustrating a configuration of a semiconductor integrated circuit according to Embodiment 2 of the present invention.

An independent power control can be performed among the plural SRAM modules (SRAM2, SRAM3) (refer to FIG. 5 and FIG. 11).

According to the embodiment, it is possible to respond to changes in the amount of retained data in a standby state.

A semiconductor integrated circuit according to a preferred embodiment further comprises another SRAM modules (SRAM1) which can perform power control in common with the logic circuit (logic).

The logic circuit and the another SRAM module can be controlled in common to a power gating state.

Before the logic circuit (logic) and the another SRAM module (SRAM1) are controlled in common to the power gating state, data of the another SRAM module (SRAM1) can be evacuated to at least one SRAM module of the plural SRAM modules (SRAM2, SRAM3) (refer to FIG. 5 and FIG. 11).

A semiconductor integrated circuit according to another preferred embodiment comprises plural power switches (PWSW21, PWSW22, PWSW23).

Each SRAM module of the another SRAM module (SRAM1) and the plural SRAM modules (SRAM2, SRANM3) is coupled with each power switch of the plural power switches (PWSW21, PWSW22, PWSW23) in series.

The each SRAM module can be controlled to the power gating state, by controlling the each power switch of the plural power switches (PWSW21, PWSW22, PWSW23) to an off state.

The each SRAM module is controlled to an active state and a standby state, by controlling the each power switch of the plural power switches (PWSW21, PWSW22, PWSW23) to an on state (refer to FIG. 5 and FIG. 11).

According to a more preferred embodiment, the each SRAM module comprises a peripheral circuit (peripheral), a cell array (cell_array), and a potential control circuit (arvss_control).

In the each SRAM module, the cell array (cell_array) and the potential control circuit (arvss_control) are coupled in series, and the series coupling of the cell array (cell_array) and the potential control circuit (arvss_control) is coupled with the peripheral circuit (peripheral) in parallel.

According to another more preferred embodiment, in the each SRAM module controlled to the active state, an inter-terminal voltage (arvss-vssm) between one terminal (arvss) and another terminal (vssm) of the potential control circuit (arvss_control) is controlled to a state of a low voltage, a power supply voltage (Vdd-Vss) is supplied to the peripheral circuit (peripheral), and the power supply voltage (Vdd-Vss) is supplied to the cell array (cell_array) by the potential control circuit (arvss_control).

In the each SRAM module controlled to the standby state, the inter-terminal voltage (arvss-vssm) of the potential control circuit (arvss_control) is controlled to a state of voltage higher than the low voltage, the power supply voltage (Vdd-Vss) to the peripheral circuit (peripheral) is cut off, and an operating voltage lower than the power supply voltage (Vdd-Vss) is supplied to the cell array (cell_array) by the potential control circuit (arvss_control).

In a specific embodiment, one terminal (arvss) and another terminal (vssm) of the potential control circuit (arvss_control) of each of the SRAM modules are coupled to the cell array (cell_array) and a local power line (vssm), respectively.

A local power line (vssm) of one SRAM module of the plural SRAM modules (SRAM2, SRAM3) and a local power line (vssm) of another SRAM module of the plural SRAM modules (SRAM2, SRAM3) share a shared local power line (vssm22).

A power switch (PWSW22) of the one SRAM module of the plural SRAM modules (SRAM2, SRAM3), and a power switch (PWSW23) of the another SRAM module of the plural SRAM modules (SRAM2, SRAM3) are coupled in common to the shared local power line (vssm22) (refer to FIG. 11).

In a more specific embodiment, a P-well which is used for formation of plural N-channel MOS transistors of the cell array (cell_array) of the one SRAM module of the plural SRAM modules (SRAM2, SRAM3) and a P-well which is used for formation of plural N-channel MOS transistors of the cell array (cell_array) of the another SRAM module of the plural SRAM modules (SRAM2, SRAM3) are formed by a common P-well (refer to FIG. 11).

Figure 3:
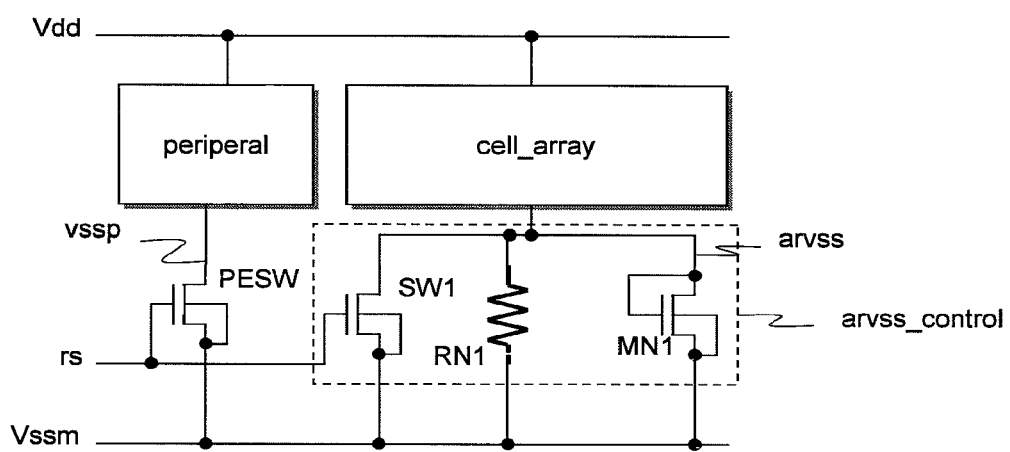
FIG. 3 is a drawing illustrating a configuration of a source line potential control circuit (arvss_control) of other static type RAMs (SRAM2, SRAM3) of the semiconductor integrated circuit, illustrated in FIG. 2, examined by the present inventors in advance of the present invention.

In another more specific embodiment, between the one terminal (arvss) and the another terminal (vssm) of the potential control circuit (arvss_control) of the each SRAM module, a voltage drop element (RN1, MN1) which changes the inter-terminal voltage (arvss-vssm) to the high voltage state and a control switch (SW1) which changes the inter-terminal voltage (arvss-vssm) to the low voltage state are coupled (refer to FIG. 3).

Figure 12:
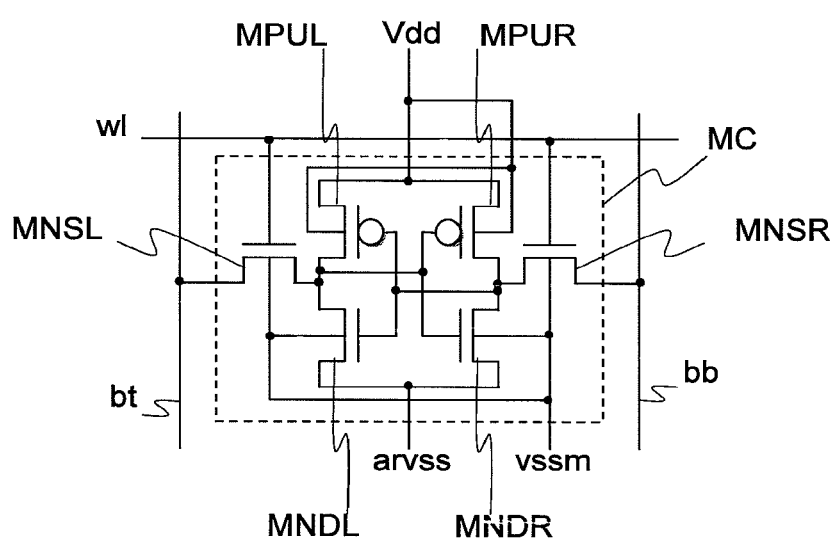
FIG. 12 is a drawing illustrating a configuration of plural memory cells (MC) included in each SRAM module of three SRAM modules (SRAM1, SRAM2, SRAM3) of the semiconductor integrated circuit according to Embodiment 1 of the present invention illustrated in FIG. 5 or the semiconductor integrated circuit according to Embodiment 2 of the present invention illustrated in FIG. 11.

In a different more specific embodiment, the cell array (cell_array) of the each SRAM module comprises plural SRAM memory cells (MC) comprising one pair of drive N-channel MOS transistors (MNDL, MNDR), and one pair of load P-channel MOS transistors (MPUL, MPUR), and one pair of transfer N-channel MOS transistors (MNSL, MNSR) (refer to FIG. 12).

A semiconductor integrated circuit according to the most specific embodiment comprises plural data processing units (CPU1, CPU2, Video, Audio).

Each data processing unit of the plural data processing units comprises the logic circuit (logic) and the plural SRAM modules (SRAM2, SRAM3) (refer to FIG. 1).

(2) A typical embodiment of another viewpoint of the present invention is an operation method of a semiconductor integrated circuit comprising a logic circuit (logic) and plural SRAM modules (SRAM2, SRAM3) which can store data related to the logic circuit. The operation method concerned comprises the following steps (refer to FIG. 5 and FIG. 11).

That is a step of performing a power control for the logic circuit (logic) independently of the plural SRAM modules (SRAM2, SRAM3).

That is a step of performing an independent power control among the plural SRAM modules (SRAM2, SRAM3).

According to the embodiment, it is possible to respond to changes in the amount of retained data in a standby state.

2. Further Detailed Description of the Preferred Embodiments

Next, embodiments are explained further in full detail. In the entire drawings for explaining the preferred embodiments of the present invention, the same symbol is attached to a component which has the same function, and the repeated explanation thereof is omitted.

Embodiment 1

<<A Configuration of a Semiconductor Integrated Circuit According to Embodiment 1>>

FIG. 5 illustrates a configuration of a semiconductor integrated circuit according to Embodiment 1 of the present invention.

A semiconductor integrated circuit according to Embodiment 1 of the present invention illustrated in FIG. 5 is different from the semiconductor integrated circuit illustrated in FIG. 2, examined by the present inventors in advance of the present invention, in the following points.

That is, in the semiconductor integrated circuit according to Embodiment 1 of the present invention illustrated in FIG. 5, a power switch PWSW22 is coupled between a local power source vssm22 of an SRAM module (SRAM2) and a ground potential Vss, a control signal cnt22 is supplied to a control gate of the power switch PWSW22; a power switch PWSW23 is coupled between a local power source vssm23 of an SRAM module (SRAM3) and the ground potential Vss, and a control signal cnt23 is supplied to a control gate of the power switch PWSW23.

Inside the SRAM module (SRAM2) of the semiconductor integrated circuit according to Embodiment 1 of the present invention illustrated in FIG. 5, a peripheral circuit power switch PEWS22 is coupled between a peripheral circuit (peripheral) and the local power source vssm22, and a source line potential control circuit (arvss_control) is coupled between a cell array (cell_array) and the local power source vssm22. A control signal rsb22 of a control circuit (RSCNT) of the peripheral circuit (peripheral) is supplied to a control gate of the peripheral circuit power switch PEWS22, and to a control input terminal of the source line potential control circuit (arvss_control).

Inside the SRAM module (SRAM3) of the semiconductor integrated circuit according to Embodiment 1 of the present invention illustrated in FIG. 5, a peripheral circuit power switch PEWS23 is coupled between a peripheral circuit (peripheral) and the local power source vssm23, and a source line potential control circuit (arvss_control) is coupled between a cell array (cell_array) and the local power source vssm23. A control signal rsb23 of a control circuit (RSCNT) of a peripheral circuit (peripheral) is supplied to a control gate of the peripheral circuit power switch PEWS23, and to a control input terminal of a source line potential control circuit (arvss_control).

Figure 2:
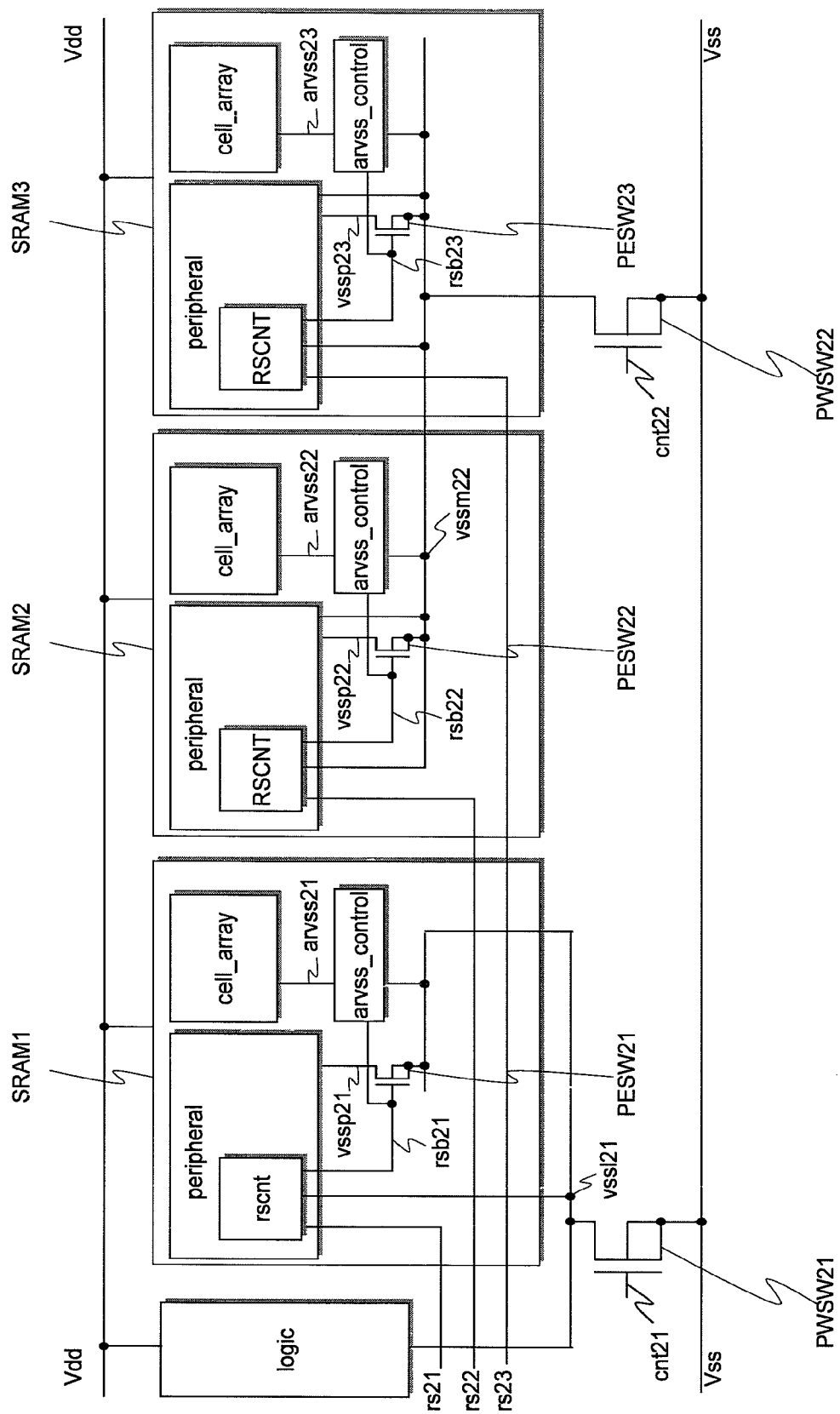
FIG. 2 is a drawing illustrating a configuration of a semiconductor integrated circuit examined by the present inventors in advance of the present invention.
Figure 4:
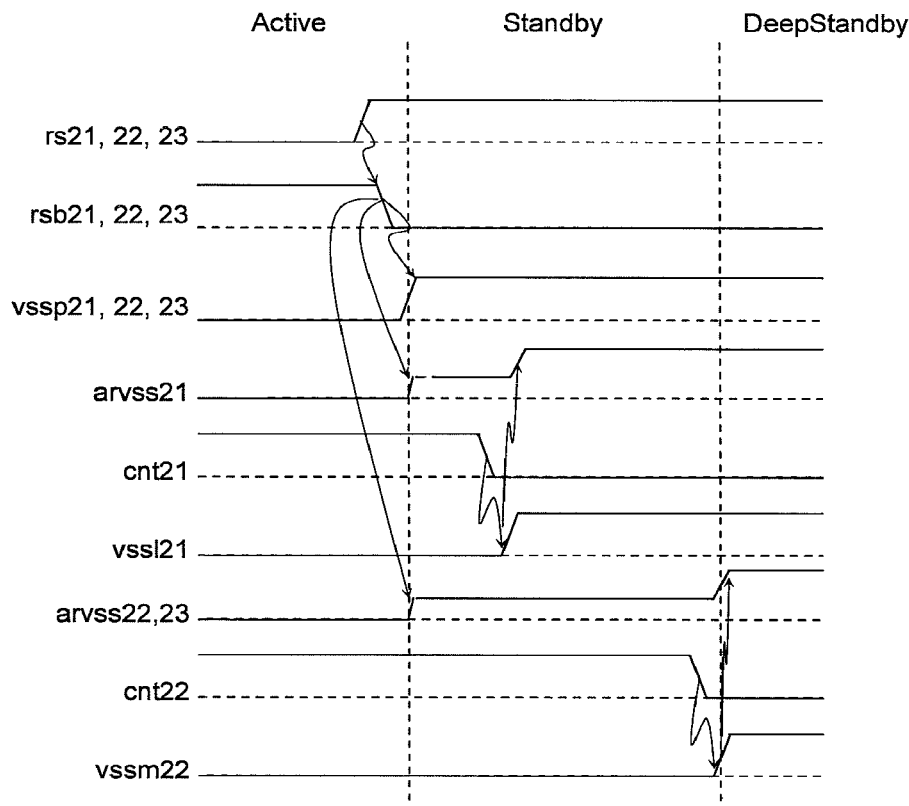
FIG. 4 is a drawing illustrating an operating waveform of each part of the source line potential control circuit (arvss_control) of the other static type RAMs (SRAM2, SRAM3) of the semiconductor integrated circuit, illustrated in FIG. 2, examined by the present inventors in advance of the present invention.

Inside the SRAM module (SRAM1) of the semiconductor integrated circuit according to Embodiment 1 of the present invention illustrated in FIG. 5, as is the case with the SRAM module (SRAM1) of the semiconductor integrated circuit illustrated in FIG. 2, a peripheral circuit power switch PEWS21 is coupled between a peripheral circuit (peripheral) and the local power source vssl21, and a source line potential control circuit (arvss_control) is coupled between a cell array (cell_array) and the local power source vssl21. A control signal rsb21 of a control circuit (RSCNT) of the peripheral circuit (peripheral) is supplied to a control gate of the peripheral circuit power switch PEWS21, and to a control input terminal of the source line potential control circuit (arvss_control).

The local power source vssl21 of the SRAM module (SRAM1) of the semiconductor integrated circuit according to Embodiment 1 of the present invention illustrated in FIG. 5 is coupled to a power switch PWSW21 and a logic circuit (logic), as is the case with the SRAM module (SRAM1) of the semiconductor integrated circuit illustrated in FIG. 2.

Figure 6:
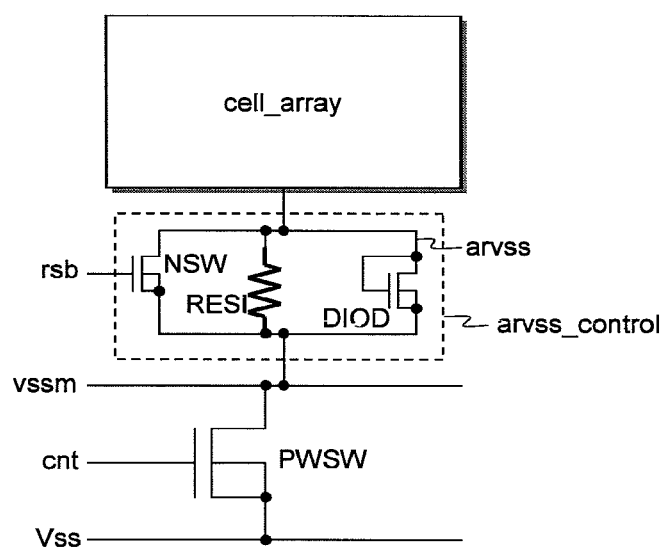
FIG. 6 is a drawing illustrating a configuration of a source line potential control circuit (arvss_control) of each of SRAM modules (SRAM1, SRAM2, SRAM3) of the semiconductor integrated circuit according to Embodiment 1 of the present invention illustrated in FIG. 5.

FIG. 6 illustrates a configuration of the source line potential control circuit (arvss_control) of the SRAM module (SRAM1, SRAM2, SRAM3) of the semiconductor integrated circuit according to Embodiment 1 of the present invention illustrated in FIG. 5.

In FIG. 6, the cell array (cell_array), the source line potential control circuit (arvss_control), and the power switch PWSW are illustrated. As illustrated in FIG. 6, the source line potential control circuit (arvss_control) comprises a power switch NSW, a resistor RESI, and a diode coupling MOS transistor DIOD, which are coupled in parallel between a cell array source line arvss and a local power source vssm.

<<Active State>>

When executing write operation or read operation to one SRAM module of three SRAM modules (SRAM1, SRAM2, SRAM3) in the semiconductor integrated circuit according to Embodiment 1 of the present invention illustrated in FIG. 5, one of three control signals rsb21, rsb22, and rsb23 is set at a high level, and at the same time, one of three control signals cnt21, cnt22, and cnt23 is set at a high level.

In an SRAM module which is brought to an active state, the power switch PWSW is set to an on state by the control signal cnt, and, in response to rising of the control signal rsb of the control circuit (RSCNT) of the peripheral circuit (peripheral), the peripheral circuit power switch PESW is set to an on state, and the peripheral circuit (peripheral) is activated. The power switch NSW of the source line potential control circuit (arvss_control) is also set to an on state. Accordingly, by the source line potential control circuit (arvss_control), the potential of the cell array source line arvss is set to the ground potential Vss; therefore, it becomes possible to execute the write operation or the read operation to the cell array (cell_array) of the SRAM module which is brought to an active state.

<<Deep Standby State>>

In the semiconductor integrated circuit according to Embodiment 1 of the present invention illustrated in FIG. 5, when the control signal cnt21 is set at a low level, the power switch PWSW21 is set to an off state. Therefore, the logic circuit (logic) and the SRAM module (SRAM1) are brought to a deep standby state. When data of the SRAM module (SRAM1) needs to be saved, the data of the SRAM module (SRAM1) is evacuated to other SRAM modules (SRAM2, SRAM3) before the SRAM module (SRAM1) is brought to the deep standby state. When the control signal cnt22 is set at a low level, the power switch PWSW22 is set to an off state; accordingly, the SRAM module (SRAM2) is brought to a deep standby state. When data of the SRAM module (SRAM2) needs to be saved, the data of the SRAM module (SRAM2) is evacuated to other SRAM modules (SRAM1, SRAM3) before the SRAM module (SRAM2) is brought to the deep standby state. Similarly, when the control signal cnt23 is set at a low level, the power switch PWSW23 is set to an off state; accordingly, the SRAM module (SRAM3) is brought to a deep standby state. When data of the SRAM module (SRAM3) needs to be saved, the data of the SRAM module (SRAM3) is evacuated to other SRAM modules (SRAM1, SRAM2) before the SRAM module (SRAM3) is brought to the deep standby state. In this way, according to the semiconductor integrated circuit according to Embodiment 1 of the present invention illustrated in FIG. 5, it is possible to change the amount of retained data in a deep standby state.

<<Standby State>>

In the semiconductor integrated circuit according to Embodiment 1 of the present invention illustrated in FIG. 5, when three control signals cnt21, cnt22, and cnt23 are set at a high level and one of three control signals rsb21, rsb22, and rsb23 is set at a low level, one of three SRAM modules (SRAM1, SRAM2, SRAM3) is brought to a standby state. In an SRAM module which is brought to a standby state, in response to falling of the control signal rsb of the control circuit (RSCNT) of the peripheral circuit (peripheral), the peripheral circuit power switch PESW is set to an off state, and a leakage current of the peripheral circuits (peripheral) other than the control circuit (RSCNT) is cut off. The power switch NSW of the source line potential control circuit (arvss_control) is also set to an off state. Therefore, due to a current path through the resistor RESI and the diode coupling MOS transistor DIOD of the source line potential control circuit (arvss_control), the potential of the cell array source line arvss is set at a potential of a little higher level than the ground potential Vss, and current of the cell array (cell_array) of the SRAM module in the standby state is reduced to such an extent that retained data of the cell array (cell_array) are not destroyed.

<<A Configuration of the SRAM Module>>

Figure 7:
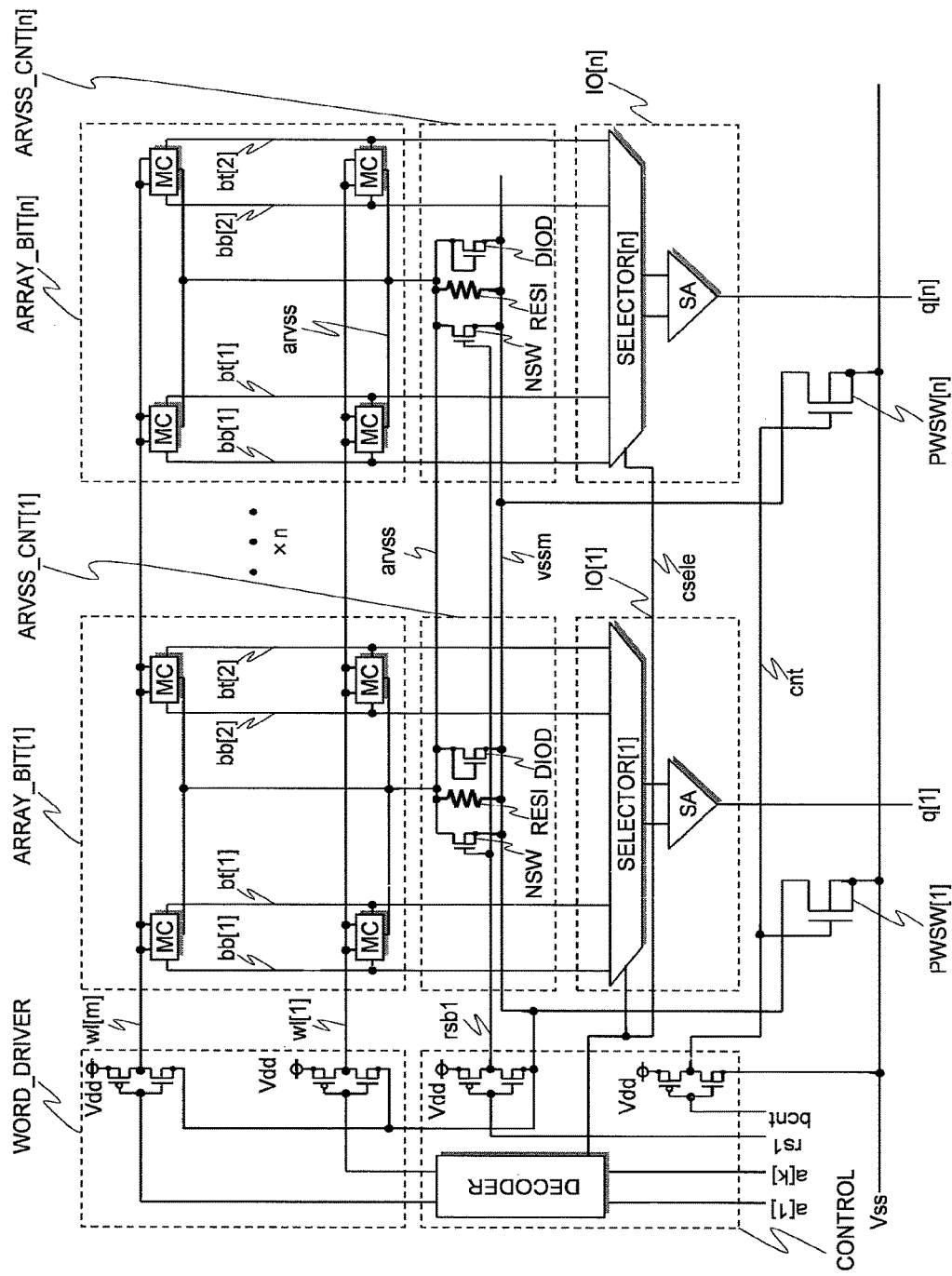
FIG. 7 is a drawing illustrating a configuration of three SRAM modules (SRAM1, SRAM2, SRAM3) of the semiconductor integrated circuit according to Embodiment 1 of the present invention illustrated in FIG. 5.

FIG. 7 illustrates a configuration of three SRAM modules (SRAM1, SRAM2, SRAM3) of the semiconductor integrated circuit according to Embodiment 1 of the present invention illustrated in FIG. 5.

The SRAM module illustrated in FIG. 7 comprises, in addition to cell arrays (ARRAY_BIT[1], - - - , ARRAY_BIT[n]) and source line potential control circuits (ARVSS_CNT[1], - - - , ARVSS_CNT[n]), a control unit (CONTROL) comprising a control circuit, a word driver (WORD_DRIVER) which drives a word line, I/O units (IO[1], - - - , IO[n]) which output and input data, and power switches (PWSW[1], - - - , PWSW[n]).

The cell arrays (ARRAY_BIT[1], - - - , ARRAY_BIT[n]) comprise plural memory cells (MC) coupled to plural word lines wl[1], - - - , wl[m], and plural complementary bit-line pairs bb[1], bt[1], bb[2], and bt[2]. The word driver (WORD_DRIVER) comprises plural CMOS inverters coupled to the plural word lines wl[1], - - -, wl[m]. The I/O units (IO[1], - - -, IO[n]) comprise plural selectors (SELECTOR) coupled to the plural complementary bit-line pairs bb[1], bt[1], bb[2], and bt[2], and plural sense amplifiers (SA). Each of the source line potential control circuits (ARVSS_CNT[1], - - -, ARVSS_CNT[n]) comprises a power switch NSW and a resistor RESI and a diode coupling MOS transistor DIOD which are coupled in parallel between a cell array source line arvss and a local power source vssm, as is the case with FIG. 6. The control unit (CONTROL) comprises a decoder (DECODER) which drives the plural CMOS inverters of the word driver (WORD_DRIVER) and the plural selectors (SELECTOR) of the I/O units (IO[1], - - -, IO[n]), in response to address signals a[1], - - -, a[k]. The control unit (CONTROL) comprises a CMOS inverter which generates a control signal rsb1 to be supplied to a control gate of the power switch NSW of the source line potential control circuits (ARVSS_CNT[1], - - -, ARVSS_CNT[n]), and a CMOS inverter which generates a control signal cnt to be supplied to a control gate of the power switches (PWSW[1], - - -, PWSW[n]).

In a semiconductor integrated circuit like a system on a chip (SoC), in order to satisfy a user's various demands, a compiled RAM (CRAM) in which various combination of element components of SRAM is possible is employed. In the compiled RAM (CRAM) illustrated in FIG. 7, the source line potential control circuits (ARVSS_CNT[1], - - -, ARVSS_CNT[n]) and the power switches (PWSW[1], - - -, PWSW[n]) are arranged in units of bit([1], - - -, [n]). Accordingly, in the compiled RAM (CRAM) illustrated in FIG. 7, it becomes possible to respond easily a user's demand, by changing the number of columns of the memory cell (MC) and the number of the I/O units (IO[1], - - -, IO[n]), depending on the number of bits which satisfies the user's demand. Namely, in the compiled RAM (CRAM) of FIG. 7, the source line potential control circuits (ARVSS_CNT[1], - - -, ARVSS_CNT[n]) and the power switches (PWSW[1], - - -, PWSW[n]) are arranged in units of bit ([1], - - -, [n]); therefore, even when the number of bit of the compiled RAM (CRAM) changes, the number of the source line potential control circuits and the number of the power switches are increased or decreased, by responding automatically to the change in the number of total memory cells. Therefore, it is possible to keep appropriately the potential of the cell array source line arvss.

The compiled RAM (CRAM) illustrated in FIG. 7 adopts a two-column multiplex system in which one I/O line (q[1], - - -, q[n]) is shared by two memory cell columns. Naturally, the number of column multiplexes can be set as an arbitrary number.

Figure 8:
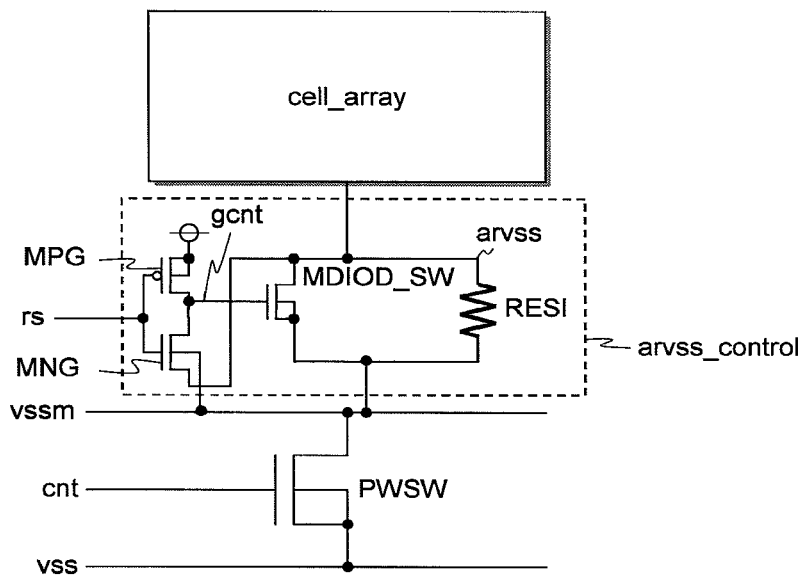
FIG. 8 is a drawing illustrating a configuration of a source line potential control circuit (arvss_control) of the SRAM module of the semiconductor integrated circuit according to Embodiment 1 of the present invention illustrated in FIG. 7.

FIG. 8 illustrates a configuration of the source line potential control circuit (arvss_control) of the SRAM module of the semiconductor integrated circuit according to Embodiment 1 of the present invention illustrated in FIG. 7.

The source line potential control circuit (arvss_control) illustrated in FIG. 8 comprises a resistor RESI, an NMOS switching transistor MDIOD_SW, a control PMOS transistor MPG, and a control NMOS transistor MNG. The resistor RESI and the NMOS switching transistor MDIOD_SW are coupled between the cell array source line arvss and the local power source vssm. A drain-to-source path of the NMOS switching transistor MDIOD_SW is coupled between the cell array source line arvss and the local power source vssm. A source, a gate, and a drain of the control PMOS transistor MPG are coupled to a power supply voltage gcnt, a standby signal terminal rs, and a gate of the NMOS switching transistor MDIOD_SW, respectively. A drain, a source, and a gate of the control NMOS transistor MNG are coupled to the cell array source line arvss, a gate of the NMOS switching transistor MDIOD_SW, and the standby signal terminal rs, respectively. At the time of operation of the circuit, responding to a low-level signal of the standby signal terminal rs, the control PMOS transistor MPG, the control NMOS transistor MNG, and the NMOS switching transistor MDIOD_SW are set to an on state, an off state, and an on state, respectively, and the cell array source line arvss is coupled to the local power source vssm through low impedance; accordingly, the cell array (cell_array) performs the normal operation. At the time of standby, responding to a high-level signal of the standby signal terminal rs, the control PMOS transistor MPG and the control NMOS transistor MNG are set to an off state and an on state, respectively. The NMOS switching transistor MDIOD_SW operates like an MOS diode with a leakage current of the cell array (cell_array) serving as a bias current. Accordingly, the potential of the cell array source line arvss is held to a constant potential higher than the local power source vssm, thereby reducing the leakage current at the time of standby.

Figure 9:
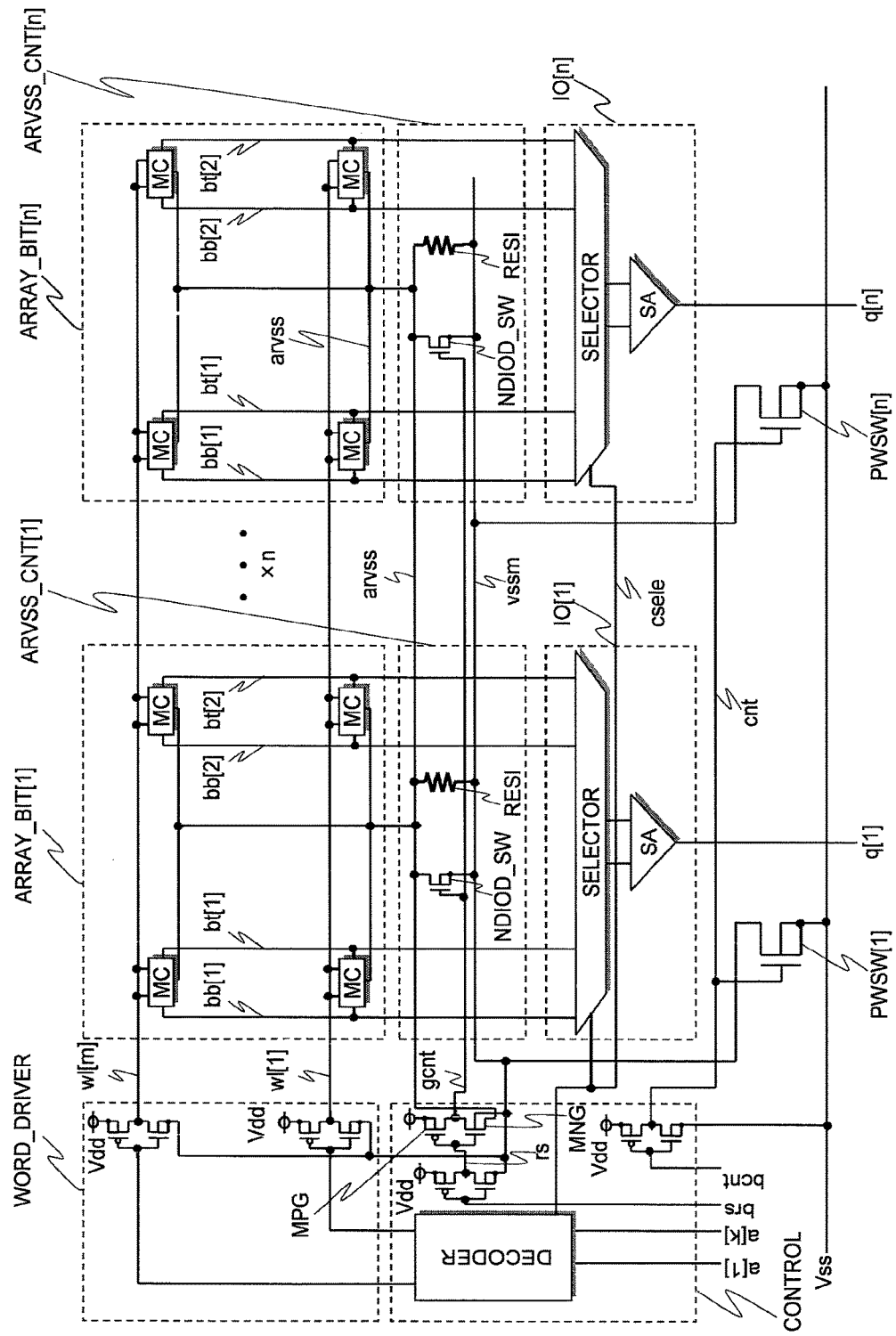
FIG. 9 is a drawing illustrating another configuration of three SRAM modules (SRAM1, SRAM2, SRAM3) of the semiconductor integrated circuit according to Embodiment 1 of the present invention illustrated in FIG. 5.

FIG. 9 is a drawing illustrating another configuration of the SRAM modules (SRAM1, SRAM2, SRAM3) of the semiconductor integrated circuit according to Embodiment 1 of the present invention illustrated in FIG. 5.

An SRAM module illustrated in FIG. 9 is different from the SRAM module illustrated in FIG. 7 in the point that the source line potential control circuit (arvss_control) of the SRAM module illustrated in FIG. 9 adopts the circuit configuration of FIG. 8 instead of the circuit configuration of FIG. 6. In the SRAM module illustrated in FIG. 9, one control PMOS transistor MPG and one control NMOS transistor MNG which drive plural NMOS switching transistors MDIOD_SW in plural source line potential control circuits (arvss_control) are arranged at one place inside the control unit (CONTROL).

As described above, according to the semiconductor integrated circuit according to Embodiment 1 of the present invention explained with reference to FIG. 5 through FIG. 9, when the first power switch PWSW21 coupled to the first SRAM module (SRAM1) is controlled to an off state by the first control signal cnt21 at a low level, the first local power line vssl21 is set at a high level; accordingly, the logic circuit (logic) and the first SRAM module (SRAM1) are brought to a deep standby state. In the present state, when the second power switch PWSW22 coupled to the second SRAM module (SRAM2) is controlled to an on state by the second control signal cnt22 at a high level, the second local power line vssm22 is set at a low level; accordingly, the second SRAM module (SRAM2) is brought to an active state or a standby state by the control signal rsb22. Also in the present state, when the third power switch PWSW23 coupled to the third SRAM module (SRAM3) is controlled to an on state by the third control signal cnt23 at a high level, the third local power line vssm23 is set at a low level; accordingly, the third SRAM module (SRAM3) is brought to an active state or a standby state by the control signal rsb23. Therefore, according to the semiconductor integrated circuit according to Embodiment 1 of the present invention explained with reference to FIG. 5 through FIG. 9, it becomes possible to respond to changes in the amount of retained data of SRAM in a deep standby state.

In the semiconductor integrated circuit according to Embodiment 1 of the present invention explained in FIG. 5 through FIG. 9, it is possible to replace N-channel MOS transistors serving as the power switches PWSW21, PWSW22, and PWSW23 with P-channel MOS transistors and to change the coupling point of the power switches PWSW21, PWSW22, and PWSW23 from the side of the ground potential Vss to the side of the power supply voltage Vdd. In the case, the local power lines vssl21, vssm22, and vssm23 are also changed from the side of the ground potential Vss to the local power lines vddl21, vddm22, and vddm23 on the side of the power supply voltage Vdd. Furthermore, N-channel MOS transistors serving as the peripheral circuit power switches PESW21, PESW22, and PESW23 are also replaced with P-channel MOS transistors, and the coupling point of the peripheral circuit power switches PESW21, PESW22, and PESW23 is also changed to between the local power lines vddl21, vddm22, and vddm23 on the side of the power supply voltage Vdd and the peripheral circuit (peripheral). The coupling point of the source line potential control circuit (arvss_control) is also changed to between the local power lines vddl21, vddm22, and vddm23 on the side of the power supply voltage Vdd and the cell array (cell_array).

However, in the semiconductor integrated circuit according to Embodiment 1 of the present invention explained in FIG. 5 through FIG. 9, it is necessary that the first power switch PWSW21 is exclusively employed for the first SRAM module (SRAM1), the second power switch PWSW22 is exclusively employed for the second SRAM module (SRAM2), and the third power switch PWSW23 is exclusively employed for the third SRAM module (SRAM3), and that the first local power line vssl21, the second local power line vssm22, and the third local power line vssm23 are electrically separated from each other. Since each power switch of three power switches PWSW21, PWSW22, and PWSW23 is exclusively employed to each SRAM module of three SRAM modules (SRAM1, SRAM2, SRAM3), an element size of each power switch needs to be set up corresponding to the operating current of each SRAM module. Since the first local power line vssl21, the second local power line vssm22, and the third local power line vssm23 need to be electrically separated from each other, each of P well regions which are used for formation of plural N-channel MOS transistors of each SRAM module of three SRAM modules (SRAM1, SRAM2, SRAM3) needs to be electrically separated from each other.

<<A Chip Layout of Embodiment 1>>

Figure 10:
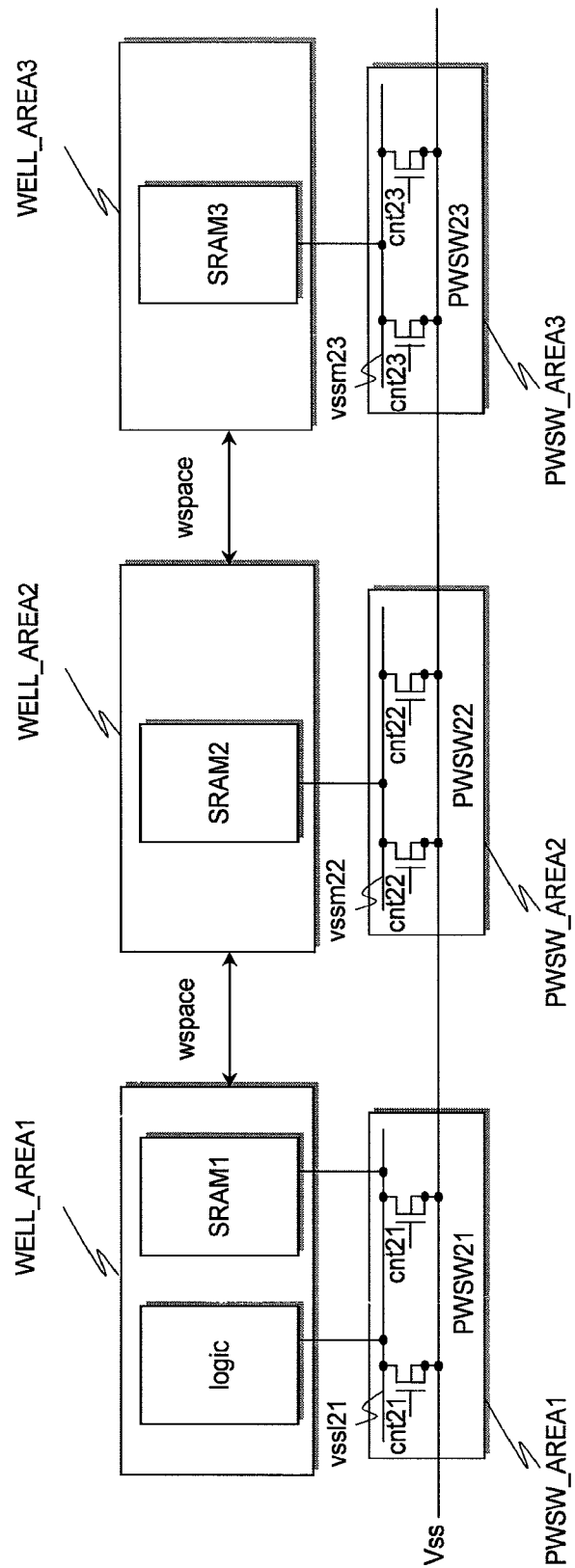
FIG. 10 is a drawing illustrating a configuration of a chip layout of three SRAM modules (SRAM1, SRAM2, SRAM3) of the semiconductor integrated circuit according to Embodiment 1 of the present invention illustrated in FIG. 5.

FIG. 10 illustrates a configuration of a chip layout of three SRAM modules (SRAM1, SRAM2, SRAM3) of the semiconductor integrated circuit according to Embodiment 1 of the present invention illustrated in FIG. 5.

As illustrated in FIG. 10, the first local power line vssl21 for the logic circuit (logic) and the first SRAM module (SRAM1), the second local power line vssm22 for the second SRAM module (SRAM2), and the third local power line vssm23 for the third SRAM module (SRAM3) are electrically separated from each other. The first power switch PWSW21 employed exclusively for the first SRAN module (SRAM1) and the logic circuit (logic) is coupled between the first local power line vssl21 and the ground potential Vss. The second power switch PWSW22 employed exclusively for the second SRAM module (SRAM2) is coupled between the second local power line vssm22 and the ground potential Vss. The third power switch PWSW23 employed exclusively for the third SRAM module (SRAM3) is coupled between the third local power line vssm23 and the ground potential Vss.

Plural N-channel MOS transistors for the first power switch PWSW21 are formed in a first power switch area PWSW_AREA1, plural N-channel MOS transistors for the second power switch PWSW22 are formed in a second power switch area PWSW_AREA2, and plural N-channel MOS transistors for the third power switch PWSW23 are formed in a third power switch area PWSW_AREA3.

The logic circuit (logic) and the plural N-channel MOS transistors of the first SRAM module (SRAM1) coupled to the first local power line vssl21 are formed in a first P-well region WELL_AREA1, the plural N-channel MOS transistors of the second SRAM module (SRAM2) coupled to the second local power line vssm22 are formed in a second P-well region WELL_AREA2, and the plural N-channel MOS transistors of the third SRAM module (SRAM3) coupled to the third local power line vssm23 are formed in a third P-well region WELL_AREA3. As illustrated in FIG. 10, on the main surface of a semiconductor chip of the semiconductor integrated circuit, it is necessary to electrically separate the first P-well region WELL_AREA1 and the second P-well region WELL_AREA2 by an N type area which has the minimum separation space wspace. It is necessary to electrically separate the second P-well region WELL_AREA2 and the third P-well region WELL_AREA3 by an N type area which has the minimum separation space wspace. Therefore, the semiconductor integrated circuit according to Embodiment 1 of the present invention illustrated in FIG. 10 has a drawback that the semiconductor chip area becomes comparatively large.

The above is about a case of a semiconductor integrated circuit of triple well structure. In the case of a semiconductor integrated circuit of double well structure, an N-well region of a power gating area where cutting-off by a power switch is different from the side of the power supply voltage Vdd needs to be separated by a P-well region. Therefore, also in the semiconductor integrated circuit of double well structure, there is a drawback that the semiconductor chip area becomes comparatively large, as is the case with the triple well structure.

A semiconductor integrated circuit according to Embodiment 2 of the present invention explained below will remove the present drawback.

Embodiment 2

<<A Configuration of a Semiconductor Integrated Circuit According to Embodiment 2>>

FIG. 11 illustrates a configuration of a semiconductor integrated circuit according to Embodiment 2 of the present invention.

A semiconductor integrated circuit according to Embodiment 2 of the present invention illustrated in FIG. 11 is different from the semiconductor integrated circuit according to Embodiment 1 of the present invention illustrated in FIG. 5 in the following points.

That is, in the semiconductor integrated circuit according to Embodiment 2 of the present invention illustrated in FIG. 11, a local power line of the second SRAM module (SRAM2) and a local power line of the third SRAM module (SRAM3) share the second local power line vssm22. Furthermore, the second power switch PWSW22 and the third power switch PWSW23 which are coupled between the shared second local power line vssm22 and the ground potential Vss are shared by the second SRAM module (SRAM2) and the third SRAM module (SRAM3).

Also in the semiconductor integrated circuit according to Embodiment 2 of the present invention illustrated in FIG. 11, a local power line of the logic circuit (logic) and a local power line of the first SRAM module (SRAM1) share a first local power line vssl21. Furthermore, the first power switch PWSW21 coupled between the shared first local power line vssl21 and the ground potential Vss is shared by the logic circuit (logic) and the first SRAM module (SRAM1).

In the first SRAM module (SRAM1), a peripheral circuit power switch PESW21 is coupled between a peripheral circuit (peripheral) and the first local power line vssl21, and a source line potential control circuit, which comprises an active power switch SW21, a resistor RN21, a diode coupling MOS transistor MN21, and a switch MSW21, is coupled between a cell array source line arvss21 of a cell array (cell_array) and the first local power line vssl21. A parallel coupling body of the resistor RN21 and the diode coupling MOS transistor MN21 are coupled to the switch MSW21 in series, and the switch MSW21 and the first power switch PWSW21 are coupled in series.

Also in the second SRAM module (SRAM2), a peripheral circuit power switch PESW22 is coupled between a peripheral circuit (peripheral) and the second local power line vssm22, and a source line potential control circuit, which comprises an active power switch SW22, a resistor RN22, a diode coupling MOS transistor MN22, and a switch MSW22, is coupled between a cell array source line arvss22 of a cell array (cell_array) and the second local power line vssm22. A parallel coupling body of the resistor RN22 and the diode coupling MOS transistor MN22 are coupled to the switch MSW22 in series, and the switch MSW22 and the second power switch PWSW22 are coupled in series.

Also in the third SRAM module (SRAM3), a peripheral circuit power switch PESW23 is coupled between a peripheral circuit (peripheral) and the second local power line vssm22, and a source line potential control circuit, which comprises an active power switch SW23, a resistor RN23, a diode coupling MOS transistor MN23, and a switch MSW23, is coupled between a cell array source line arvss23 of a cell array (cell_array) and the second local power line vssm22. A parallel coupling body of the resistor RN23 and the diode coupling MOS transistor MN23 are coupled to the switch MSW23 in series, and the switch MSW23 and the third power switch PWSW23 are coupled in series.

Since it suffices that the switches MSW21, MSW22, and MSW23 of the source line potential control circuit flow a small leakage current at the time of standby, it is possible to make the size of the switches small, to suppress an overhead of the semiconductor chip occupied area.

<<Active State of the Logic and the First SRAM>>

When a control signal cnt21 is set at a high level in order to bring the logic circuit (logic) and the first SRAM module (SRAM1) into an active state, the first power switch PWSW21 is set to an on state, and the potential of the first local power line vssl21 to which a logic circuit (logic) and the first SRAM module (SRAM1) are coupled is set at the ground potential Vss. Furthermore, a control signal rsb21 is set at a high level, and the peripheral circuit power switch PESW21 and the active power switch SW21 are set to an on state; accordingly, a peripheral circuit (peripheral) and a cell array (cell_array) of the first SRAM module (SRAM1) are brought to an active state. Therefore, in the present active state, it is possible for the logic circuit (logic) to perform logic operation, and it is also possible to execute write operation or read operation of the first SRAM module (SRAM1).

<<Standby State of the Logic and the First SRAM>>

When the control signal cnt21 is set at a high level in order to bring the logic circuit (logic) and the first SRAM module (SRAM1) into a standby state, the first power switch PWSW21 is set to an on state, and the potential of the first local power line vssl21 to which the logic circuit (logic) and the first SRAM module (SRAM1) are coupled is set at the ground potential Vss. The control signal rsb21 is set at a low level and the peripheral circuit power switch PESW21 and the active power switch SW21 are set to an off state. Furthermore, a control signal rs21 is set at a high level and the switch MSW21 of the source line potential control circuit is set to an on state. Therefore, the potential of the cell array source line arvss21 of the cell array (cell_array) of the first SRAM module (SRAM1) is set at a level a little higher than the ground potential Vss. Accordingly, it becomes possible to reduce current of the cell array (cell_array) to such an extent that the retained data of the cell array (cell_array) are not destroyed.

<<Array Cut-Off State of the Logic and the First SRAM>>

When the control signal cnt21 is set at a low level in order to bring the logic circuit (logic) and the first SRAM module (SRAM1) into an array cut-off state, the first power switch PWSW21 is set to an off state, and the potential of the first local power line vssl21 to which the logic circuit (logic) and the first SRAM module (SRAM1) are coupled is set at a level approximately near the power supply voltage Vdd, and the control signal rsb21 is set at a low level and the peripheral circuit power switch PESW21 and the active power switch SW21 are set to an off state. Furthermore, the control signal rs21 is set at a low level, and the switch MSW21 of the source line potential control circuit is set to an off state.

<<Active State of the Second and the Third SRAM>>

When control signals cnt22 and cnt23 are set at a high level in order to bring the second and the third SRAM module (SRAM2, SRAM3) into an active state, the second, the third power switch PWSW22 and PWSW23 are set to an on state. Therefore, the potential of the second local power line vssm22 to which the second and the third SRAM module (SRAM2, SRAM3) are coupled is set at the ground potential Vss. Furthermore, At least one of the control signals rsb22 and rsb23 is set at a high level, and at least one of the peripheral circuit power switches PESW22 and PESW23 and at least one of the active power switches SW22 and SW23 are set to an on state. Accordingly, the peripheral circuit (peripheral) and the cell array (cell_array) of at least one of the second and the third SRAM module (SRAM2, SRAM3) are set to an active state. Therefore, it becomes possible to execute write operation or read operation to the SRAM module in the active state.

<<Standby State of One of the Second and the Third SRAM>>

When the control signals cnt22 and cnt23 are set at a high level in order to bring one of the second and the third SRAM module (SRAM2, SRAM3) into a standby state, the second and the third power switch PWSW22 and PWSW23 are set to an on state. Accordingly, the potential of the second local power line vssm22 to which the second and the third SRAM module (SRAM2, SRAM3) are coupled is set at the ground potential Vss. Furthermore, one of the control signals rsb22 and rsb23 is set at a low level, and one of the peripheral circuit power switches PESW22 and PESW23 and one of the active power switches SW22 and SW23 are set to an off state. Furthermore, one of the control signals rs22 and rs23 is set at a high level, and one of the switches MSW22 and MSW23 of the source line potential control circuit is set to an on state. Therefore, the potential of one of the cell array source lines arvss22 and arvss23 of the cell array (cell_array) of one of the second and the third SRAM module (SRAM2, SRAM3) is set at a level a little higher than the ground potential Vss; accordingly, It becomes possible to reduce current of the cell array (cell_array) to such an extent that the retained data of the cell array (cell_array) are not destroyed. In the standby state of one of the second and the third SRAM module, to an SRAM module in an active state, the control signals rs22 and rs23 may be set at either a high level or a low level without problems.

<<Array Cut-Off State of One of the Second and the Third SRAM>>

One of the control signals cnt22 and cnt23 is set at a low level in order to cut off one array of the second and the third SRAM module (SRAM2, SRAM3). Furthermore, one of or both of the control signals rsb22 and rsb23 are set at a low level, and one of or both of the peripheral circuit power switches PESW22 and PESW23 and one of or both of the active power switches SW22 and SW23 are set to an off state. Furthermore, only one of the control signals rs22 and rs23 is set at a low level, and only one of the switches MSW22 and MSW23 of the source line potential control circuit is set to an off state. An SRAM module for which array cut-off is not performed may be set either in a standby state or in an active state, without problems.

<<Array Cut-Off State of Both the Second and the Third SRAM>>

When both control signals rsb22 and rsb23 are set at a low level, in order to bring both the second and the third SRAM module (SRAM2, SRAM3) into an array cut-off state, both peripheral circuit power switches PESW22 and PESW23 and both active power switches SW22 and SW23 are set to an off state. Furthermore, both control signals rs22 and rs23 are set at a low level, and both deep standby switches MSW22 and MSW23 of the source line potential control circuit are set to an off state.

<<A Deep Standby State of the Second and the Third SRAM>>

When both control signals cnt22 and cnt23 are set at a low level, both the second and the third power switch PWSW22 and PWSW23 are set to an off state. Accordingly, the potential of the second local power line vssm22 to which the second and the third SRAM module (SRAM2, SRAM3) are coupled is set at a level near the power supply voltage Vdd, due to a leakage current of the second and the third SRAM module.

<<A Chip Layout of Embodiment 2>>

As described above, when practicing the chip layout of three SRAM modules (SRAM1, SRAM2, and SRAM3) of the semiconductor integrated circuit according to Embodiment 2 of the present invention illustrated in FIG. 11, it becomes possible to omit an N type area which has the minimum separation space wspace between the second P-well region WELL_AREA2 and the third P-well region WELL_AREA3 as illustrated in the layout pattern of FIG. 10. The reason is as follows. In the semiconductor integrated circuit according to Embodiment 2 of the present invention illustrated in FIG. 11, the local power line of the second SRAM module (SRAM2) and the local power line of the third SRAM module (SRAM3) share the second local power line vssm22, therefore it is not necessary to electrically separate the second P-well region WELL_AREA2 and the third P-well region WELL_AREA3. As a result, according to the semiconductor integrated circuit according to Embodiment 2 of the present invention illustrated in FIG. 11, it becomes possible to remove the drawback that the semiconductor chip area becomes comparatively large in the semiconductor integrated circuit according to Embodiment 1 of the present invention illustrated in FIG. 10.

Furthermore, according to the semiconductor integrated circuit according to Embodiment 2 of the present invention illustrated in FIG. 11, the second power switch PWSW22 and the third power switch PWSW23, which are coupled between the shared second local power line vssm22 and the ground potential Vss, are shared by the second SRAM module (SRAM2) and the third SRAM module (SRAM3). Therefore, each element size of the second power switch PWSW22 and the third power switch PWSW23 does not need to be set up corresponding to each operating current of the second SRAM module (SRAM2) and the third SRAM module (SRAM3). As a result, it is possible to reduce each element size of the second power switch PWSW22 and the third power switch PWSW23 in the semiconductor integrated circuit according to Embodiment 2 of the present invention illustrated in FIG. 11, compared with the semiconductor integrated circuit according to Embodiment 1 of the present invention illustrated in FIG. 5.

Furthermore, in the semiconductor integrated circuit according to Embodiment 2 of the present invention illustrated in FIG. 11, the on resistance of the switches MSW21, MSW22, and MSW23 can be made comparatively large in value, therefore, it is not necessary to enlarge specially the element size of these switches MSW21, MSW22, and MSW23. Therefore, increase of the semiconductor chip area of the semiconductor integrated circuit according to Embodiment 2 of the present invention illustrated in FIG. 11 due to the addition of the switches MSW21, MSW22, and MSW23 is negligible small. In the case of the semiconductor integrated circuit of double well structure explained in the last portion of Embodiment 1, an effect of reduction of the semiconductor chip area is the same.

<<Memory Cell>>

FIG. 12 illustrates a configuration of plural memory cells (MC) included in each SRAM module of three SRAM modules (SRAM1, SRAM2, SRAM3) of the semiconductor integrated circuit according to Embodiment 1 of the present invention illustrated in FIG. 5 or the semiconductor integrated circuit according to Embodiment 2 of the present invention illustrated in FIG. 11.

As illustrated in FIG. 12, each of plural memory cells (MC) comprises one pair of drive N-channel MOS transistors (MNDL, MNDR), one pair of load P-channel MOS transistors (MPUL, MPUR), and one pair of transfer N-channel MOS transistors (MNSL, MNSR). A gate and a P-well of one pair of transfer N-channel MOS transistors (MNSL, MNSR) are coupled to a word line wl and a local power source vssm, respectively. A source and a P-well of one pair of drive N-channel MOS transistors (MNDL, MNDR) are coupled to a cell array source line arvss and the local power source vssm, respectively. A source and an N-well of one pair of load P-channel MOS transistors (MPUL, MPUR) are coupled to the power supply voltage Vdd.

A drain of the left-hand side drive N-channel MOS transistor (MNDL), a drain of the left-hand side load P-channel MOS transistor (MPUL), a gate of the right-hand side drive N-channel MOS transistor (MNDR), and a gate of the right-hand side load P-channel MOS transistor (MPUR) form one memory node of the memory cell (MC). The one memory node of the memory cell (MC) is coupled to a noninverting bit line bt via a source-to-drain path of the left-hand side transfer N-channel MOS transistor (MNSL).

A drain of the right-hand side drive N-channel MOS transistor (MNDR), a drain of the right-hand side load P-channel MOS transistor (MPUR), a gate of the left-hand side drive N-channel MOS transistor (MNDL), and a gate of the left-hand side load P-channel MOS transistor (MPUL) form the other memory node of the memory cell (MC). The other memory node of the memory cell (MC) is coupled to a noninverting bit line bb via a source-to-drain path of the right-hand side transfer N-channel MOS transistor (MNSR).

Figure 13:
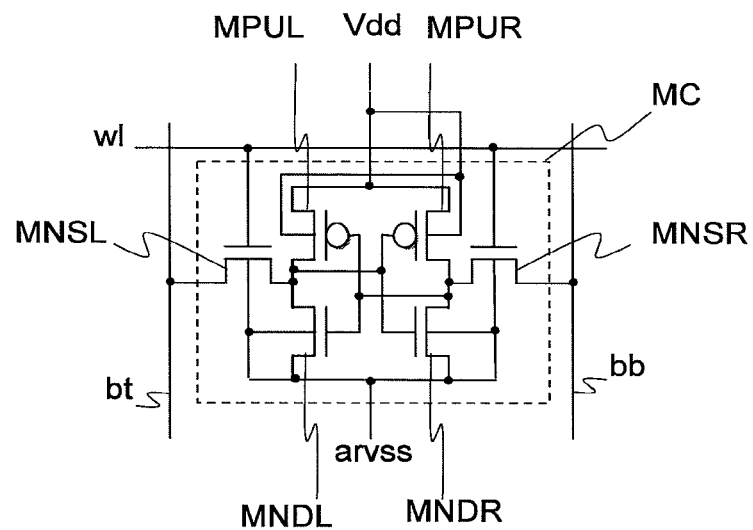
FIG. 13 is a drawing illustrating another configuration of the plural memory cells (MC) included in each SRAM module of three SRAM modules (SRAM1, SRAM2, SRAM3) of the semiconductor integrated circuit according to Embodiment 1 of the present invention illustrated in FIG. 5 or the semiconductor integrated circuit according to Embodiment 2 of the present invention illustrated in FIG. 11.

FIG. 13 illustrates another configuration of the plural memory cells (MC) included in each SRAM module of three SRAM modules (SRAM1, SRAM2, SRAM3) of the semiconductor integrated circuit according to Embodiment 1 of the present invention illustrated in FIG. 5 or the semiconductor integrated circuit according to Embodiment 2 of the present invention illustrated in FIG. 11.

The memory cell (MC) illustrated in FIG. 13 is different from the memory cell (MC) illustrated in FIG. 12 in the point that, in the memory cell (MC) illustrated in FIG. 13, a P-well of one pair of drive N-channel MOS transistors (MNDL, MNDR) and a P-well of one pair of transfer N-channel MOS transistors (MNSL, MNSR) are not coupled to the local power source vssm like the memory cell (MC) of FIG. 12, but coupled to the cell array source line arvss. That is, depending on magnitude of a leakage component of the memory cell (MC), the memory cell (MC) illustrated in FIG. 13 exhibits greater reduction effect of the leakage current than the memory cell (MC) illustrated in FIG. 12. Specifically, when a substrate leakage is more dominant than a subthreshold leakage, the memory cell (MC) of FIG. 13 exhibits greater reduction effect of the leakage current.

Embodiment 3

<<A Configuration of a Semiconductor Integrated Circuit According to Embodiment 3>>

Figure 14:
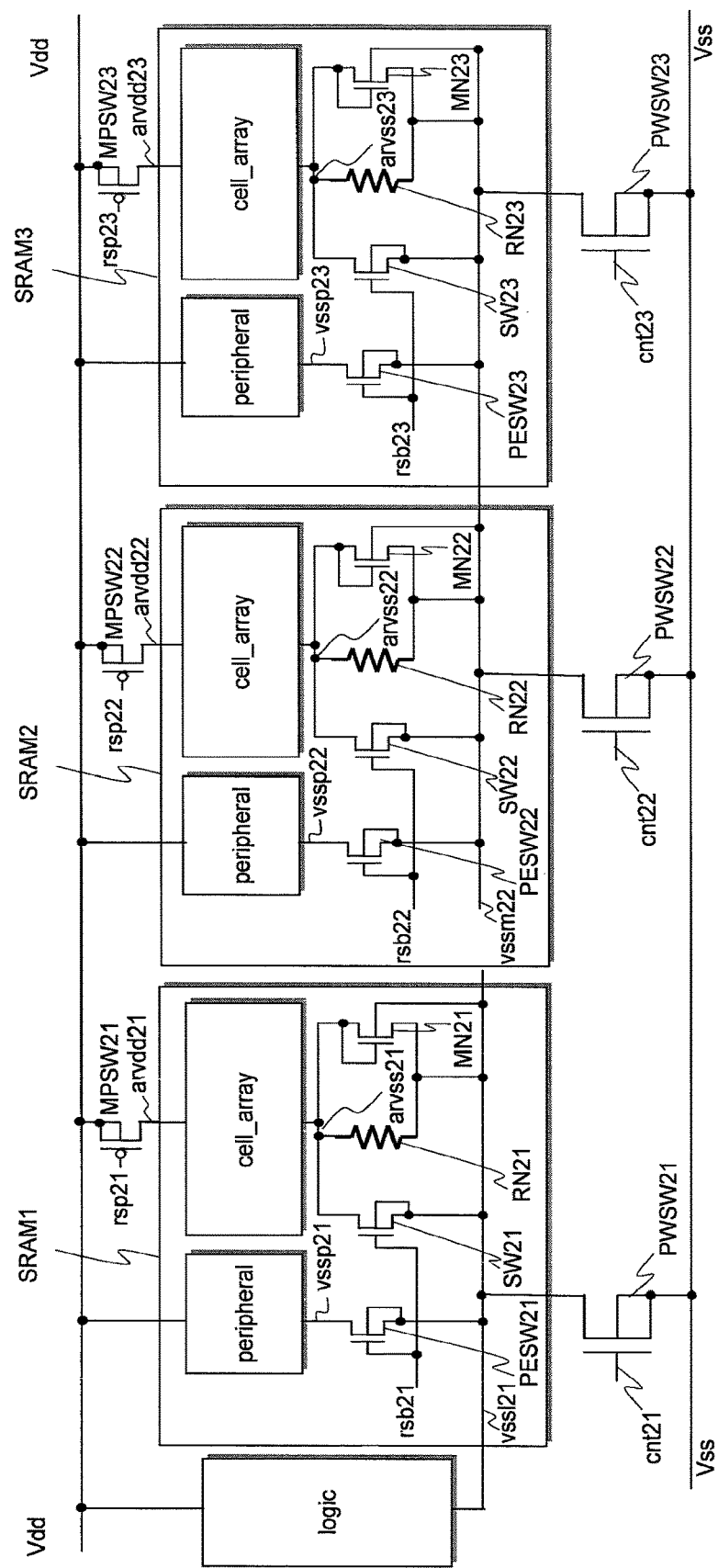
FIG. 14 is a drawing illustrating a configuration of a semiconductor integrated circuit according to Embodiment 3 of the present invention.

FIG. 14 illustrates a configuration of a semiconductor integrated circuit according to Embodiment 3 of the present invention.

A semiconductor integrated circuit according to Embodiment 3 of the present invention illustrated in FIG. 14 is different from the semiconductor integrated circuit according to Embodiment 2 of the present invention illustrated in FIG. 11 in the following points.

The first difference is that the switches MSW21, MSW22, and MSW23, each comprising the N-channel MOS transistor of the source line potential control circuit of three SRAM modules (SRAM1, SRAM2, SRAM3) of the semiconductor integrated circuit according to Embodiment 2 of the present invention illustrated in FIG. 11, are replaced by switches MPSW21, MPSW22, and MPSW23, each comprising a P-channel MOS transistor of a source line potential control circuit of the semiconductor integrated circuit according to Embodiment 3 of the present invention illustrated in FIG. 14.

The next difference is that the coupling point of each of the switches MPSW21, MPSW22, and MPSW23 of the source line potential control circuit of three SRAM modules (SRAM1, SRAM2, SRAM3) of the semiconductor integrated circuit according to Embodiment 3 of the present invention illustrated in FIG. 14 is changed from between the cell array (cell_array) and the local power lines vssl21 and vssm22, to between the cell array (cell_array) and the power supply voltage Vdd.

An operating current of a memory cell (MC) in read operation is dominated by a current which flows from a bit line to the cell array source line arvss on the side of the ground potential Vss, an operating current of a memory cell (MC) in write operation is dominated by a current which flows in driving a bit line, and a current which flows into the cell array source line arvdd on the side of the power supply voltage Vdd is very small. Consequently, it suffices that the switches MPSW21, MPSW22, and MPSW23 of the source line potential control circuit allow a small leakage current to pass at the time of standby; therefore, it is possible to make the size of the switches small, and to suppress an overhead of the semiconductor chip occupied area.

<<An Active State of the Logic and the First SRAM>>

When the control signal cnt21 is set at a high level in order to bring the logic circuit (logic) and the first SRAM module (SRAM1) into an active state, the first power switch PWSW21 is set to an on state, and the potential of the first local power line vssl21 to which the logic circuit (logic) and the first SRAM module (SRAM1) are coupled is set at the ground potential Vss. Furthermore, the control signal rsb21 is set at a high level, the control signal rsp21 is set at a low level, and the peripheral circuit power switch PESW21, the active power switch SW21, and the switch MPSW21 are set to an on state. Accordingly, the peripheral circuit (peripheral) and the cell array (cell_array) of the first SRAM module (SRAM1) are brought to an active state. Therefore, in the present active state, it is possible for the logic circuit (logic) to perform logic operation, and it is also possible to execute write operation or read operation of the first SRAM module (SRAM1).

When executing write operation of the first SRAM module (SRAM1), it is possible to perform a write assist which weakens retaining function of old data of the cell array (cell_array) of the first SRAM module (SRAM1), by changing the control signal rsp21 toward the high-level direction and reducing the degree of conduction of the switch MPSW21.

<<A Standby State of the Logic and the First SRAM>>

When the control signal cnt21 is set at a high level in order to bring the logic circuit (logic) and the first SRAM module (SRAM1) into a standby state, the first power switch PWSW21 is set to an on state. Therefore, the potential of the first local power line vssl21 to which the logic circuit (logic) and the first SRAM module (SRAM1) are coupled is set at the ground potential Vss. The control signal rsb21 is set at a low level and the peripheral circuit power switch PESW21 and the active power switch SW21 are set to an off state. Furthermore, the control signal rsp21 is set at a low level, and the switch MPSW21 of the source line potential control circuit is set to an on state. Therefore, the potential of one cell array source line arvss21 of the cell array (cell_array) of the first SRAM module (SRAM1) is set at a level a little higher than the ground potential Vss; accordingly, current of the cell array (cell_array) is reduced to such an extent that retained data of the cell array are not destroyed.

<<A Deep Standby State of the Logic and the First SRAM>>

When the control signal cnt21 is set at a low level in order to bring the logic circuit (logic) and the first SRAM module (SRAM1) into a deep standby state, the first power switch PWSW21 is set to an off state; accordingly, the potential of the first local power line vssl21 to which the logic circuit (logic) and the first SRAM module (SRAM1) are coupled is set at a level near the power supply voltage Vdd. Therefore, it is possible to reduce a leakage current of the memory cell (MC) of the cell array (cell_array) of the first SRAM module (SRAM1) to almost zero.

<<An Active State of One of the Second and the Third SRAM>>

When one of the control signals cnt22 and cnt23 is set at a high level in order to bring one of the second and the third SRAM module (SRAM2, SRAM3) into an active state, one of the second and the third power switch PWSW22 and PWSW23 is set to an on state. Therefore, the potential of the second local power line vssm22 to which the second and the third SRAM module (SRAM2, SRAM3) are coupled is set at the ground potential Vss. Furthermore, one of the control signals rsb22 and rsb23 is set at a high level, one of the control signals rsp22 and rsp23 is set at a low level, and one of the peripheral circuit power switches PESW22 and PESW23, one of the active power switches SW22 and SW23, and one of the deep standby switches MPSW22 and MPSW23 are set to an on state. Accordingly, the peripheral circuit (peripheral) and the cell array (cell_array) of one of the second and the third SRAM modules (SRAM 2, SRAM3) are set to an active state. Therefore, it becomes possible to execute write operation or read operation to the SRAM module in the active state. When executing write operation to the SRAM module in the present active state, as is the case with the first SRAM module (SRAM1), it is possible to perform a write assist which weakens retaining function of old data of a cell array of the SRAM module in an active state, by changing one of the control signals rsp22 and rsp23 toward the high-level direction and reducing the degree of conduction of one of the switches MPSW22 and MPSW23.

<<Standby State of One of the Second and the Third SRAM>>

When one of the control signals cnt22 and cnt23 is set at a high level in order to bring one of the second and the third SRAM module (SRAM2, SRAM3) into a standby state, one of the second and the third power switch PWSW22 and PWSW23 is set to an on state. Therefore, the potential of the second local power line vssm22 to which the second and the third SRAM module (SRAM2, SRAM3) are coupled is set at the ground potential Vss. Furthermore, one of the control signals rsb22 and rsb23 is set at a low level, and one of the peripheral circuit power switches PESW22 and PESW23 and one of the active power switches SW22 and SW23 are set to an off state. Furthermore, the control signals rsp22 and rsp23 are set at a low level, and the switches MPSW22 and MPSW23 of the source line potential control circuit are set to an on state.

Therefore, the potential of the cell array source lines arvss22 and arvss23 of the cell array (cell_array) of one of the second and the third SRAM module (SRAM2, SRAM3) is set at a level a little higher than the ground potential Vss; accordingly, it becomes possible to reduce current of the cell array (cell_array) to such an extent that the retained data of the cell array (cell_array) are not destroyed.

<<Array Power Cut-Off State of Only One of the Second and the Third SRAM>>

When one of the control signals cnt22 and cnt23 is set at a high level in order to bring only one of the second and the third SRAM module (SRAM2, SRAM3) into an array power cut-off state, only one of the second and the third power switch PWSW22 and PWSW23 is set to an on state. Therefore, the potential of the second local power line vssm22 to which the second and the third SRAM module (SRAM2, SRAM3) are coupled is set at the ground potential Vss. Furthermore, only one of the control signals rsb22 and rsb23 is set at a low level, and only one of the peripheral circuit power switches PESW22 and PESW23 and only one of the active power switches SW22 and SW23 are set to an off state. Furthermore, only one of the control signals rsp22 and rsp23 is set at a high level, and only one of the switches MPSW22 and MPSW23 of the source line potential control circuit is set to an off state.

In one of the SRAM modules in which the switch MPSW22 or the switch MPSW23 is set to an off state, it is possible to reduce effectively a leakage current of a memory cell (MC) which is brought to an array power cut-off state, compared with a standby state in which data is held.

<<An Array Power Cut-Off State of Both the Second and the Third SRAM>>

When one of the control signals cnt22 and cnt23 is set at a high level, only one of the second and the third power switch PWSW22 and PWSW23 is set to an on state. Accordingly, the potential of the second local power line vssm22 to which the second and the third SRAM module (SRAM2, SRAM3) are coupled is set at the ground potential Vss. Furthermore, both control signals rsb22 and rsb23 are set at a low level, and both peripheral circuit power switches PESW22 and PESW23 and both active power switches SW22 and SW23 are set to an off state. Furthermore, both control signals rsp22 and rsp23 are set at a high level, and both switches MPSW22 and MPSW23 of the source line potential control circuit are set to an off state. Compared with a standby state in which data is held, it is possible to reduce effectively a leakage current of the memory cell (MC) of both the second and the third SRAM in an array power cut-off state. When compared with an array power gating in which the second and the third power switch PWSW22 and PWSW23 are controlled to an off state with the use of the control signals cnt22 and cnt23 set at a low level, the present array power cut-off state exhibits an effect that a high-speed return from the cut-off state becomes possible.

<<A Deep Standby State of Both the Second and the Third SRAM>>

When the control signal cnt22 is set at a low level in order to bring both the second and the third SRAM module (SRAM2, SRAM3) into a deep standby state, the power switch PWSW22 is set to an off state. Accordingly, the potential of the second local power line vssm22 to which the second and the third SRAM module (SRAM2, SRAM3) are coupled is set at a level near the power supply voltage Vdd, and it is possible to reduce a leakage current to almost zero.

<<Memory Cell>>

Figure 15:
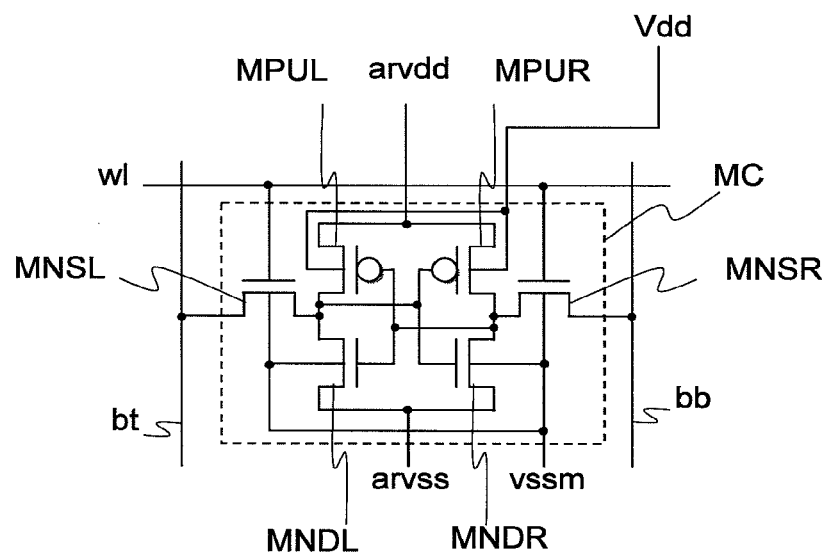
FIG. 15 is a drawing illustrating a configuration of plural memory cells (MC) included in each SRAM module of three SRAM modules (SRAM1, SRAM2, SRAM3) of the semiconductor integrated circuit according to Embodiment 3 of the present invention illustrated in FIG. 14.

FIG. 15 illustrates a configuration of plural memory cells (MC) included in each SRAM module of three SRAM modules (SRAM1, SRAM2, SRAM3) of the semiconductor integrated circuit according to Embodiment 3 of the present invention illustrated in FIG. 14.

The memory cell (MC) illustrated in FIG. 15 is different from the memory cell (MC) illustrated in FIG. 12 in the point that a source of one pair of load P-channel MOS transistors (MPUL, MPUR) is coupled not to the power supply voltage Vdd, but to the cell array source line arvdd to which the deep standby switch MPSW is coupled.

Figure 16:
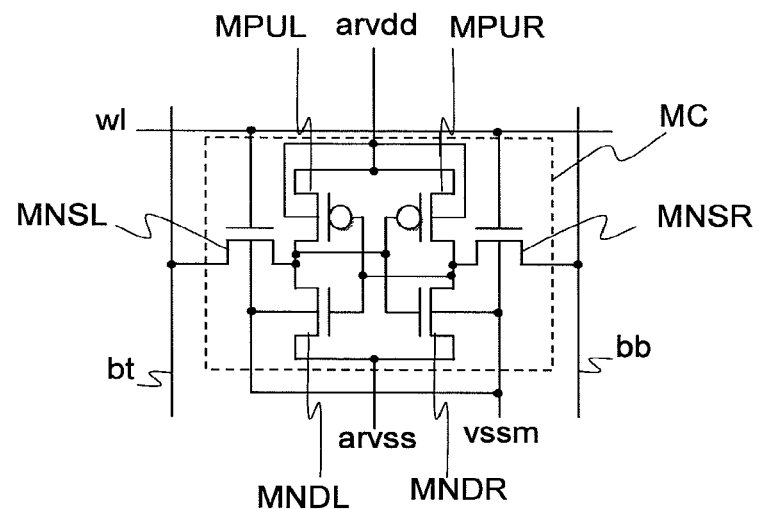
FIG. 16 is a drawing illustrating another configuration of plural memory cells (MC) included in each SRAM module of three SRAM modules (SRAM1, SRAM2, SRAM3) of the semiconductor integrated circuit according to Embodiment 3 of the present invention illustrated in FIG. 14.

FIG. 16 illustrates another configuration of plural memory cells (MC) included in each SRAM module of three SRAM modules (SRAM1, SRAM2, SRAM3) of the semiconductor integrated circuit according to Embodiment 3 of the present invention illustrated in FIG. 14.

The memory cell (MC) illustrated in FIG. 16 is different from the memory cell (MC) illustrated in FIG. 15 in the point that, an N-well of one pair of load P-channel MOS transistors (MPUL, MPUR) is coupled not to the power supply voltage Vdd, but to the cell array source line arvdd to which the deep standby switch MPSW is coupled.

The memory cell (MC) illustrated in FIG. 16 is more advantageous than the memory cell (MC) illustrated in FIG. 15 in a viewpoint of reduction of a leakage current of the memory cell (MC). However, in the memory cell (MC) illustrated in FIG. 16, it is necessary to separate electrically an N-well of one pair of load P-channel MOS transistors (MPUL, MPUR) coupled to the cell array source line arvdd, from an N-well of the peripheral circuit (peripheral) coupled to the power supply voltage Vdd, or other P-channel MOS transistors (MPUL, MPUR) except for the SRAM module.

For example, in a semiconductor integrated circuit of triple well structure, in order to separate electrically plural N-wells of plural P-channel MOS transistors mutually, it is necessary to form plural N-wells spaced out mutually on a P-type substrate. Therefore, the memory cell (MC) illustrated in FIG. 15 is more advantageous than the memory cell (MC) illustrated in FIG. 16 in a viewpoint of reduction of a chip area of a semiconductor integrated circuit. As a result, in designing a semiconductor integrated circuit, if priority is given to reduction of a chip area of a semiconductor integrated circuit, the memory cell (MC) illustrated in FIG. 15 will be chosen, and if priority is given to reduction of a leakage current of a memory cell (MC), the memory cell (MC) illustrated in FIG. 16 will be chosen.

Figure 17:
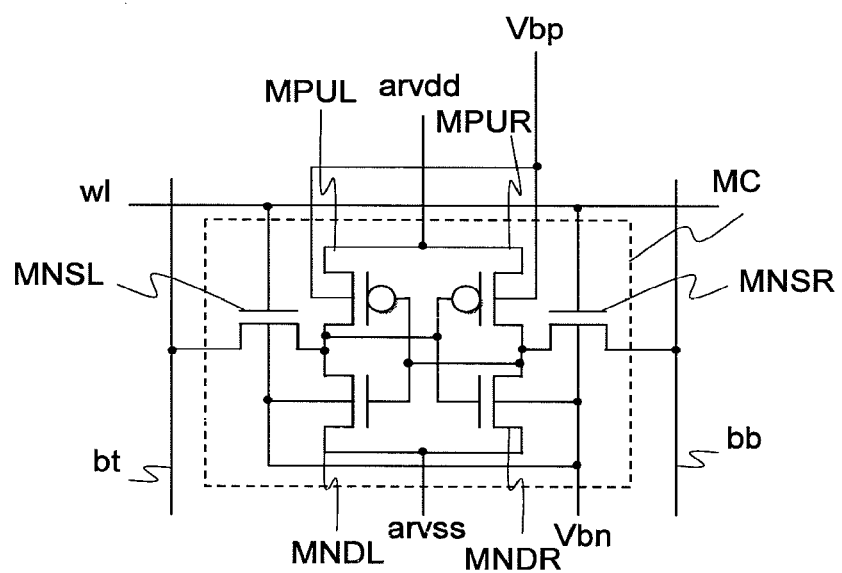
FIG. 17 is a drawing illustrating yet another configuration of plural memory cells (MC) included in each SRAM module of three SRAM modules (SRAM1, SRAM2, SRAM3) of the semiconductor integrated circuit according to Embodiment 3 of the present invention illustrated in FIG. 14.

FIG. 17 illustrates yet another configuration of plural memory cells (MC) included in each SRAM module of three SRAM modules (SRAM1, SRAM2, SRAM3) of the semiconductor integrated circuit according to Embodiment 3 of the present invention illustrated in FIG. 14.

The memory cell (MC) illustrated in FIG. 17 is different from the memory cell (MC) illustrated in FIG. 15 in the point that a PMOS substrate bias voltage Vbp is supplied to an N-well of one pair of load P-channel MOS transistors (MPUL, MPUR), and that an NMOS substrate bias voltage Vbn is supplied to a P-well of one pair of drive N-channel MOS transistors (MNDL, MNDR) and one pair of transfer N-channel MOS transistors (MNSL, MNSR). The PMOS substrate bias voltage Vbp and the NMOS substrate bias voltage Vbn are generated by a substrate bias generation circuit (not shown). The substrate bias generation circuit generates the PMOS substrate bias voltage Vbp and the NMOS substrate bias voltage Vbn which have suitable voltage values, responding to change of a manufacturing process, temperature, or a power supply voltage. Therefore, a logic threshold voltage of a CMOS inverter, which comprises one pair of load P-channel MOS transistors (MPUL, MPUR) and one pair of drive N-channel MOS transistors (MNDL, MNDR) of a memory cell (MC), is set at a voltage value of approximately middle of the operating voltage arvdd–arvss. As a result, a leakage current of the memory cell (MC) is reduced and it is possible to improve the data retaining characteristics of the memory cell (MC).

Embodiment 4

<<A Configuration of a Semiconductor Integrated Circuit According to Embodiment 4>>

Figure 18:
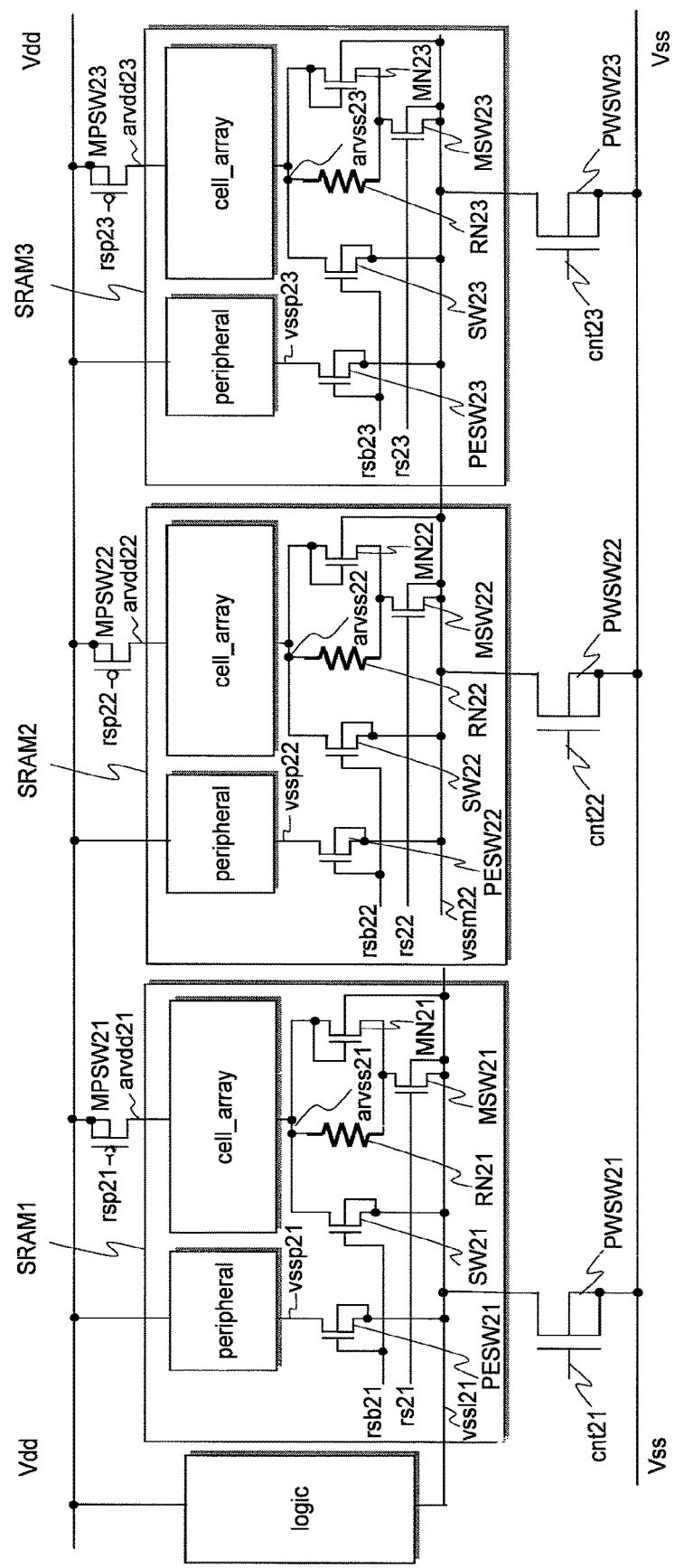
FIG. 18 is a drawing illustrating a configuration of a semiconductor integrated circuit according to Embodiment 4 of the present invention.

FIG. 18 illustrates a configuration of a semiconductor integrated circuit according to Embodiment 4 of the present invention.

A semiconductor integrated circuit according to Embodiment 4 of the present invention illustrated in FIG. 18 is different from the semiconductor integrated circuit according to Embodiment 3 of the present invention illustrated in FIG. 14 in the following points.

That is, in the semiconductor integrated circuit according to Embodiment 4 of the present invention illustrated in FIG. 18, the deep standby switches MSWS21, MSWS22, and MSWS23 comprising the N-channel MOS transistors in the semiconductor integrated circuit according to Embodiment 2 of the present invention illustrated in FIG. 11 are added between the cell array source lines arvss21, arvss22, and arvss23 and the local power lines vssl21 and vssm22.

As a result, in the semiconductor integrated circuit according to Embodiment 4 of the present invention illustrated in FIG. 18, the deep standby switches MPSWS21, MPSWS22, and MPSWS23 comprising P-channel MOS transistors are coupled between the power supply voltage Vdd and the cell array source line arvdd21, arvdd22 and arvdd23 of the cell array (cell_array), and the deep standby switches MSWS21, MSWS22, and MSWS23 comprising N-channel MOS transistors are coupled between the cell array source lines arvss21, arvss22, and arvss23 and the local power line vssl21 and vssm22.

In a deep standby state of the logic circuit (logic) and the first SRAM module (SRAM1), the control signal cnt21 is set at a low level, the first power switch PWSW21 is set to an off state, the control signal rsb21 is set at a low level, and the peripheral circuit power switch PESW21 and the active power switch SW21 are set to an off state. Furthermore, the control signal rs21 is set at a low level, the control signal rsp21 is set at a high level, and the switches MSW21 and MPSW21 of the source line potential control circuit are set to an off state.

In a deep standby state of the second SRAM module (SRAM2), the control signal cnt22 is set at a low level and the second power switch PWSW22 is set to an off state, and the control signal rsb22 is set at a low level and the peripheral circuit power switch PESW22 and the active power switch SW22 are set to an off state. Furthermore, the control signal rs22 is set at a low level and the control signal rsp22 is set at a high level, and the switches MSW22 and MPSW22 of the source line potential control circuit are set to an off state.

Furthermore, in a deep standby state of the third SRAM module (SRAM3), the control signal cnt23 is set at a low level and the third power switch PWSW23 is set to an off state, and the control signal rsb23 is set at a low level and the peripheral circuit power switch PESW23 and the active power switch SW23 are set to an off state. Furthermore, the control signal rs23 is set at a low level and the control signal rsp23 is set at a high level, and the switches MSW23 and MPSW23 of the source line potential control circuit are set to an off state.

In the semiconductor integrated circuit according to Embodiment 4 of the present invention illustrated in FIG. 18, to three SRAM modules (SRAM1, SRAM2, SRAM3), the deep standby switches MPSWS21, MPSWS22, and MPSWS23, each comprising a P-channel MOS transistor on the power supply side, and the deep standby switches MSWS21, MSWS22, and MSWS23, each comprising an N-channel MOS transistor on the ground side, are coupled. Especially, in a deep standby state, the power-supply-side deep standby switches MPSWS21, MPSWS22, and MPSWS23 and the ground-side deep standby switches MSWS21, MSWS22, and MSWS23 are both controlled into an off state; accordingly, it is possible to reduce reliably a leakage current of the cell array (cell_array) which is controlled into a deep standby state. Therefore, in plural memory cells (MC) of a cell array (cell_array), even in the state where the power supply voltage Vdd is supplied to an N-well of one pair of load P-channel MOS transistors (MPUL, MPUR), and the potential of the local power line vssm22 is supplied to a P-well of one pair of drive N-channel MOS transistors (MNDL, MNDR) and one pair of transfer N-channel MOS transistors (MNSL, MNSR), it becomes possible to reduce a leakage current of the memory cell (MC) in a deep standby state. The leakage current in a deep standby state is given by a weak reverse current of a PN junction between the N-well to which the power supply voltage Vdd is supplied and the P-well to which the potential of the local power line vssm22 is supplied.

Embodiment 5

<<A Configuration of a Semiconductor Integrated Circuit According to Embodiment 5>>

Figure 19:
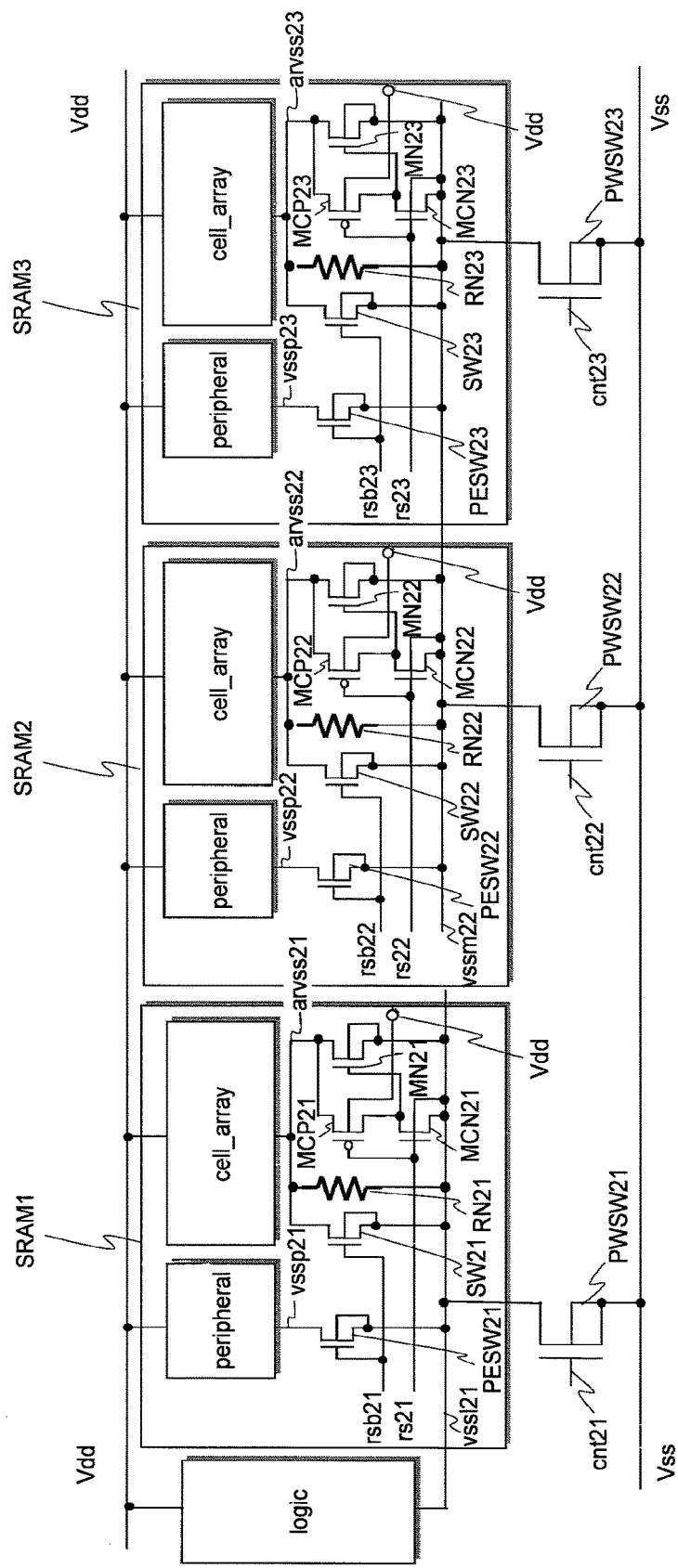
FIG. 19 is a drawing illustrating a configuration of a semiconductor integrated circuit according to Embodiment 5 of the present invention.

FIG. 19 illustrates a configuration of a semiconductor integrated circuit according to Embodiment 5 of the present invention.

A semiconductor integrated circuit according to Embodiment 5 of the present invention illustrated in FIG. 19 is different from the semiconductor integrated circuit according to Embodiment 2 of the present invention illustrated in FIG. 11 in the following points.

That is, in the semiconductor integrated circuit according to Embodiment 5 of the present invention illustrated in FIG. 19, a drain-to-source path of P-channel MOS transistors MCP21, MCP22, and MCP23 is coupled between a gate of the N-channel MOS transistors MN21, MN22, and MN23 of the source line potential control circuit of three SRAM modules (SRAM1, SRAM2, SRAM3) and the cell array source lines arvss21, arvss22, and arvss23, and a drain-to-source path of N-channel MOS transistors MCN21, MCN22, and MCN23 is coupled between a gate of the N-channel MOS transistors MN21, MN22, and MN23 of the source line potential control circuit of three SRAM modules (SRAM1, SRAM2, SRAM3) and the local power lines vssl21 and vssm22.

First, in an active state of the SRAM modules (SRAM1, SRAM2, SRAM3), the control signals cnt21, cnt22, and cnt23 are set at a high level, and the power switches PWSW21, PWSW22, and PWSW23 are set to an on state, and the local power lines vssl21 and vssm22 are set at the ground potential Vss. Next, the control signals rsb21, rsb22, and rsb23 are set at a high level, and the peripheral circuit power switches PESW21, PESW22, and PESW23, and the active power switches SW21, SW22, and SW23 are set to an on state. Accordingly, the peripheral circuit (peripheral) and the cell array (cell_array) of the SRAM modules (SRAM1, SRAM2, SRAM3) are set to an active state.

Next, in a standby state of the SRAM modules (SRAM1, SRAM2, SRAM3), the control signal cnt21, cnt22, and cnt23 are set at a high level, and the power switches PWSW21, PWSW22, and PWSW23 are set to an on state. The control signals rsb21, rsb22, and rsb23 are set at a low level, and the peripheral circuit power switches PESW21, PESW22, and PESW23, and the active power switches SW21, SW22, and SW23 are set to an off state. At this time, the control signals rs21, rs22, and rs23 are set at a low level, and the P-channel MOS transistors MCP21, MCP22, and MCP23 are set to an on state; accordingly, the N-channel MOS transistors MN21, MN22, and MN23 of the source line potential control circuit operate as a diode. Therefore, the potential of the cell array source line arvss21, arvss22, and arvss23 of the cell array (cell_array) of the SRAM modules (SRAM1, SRAM2, SRAM3) is set at a level a little higher than the ground potential Vss. Accordingly, current of the cell array (cell_array) is reduced to such an extent that retained data of the cell array are not destroyed.

In a deep standby state of the SRAM modules (SRAM1, SRAM2, SRAM3), the control signals cnt21, cnt22, and cnt23 are set at a low level, and the power switches PWSW21, PWSW22, and PWSW23 are set to an off state. The control signals rsb21, rsb22, and rsb23 are set at a low level, and the peripheral circuit power switch PESW21, PESW22, and PESW23, and the active power switch SW21, SW22, and SW23 are set to an off state. At this time, the control signals rs21, rs22, and rs23 are set at a high level, the N-channel MOS transistors MCN21, MCN22, and MCN23 are set to an on state, and the N-channel MOS transistors MN21, MN22, and MN23 of the source line potential control circuit are set to an off state. Therefore, it is possible to reduce greatly the operating current of the cell array (cell_array) of the SRAM modules (SRAM1, SRAM2, SRAM3), by setting high a value of resistance of the resistor RN21, RN22, and RN23 of the source line potential control circuit.

Embodiment 6

<<A Configuration of a Semiconductor Integrated Circuit According to Embodiment 6>>

Figure 20:
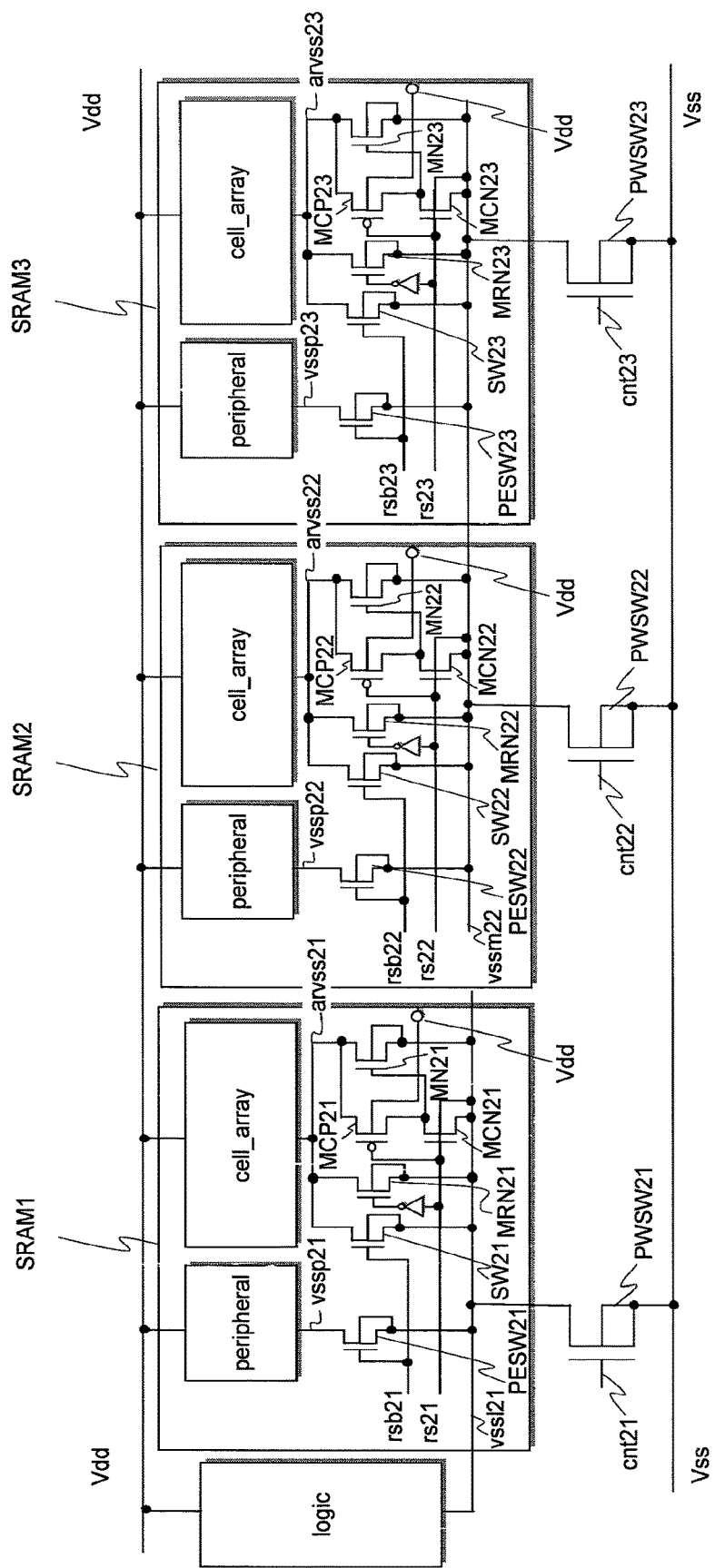
FIG. 20 is a drawing illustrating a configuration of a semiconductor integrated circuit according to Embodiment 6 of the present invention.

FIG. 20 illustrates a configuration of a semiconductor integrated circuit according to Embodiment 6 of the present invention.

A semiconductor integrated circuit according to Embodiment 6 of the present invention illustrated in FIG. 20 is different from the semiconductor integrated circuit according to Embodiment 5 of the present invention illustrated in FIG. 19 in the following points.

That is, the resistors RN21, RN22, and RN23 of the source line potential control circuit of three SRAM modules (SRAM1, SRAM2, SRAM3) of the semiconductor integrated circuit according to Embodiment 5 of the present invention illustrated in FIG. 19 are replaced by N-channel MOS transistors MRN21, MRN22, and MRN23 of the source line potential control circuit of three SRAM modules (SRAM1, SRAM2, SRAM3) of the semiconductor integrated circuit according to Embodiment 6 of the present invention illustrated in FIG. 20. Since a CMOS inverter is coupled to a control gate of each of the N-channel MOS transistors MRN21, MRN22, and MRN23, inverted signals of the control signals rs21, rs22, and rs23 are supplied to the control gates of the N-channel MOS transistors MRN21, MRN22, and MRN23, respectively.

Therefore, in a deep standby state of the semiconductor integrated circuit according to Embodiment 6 of the present invention illustrated in FIG. 20, when the N-channel MOS transistors MN21, MN22, and MN23 of the source line potential control circuit are set to an off state by the control signals rs21, rs22, and rs23 of a high level, the N-channel MOS transistors MRN21, MRN22, and MRN23 are set to an off state; accordingly, it is possible to reduce greatly the operating current of the cell array (cell_array) of the SRAM modules (SRAM1, SRAM2, SRAM3).

Embodiment 7

<<A Configuration of a Semiconductor Integrated Circuit According to Embodiment 7>>

Figure 21:
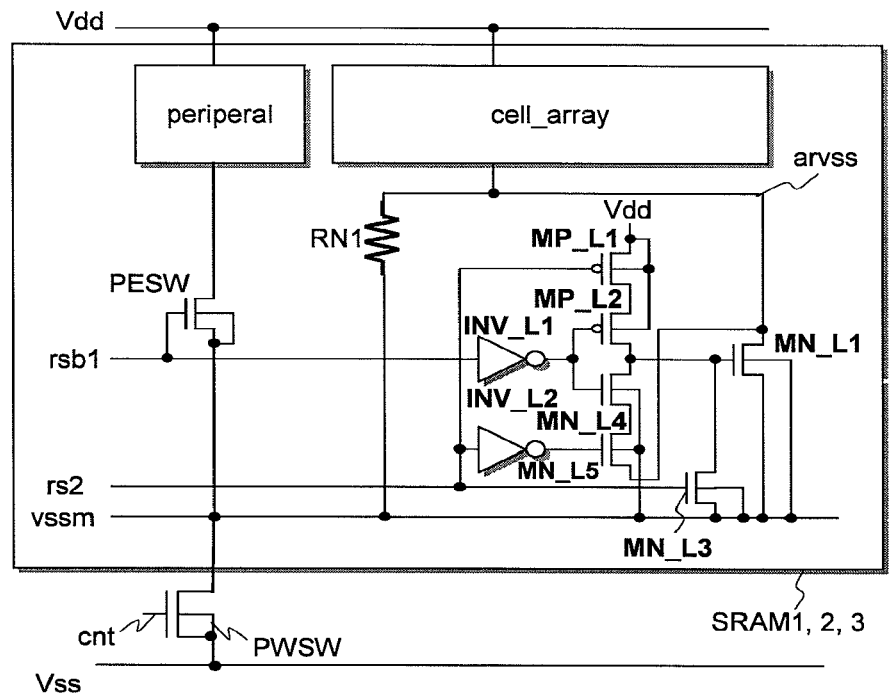
FIG. 21 is a drawing illustrating a configuration of each SRAM module of three SRAM modules (SRAM1, SRAM2, SRAM3) included in a semiconductor integrated circuit according to Embodiment 7 of the present invention.

FIG. 21 illustrates a configuration of each SRAM module of three SRAM modules (SRAM1, SRAM2, SRAM3) included in a semiconductor integrated circuit according to Embodiment 7 of the present invention.

In a semiconductor integrated circuit according to Embodiment 7 of the present invention, although not illustrated in FIG. 21 but as is the case with the semiconductor integrated circuit according to Embodiment 2 of the present invention illustrated in FIG. 11, the local power line of the logic circuit (logic) and the local power line of the first SRAM module (SRAM1) share the first local power line vssl21, and the local power line of the second SRAM module (SRAM2) and the local power line of the third SRAM module (SRAM3) share the second local power line vssm22. The first power switch PWSW21 coupled between the shared first local power line vssl21 and the ground potential Vss is shared by the logic circuit (logic) and the first SRAM module (SRAM1). Furthermore, the second power switch PWSW22 and the third power switch PWSW23, which are coupled between the shared second local power line vssm22 and the ground potential Vss, are shared by the second SRAM module (SRAM2) and the third SRAM module (SRAM3).

In the first SRAM module (SRAM1) of the semiconductor integrated circuit according to Embodiment 7 of the present invention, a peripheral circuit power switch PESW21 is coupled between the peripheral circuit (peripheral) and the first local power line vssl21, and a source line potential control circuit (to be explained below) is coupled between the cell array source line arvss21 of the cell array (cell_array) and the first local power line vssl21. Also in the second SRAM module (SRAM2), a peripheral circuit power switch PESW22 is coupled between the peripheral circuit (peripheral) and the second local power line vssm22, and a source line potential control circuit (to be explained below) is coupled between the cell array source line arvss22 of the cell array (cell_array) and the second local power line vssm22. Furthermore, also in the third SRAM module (SRAM3), a peripheral circuit power switch PESW23 is coupled between the peripheral circuit (peripheral) and the second local power line vssm22, and a source line potential control circuit (to be explained below) is coupled between the cell array source line arvss23 of the cell array (cell_array) and the second local power line vssm22.

<<Source Line Potential Control Circuit>>

As illustrated in FIG. 21, the source line potential control circuit of each SRAM module of three SRAM modules (SRAM1, SRAM2, SRAM3) of the semiconductor integrated circuit according to Embodiment 7 of the present invention comprises a resistor RN1 and an N-channel MOS transistor MN_L1 coupled in parallel between the cell array source line arvss and the local power line vssm.

A source-to-drain path of two P-channel MOS transistors MP_L1 and MP_L2 is coupled in series between the power supply voltage Vdd and a control gate of the N-channel MOS transistor MN_L1, and a drain-to-source path of two N-channel MOS transistors MN_L5 and MN_L4 is coupled in series between a drain and the control gate of the N-channel MOS transistor MN_L1.

A drain-to-source path of an N-channel MOS transistor MN_L3 is coupled between the control gate of the N-channel MOS transistor MN_L1 and the local power line vssm, and the control signal rs2 is supplied to a control gate of the N-channel MOS transistor MN_L3.

The control signal rsb1 is supplied to an input terminal of the CMOS inverter INV_L1, and an output signal of the CMOS inverter INV_L1 is supplied to a control gate of the P-channel MOS transistor MP_L2 and a control gate of the N-channel MOS transistor MN_L4. The control signal rs2 is supplied to a control gate of the P-channel MOS transistor MP_L1 and an input terminal of the CMOS inverter INV_L2, and an output signal of the CMOS inverter INV_L2 is supplied to a control gate of the N-channel MOS transistor MN_L5.

<<Active State>>

In an active state of the SRAM module illustrated in FIG. 21, the control signal cnt, the control signal rsb1, and the control signal rs2 are set at a high level, a high level, and a low level, respectively. Therefore, the power switch PWSW is set to an on state, two P-channel MOS transistors MP_L1 and MP_L2 which are coupled in series are set to an on state, and the N-channel MOS transistor MN_L1 is set to an on state.

Therefore, the local power line vssm is set at the ground potential Vss and the peripheral circuit power switch PESW is set to an on state; accordingly, the peripheral circuit (peripheral) is set to an active state. Furthermore, the potential of the cell array source line arvss is set at the ground potential Vss due to the on state of the N-channel MOS transistor MN_L1, and the cell array (cell_array) is also set to an active state; accordingly, it becomes possible to execute write operation or read operation of the SRAM module illustrated in FIG. 21.

<<Standby State>>

In a standby state of the SRAM module illustrated in FIG. 21, the control signal cnt, the control signal rsb1, and the control signal rs2 are set at a high level, a low level, and a low level, respectively. Therefore, the power switch PWSW is set to an on state, and two N-channel MOS transistors MN_L5 and MN_L 4 which are coupled in series are set to an on state; accordingly, the N-channel MOS transistor MN_L1 operates as a diode.

Therefore, the peripheral circuit power switch PESW is set to an off state, and the peripheral circuit (peripheral) is set to a standby state. Furthermore, The potential of the cell array source line arvss is set at a level a little higher than the ground potential Vss due to the diode operation of the N-channel MOS transistor MN_L1, and the current of the cell array is reduced to such an extent that retained data of the cell array (cell_array) are not destroyed.

<<Deep Standby State>>

In a deep standby state of the SRAM module illustrated in FIG. 21, the control signal rsb1 and the control signal rs2 are set at a low level and a high level, respectively. Therefore, the N-channel MOS transistor MN_L3 is set to an on state, and the N-channel MOS transistor MN_L1 is set to an off state. Therefore, it is possible to reduce greatly the operating current of the cell array (cell_array) of the SRAM module, by setting high a value of resistance of the resistor RN1 of the source line potential control circuit.

Embodiment 8

<<A Configuration of a Semiconductor Integrated Circuit According to Embodiment 8>>

Figure 22:
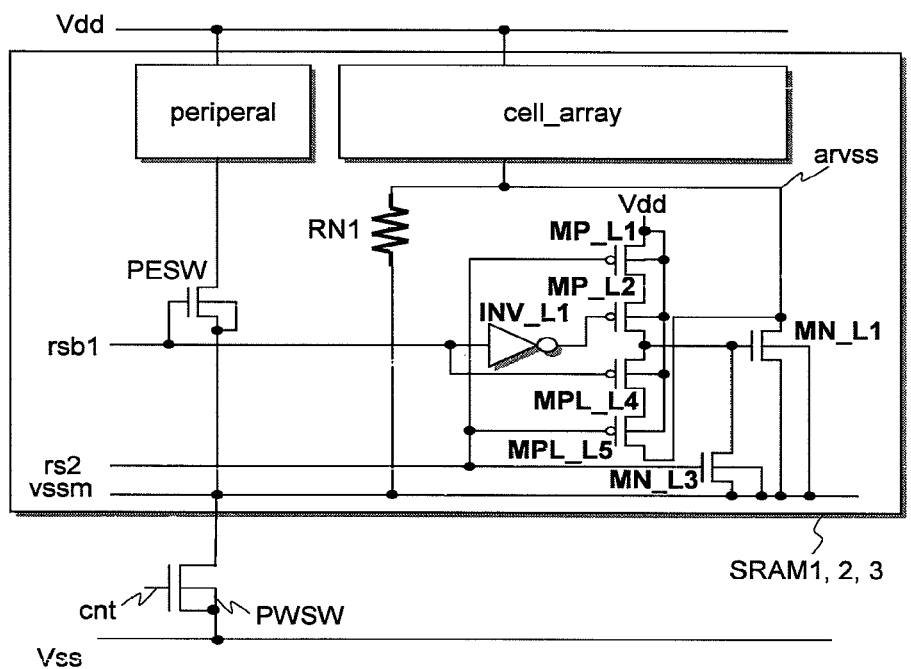
FIG. 22 is a drawing illustrating a configuration of each SRAM module of three SRAM modules (SRAM1, SRAM2, SRAM3) included in a semiconductor integrated circuit according to Embodiment 8 of the present invention.

FIG. 22 illustrates a configuration of each SRAM module of three SRAM modules (SRAM1, SRAM2, SRAM3) included in a semiconductor integrated circuit according to Embodiment 8 of the present invention.

In a semiconductor integrated circuit according to Embodiment 8 of the present invention, although not illustrated in FIG. 22 but as is the case with the semiconductor integrated circuit according to Embodiment 2 of the present invention illustrated in FIG. 11, the local power line of the logic circuit (logic) and the local power line of the first SRAM module (SRAM1) share the first local power line vssl21, and the local power line of the second SRAM module (SRAM2) and the local power line of the third SRAM module (SRAM3) share the second local power line vssm22. The first power switch PWSW21 coupled between the shared first local power line vssl21 and the ground potential Vss is shared by the logic circuit (logic) and the first SRAM module (SRAM1). Furthermore, the second power switch PWSW22 and the third power switch PWSW23, which are coupled between the shared second local power line vssm22 and the ground potential Vss, are shared by the second SRAM module (SRAM2) and the third SRAM module (SRAM3).

In the first SRAM module (SRAM1) of the semiconductor integrated circuit according to Embodiment 8 of the present invention, a peripheral circuit power switch PESW21 is coupled between the peripheral circuit (peripheral) and the first local power line vssl21, and a source line potential control circuit (to be explained below) is coupled between the cell array source line arvss21 of the cell array (cell_array) and the first local power line vssl21. Also in the second SRAM module (SRAM2), a peripheral circuit power switch PESW22 is coupled between the peripheral circuit (peripheral) and the second local power line vssm22, and a source line potential control circuit (to be explained below) is coupled between the cell array source line arvss22 of the cell array (cell_array) and the second local power line vssm22. Furthermore, also in the third SRAM module (SRAM3), a peripheral circuit power switch PESW23 is coupled between the peripheral circuit (peripheral) and the second local power line vssm22, and a source line potential control circuit (to be explained below) is coupled between the cell array source line arvss23 of the cell array (cell_array) and the second local power line vssm22.

<<Source Line Potential Control Circuit>>

As illustrated in FIG. 22, the source line potential control circuit of each SRAM module of three SRAM modules (SRAM1, SRAM2, SRAM3) of the semiconductor integrated circuit according to Embodiment 8 of the present invention comprises a resistor RN1 and an N-channel MOS transistor MN_L1 coupled in parallel between the cell array source line arvss and the local power line vssm.

A source-to-drain path of two P-channel MOS transistors MP_L1 and MP_L2 is coupled in series between the power supply voltage Vdd and a control gate of the N-channel MOS transistor MN_L1, and a source-to-drain path of two P-channel MOS transistors MP_L5 and MP_L4 is coupled in series between a drain and the control gate of the N-channel MOS transistor MN_L1.

A drain-to-source path of a N-channel MOS transistor MN_L3 is coupled between the control gate of the N-channel MOS transistor MN_L1 and the local power line vssm, and the control signal rs2 is supplied to a control gate of the N-channel MOS transistor MN_L3.

The control signal rsb1 is supplied to a control gate of the P-channel MOS transistor MP_L4 and an input terminal of the CMOS inverter INV_L1, and an output signal of the CMOS inverter INV_L1 is supplied to a control gate of the P-channel MOS transistor MP_L2. The control signal rs2 is supplied to a control gate of the P-channel MOS transistor MP_L1 and a control gate of the P-channel MOS transistor MP_L5.

<<Active State>>

In an active state of the SRAM module illustrated in FIG. 22, the control signal cnt, the control signal rsb1, and the control signal rs2 are set at a high level, a high level, and a low level, respectively. Accordingly, the power switch PWSW is set to an on state, two P-channel MOS transistors MP_L1 and MP_L2 which are coupled in series are set to an on state, and the N-channel MOS transistor MN_L1 is set to an on state.

Therefore, the local power line vssm is set at the ground potential Vss and the peripheral circuit power switch PESW is set to an on state; accordingly, the peripheral circuit (peripheral) is set to an active state. Furthermore, the potential of the cell array source line arvss is set at the ground potential Vss due to the on state of the N-channel MOS transistor MN_L1, and the cell array (cell_array) is also set to an active state; accordingly, it becomes possible to execute write operation or read operation of the SRAM module illustrated in FIG. 22.

<<Standby State>>

In a standby state of the SRAM module illustrated in FIG. 22, the control signal cnt, the control signal rsb1, and the control signal rs2 are set at a high level, a low level, and a low level, respectively. Accordingly, the power switch PWSW is set to an on state, two P-channel MOS transistors MP_L5 and MP_L4 which are coupled in series are set to an on state, and the N-channel MOS transistor MN_L1 operates as a diode.

Therefore, the peripheral circuit power switch PESW is set to an off state, and the peripheral circuit (peripheral) is set in a standby state. Furthermore, the potential of the cell array source line arvss is set at a level a little higher than the ground potential Vss due to the diode operation of the N-channel MOS transistor MN_L1, and current of the cell array (cell_array) is reduced to such an extent that retained data of the cell array are not destroyed.

<<Deep Standby State>>

In a deep standby state of the SRAM module illustrated in FIG. 22, the control signal rsb1 and the control signal rs2 are set at a low level and a high level, respectively. Therefore, the N-channel MOS transistor MN_L3 is set to an on state, and the N-channel MOS transistor MN_L1 is set to an off state. Therefore, it is possible to reduce greatly the operating current of the cell array (cell_array) of the SRAM module, by setting high a value of resistance of the resistor RN1 of the source line potential control circuit.

Embodiment 9

<<A Configuration of a Semiconductor Integrated Circuit According to Embodiment 9>>

Figure 23:
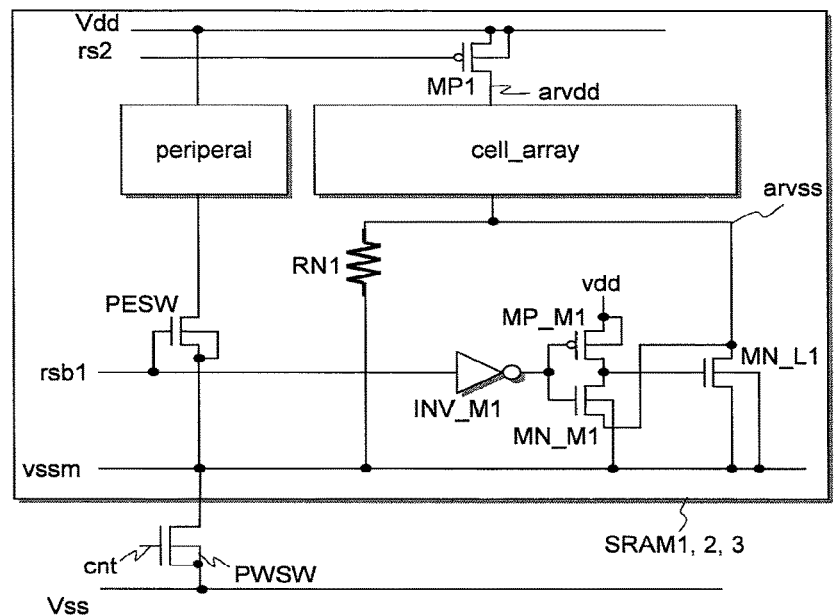
FIG. 23 is a drawing illustrating a configuration of each SRAM module of three SRAM modules (SRAM1, SRAM2, SRAM3) included in a semiconductor integrated circuit according to Embodiment 9 of the present invention.

FIG. 23 illustrates a configuration of each SRAM module of three SRAM modules (SRAM1, SRAM2, SRAM3) included in a semiconductor integrated circuit according to Embodiment 9 of the present invention.

In a semiconductor integrated circuit according to Embodiment 9 of the present invention, although not illustrated in FIG. 23 but as is the case with the semiconductor integrated circuit according to Embodiment 3 of the present invention illustrated in FIG. 14, the local power line of the logic circuit (logic) and the local power line of the first SRAM module (SRAM1) share the first local power line vssl21, and the local power line of the second SRAM module (SRAM2) and the local power line of the third SRAM module (SRAM3) share the second local power line vssm22. The first power switch PWSW21 coupled between the shared first local power line vssl21 and the ground potential Vss is shared by the logic circuit (logic) and the first SRAM module (SRAM1). Furthermore, the second power switch PWSW22 and the third power switch PWSW23, which are coupled between the shared second local power line vssm22 and the ground potential Vss, are shared by the second SRAM module (SRAM2) and the third SRAM module (SRAM3).

Furthermore, In the semiconductor integrated circuit according to Embodiment 9 of the present invention, although not illustrated in FIG. 23 but as is the case with the semiconductor integrated circuit according to Embodiment 3 of the present invention illustrated in FIG. 14, the deep standby switches MPSWS21, MPSWS22, and MPSWS23 comprising a P-channel MOS transistor are coupled between the power supply voltage Vdd and the cell array source lines arvdd21, arvdd22, and arvdd23 of the cell array (cell_array).

In the first SRAM module (SRAM1) of the semiconductor integrated circuit according to Embodiment 9 of the present invention, a peripheral circuit power switch PESW21 is coupled between the peripheral circuit (peripheral) and the first local power line vssl21, and a source line potential control circuit (to be explained below) is coupled between the cell array source line arvss21 of the cell array (cell_array) and the first local power line vssl21. Also in the second SRAM module (SRAM2), a peripheral circuit power switch PESW22 is coupled between the peripheral circuit (peripheral) and the second local power line vssm22, and a source line potential control circuit (to be explained below) is coupled between the cell array source line arvss22 of the cell array (cell_array) and the second local power line vssm22. Furthermore, also in the third SRAM module (SRAM3), a peripheral circuit power switch PESW23 is coupled between the peripheral circuit (peripheral) and the second local power line vssm22, and a source line potential control circuit (to be explained below) is coupled between the cell array source line arvss23 of the cell array (cell_array) and the second local power line vssm22.

<<A Source Line Potential Control Circuit on the Power Supply Side>>

As illustrated in FIG. 23, the source line potential control circuit on the power supply side of each SRAM module of three SRAM modules (SRAM1, SRAM2, SRAM3) of the semiconductor integrated circuit according to Embodiment 9 of the present invention comprises a P-channel MOS transistor MP1 between the power supply voltage Vdd and the power-supply-side cell array source line arvdd, and the control signal rs2 is supplied to a control gate of the P-channel MOS transistor MP1.

<<The Source Line Potential Control Circuit on the Ground Side>>

As illustrated in FIG. 23, the source line potential control circuit on the ground side of each SRAM module of three SRAM modules (SRAM1, SRAM2, SRAM3) of the semiconductor integrated circuit according to Embodiment 9 of the present invention, comprises a resistor RN1 and an N-channel MOS transistor MN_L1 coupled in parallel between the cell array source line arvss and the local power line vssm.

A source-to-drain path of a P-channel MOS transistor MP_M1 is coupled between the power supply voltage Vdd and a control gate of the N-channel MOS transistor MN_L1, and a drain-to-source path of a N-channel MOS transistor MN_M1 is coupled between a drain and the control gate of the N-channel MOS transistor MN_L1.

The control signal rsb1 is supplied to an input terminal of a CMOS inverter INV_L1, and an output signal of the CMOS inverter INV_L1 is supplied to a control gate of the P-channel MOS transistor MP_M1 and a control gate of the N-channel MOS transistor MN_M1.

<<Active State>>

In an active state of the SRAM module illustrated in FIG. 23, the control signal cnt, the control signal rsb1, and the control signal rs2 are set at a high level, a high level, and a low level, respectively. Accordingly, the power switch PWSW is set to an on state. In the source line potential control circuit on the ground side, the P-channel MOS transistor MP_M1 is set to an on state, and the N-channel MOS transistor MN_L1 is set to an on state. In the source line potential control circuit on the power supply side, the P-channel MOS transistor MP1 is set to an on state.

Therefore, the local power line vssm is set at the ground potential Vss and the peripheral circuit power switch PESW is set to an on state; accordingly, the peripheral circuit (peripheral) is set to an active state. Furthermore, the potential of the power-supply-side cell array source line arvdd is set at the power supply voltage Vdd due to the on state of the P-channel MOS transistor MP1, the potential of the ground-side cell array source line arvss is set at the ground potential Vss due to the on state of the N-channel MOS transistor MN_L1, and the cell array (cell_array) is also set to an active state; accordingly, it becomes possible to execute write operation or read operation of the SRAM module illustrated in FIG. 23.

<<Standby State>>

In a standby state of the SRAM module illustrated in FIG. 23, the control signal cnt, the control signal rsb1, and the control signal rs2 are set at a high level, a low level, and a low level, respectively. Accordingly, the power switch PWSW is set to an on state, the N-channel MOS transistor MN_M1 is set to an on state, and the N-channel MOS transistor MN_L1 operates as a diode.

Accordingly, the peripheral circuit power switch PESW is set to an off state, and the peripheral circuit (peripheral) is set in a standby state. In the source line potential control circuit on the power supply side, the P-channel MOS transistor MP1 between the power supply voltage Vdd and the power-supply-side cell array source line arvdd is controlled into an on state. Furthermore, in the source line potential control circuit on the ground side, the potential of the cell array source line arvss is set at a level a little higher than the ground potential Vss due to the diode operation of the N-channel MOS transistor MN_L1. Accordingly, current of the cell array (cell_array) is reduced to such an extent that retained data of the cell array are not destroyed.

<<Deep Standby State>>

In a deep standby state of the SRAM module illustrated in FIG. 23, the control signal rsb1 and the control signal rs2 are set at a low level and a high level, respectively. Therefore, the P-channel MOS transistor MP1 of the source line potential control circuit on the power supply side is set to an off state, and in the source line potential control circuit on the ground side, the N-channel MOS transistor MN_M1 is set to an on state and the N-channel MOS transistor MN_L1 is set to an off state. Therefore, it is possible to reduce greatly the operating current of the cell array (cell_array) of the SRAM module, by setting high a value of resistance of the resistor RN1 of the source line potential control circuit on the ground side.

Embodiment 10

<<A Configuration of a Semiconductor Integrated Circuit According to Embodiment 10>>

Figure 24:
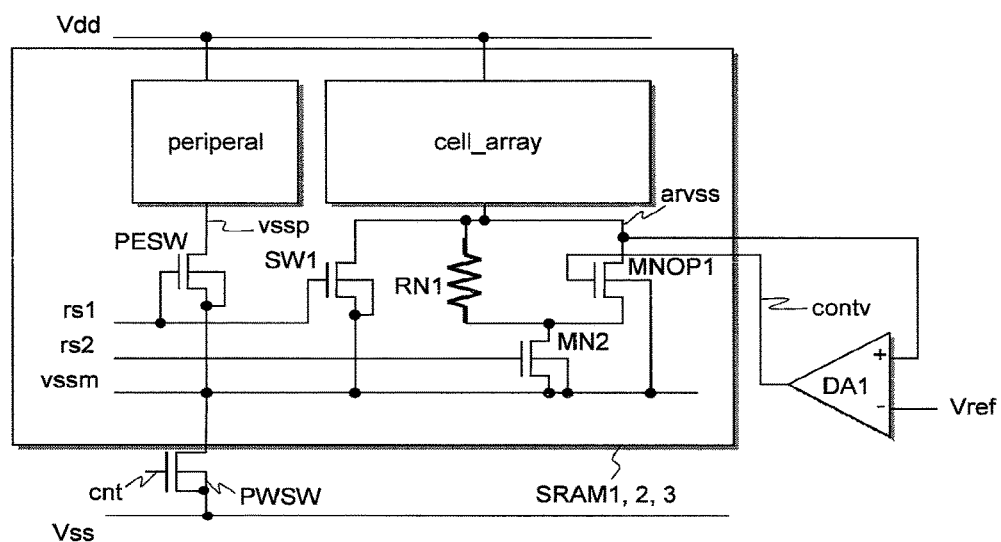
FIG. 24 is a drawing illustrating a configuration of each SRAM module of three SRAM modules (SRAM1, SRAM2, SRAM3) included in a semiconductor integrated circuit according to Embodiment 10 of the present invention.

FIG. 24 illustrates a configuration of each SRAM module of three SRAM modules (SRAM1, SRAM2, SRAM3) included in a semiconductor integrated circuit according to Embodiment 10 of the present invention.

In a semiconductor integrated circuit according to Embodiment 10 of the present invention, although not illustrated in FIG. 24 but as is the case with the semiconductor integrated circuit according to Embodiment 2 of the present invention illustrated in FIG. 11, the local power line of the logic circuit (logic) and the local power line of the first SRAM module (SRAM1) share the first local power line vssl21, and the local power line of the second SRAM module (SRAM2) and the local power line of the third SRAM module (SRAM3) share the second local power line vssm22. The first power switch PWSW21 coupled between the shared first local power line vssl21 and the ground potential Vss is shared by the logic circuit (logic) and the first SRAM module (SRAM1). Furthermore, the second power switch PWSW22 and the third power switch PWSW23, which are coupled between the shared second local power line vssm22 and the ground potential Vss, are shared by the second SRAM module (SRAM2) and the third SRAM module (SRAM3).

In the first SRAM module (SRAM1) of the semiconductor integrated circuit according to Embodiment 10 of the present invention, a peripheral circuit power switch PESW21 is coupled between the peripheral circuit (peripheral) and the first local power line vssl21, and a source line potential control circuit (to be explained below) is coupled between the cell array source line arvss21 of the cell array (cell_array) and the first local power line vssl21. Also in the second SRAM module (SRAM2), a peripheral circuit power switch PESW22 is coupled between the peripheral circuit (peripheral) and the second local power line vssm22, and a source line potential control circuit (to be explained below) is coupled between the cell array source line arvss22 of the cell array (cell_array) and the second local power line vssm22. Furthermore, also in the third SRAM module (SRAM3), a peripheral circuit power switch PESW23 is coupled between the peripheral circuit (peripheral) and the second local power line vssm22, and a source line potential control circuit (to be explained below) is coupled between the cell array source line arvss23 of the cell array (cell_array) and the second local power line vssm22.

<<Source Line Potential Control Circuit>>

As illustrated in FIG. 24, the source line potential control circuit of each SRAM module of three SRAM modules (SRAM1, SRAM2, SRAM3) of the semiconductor integrated circuit according to Embodiment 10 of the present invention comprises an active power switch SW1, a resistor RN1, an N-channel MOS transistor MNOP1, and a deep standby switch MN2, arranged between the cell array source line arvss and the local power line vssm. A parallel coupling body of the resistor RN1 and the N-channel MOS transistor MNOP1 is coupled with the deep standby switch MN2 in series, and the deep standby switch MN2 is coupled with the power switch PWSW in series.

Especially, the semiconductor integrated circuit according to Embodiment 10 of the present invention illustrated in FIG. 24 comprises a differential amplifier DA1. The potential of the cell array source line arvss of a drain of the N-channel MOS transistor MNOP1 is supplied to a noninverting input terminal (+) of the differential amplifier DA1, a reference voltage Vref is supplied to an inverting input terminal (−) of the differential amplifier DA1, and an output signal of the differential amplifier DA1 is supplied to a control gate of the N-channel MOS transistor MNOP1.

<<Active State>>

In an active state of the SRAM module illustrated in FIG. 24, the control signal cnt, the control signal rs1, and the control signal rs2 are set at a high level, a high level, and a low level, respectively. Accordingly, the power switch PWSW is set to an on state. Therefore, the local power line vssm is set at the ground potential Vss and the peripheral circuit power switch PESW is set to an on state; accordingly, the peripheral circuit (peripheral) is set to an active state. Furthermore, the potential of the cell array source line arvss is set at the ground potential Vss due to the on state of the active power switch SW1, and the cell array (cell_array) is also set to an active state; accordingly, it becomes possible to execute write operation or read operation of the SRAM module illustrated in FIG. 24.

<<Standby State>>

In a standby state of the SRAM module illustrated in FIG. 24, the differential amplifier DA1 is activated first, the control signal cnt, the control signal rs1, and the control signal rs2 are set at a high level, a low level, and a high level, respectively; accordingly, the power switch PWSW is set to an on state, the peripheral circuit power switch PESW is set to an off state, and the peripheral circuit (peripheral) is set in a standby state. Furthermore, the active power switch SW1 is set to an off state, and the deep standby switch MN2 is set to an on state. Furthermore, by the activation of the differential amplifier DA1, the control gate of the N-channel MOS transistor MNOP1 is controlled by the output signal of the differential amplifier DA1 so that the potential of the cell array source line arvss of the drain of the N-channel MOS transistor MNOP1 may become nearly equal to the reference voltage Vref. In this way, in the source line potential control circuit, due to the operation of the differential amplifier DA1 and the N-channel MOS transistor MNOP1, the potential of the cell array source line arvss is set at a level of the reference voltage Vref which is a little higher than the ground potential Vss. Therefore, current of the cell array (cell_array) is reduced to such an extent that retained data of the cell array are not destroyed. The reference voltage Vref is set at a suitable voltage value, corresponding to changes of a manufacturing process, temperature, or a power supply voltage.

<<Deep Standby State>>

In a deep standby state of the SRAM module illustrated in FIG. 24, the control signal rs1 and the control signal rs2 are set to a low level and a low level, respectively, and the peripheral circuit power switch PESW, the active power switch SW1, and the deep standby switch MN2 are set to an off state. Therefore, it is possible to reduce greatly the operating current of the cell array (cell_array) of the SRAM module.

Embodiment 11

<<A Configuration of a Semiconductor Integrated Circuit According to Embodiment 11>>

Figure 25:
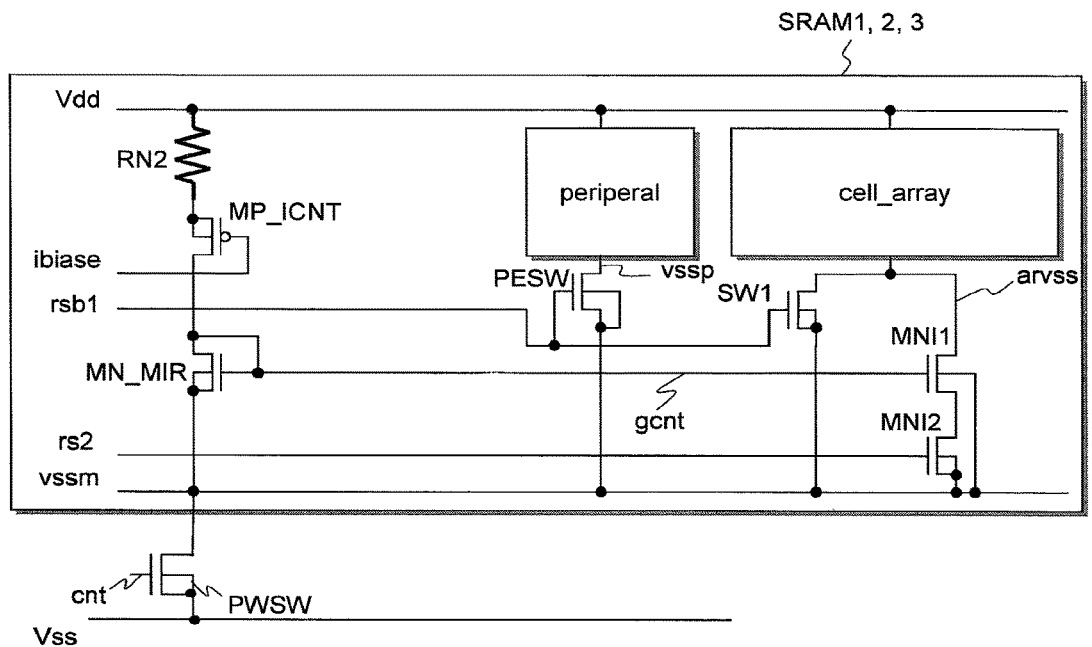
FIG. 25 is a drawing illustrating a configuration of each SRAM module of three SRAM modules (SRAM1, SRAM2, SRAM3) included in a semiconductor integrated circuit according to Embodiment 11 of the present invention.

FIG. 25 illustrates a configuration of each SRAM module of three SRAM modules (SRAM1, SRAM2, SRAM3) included in a semiconductor integrated circuit according to Embodiment 11 of the present invention.

In a semiconductor integrated circuit according to Embodiment 11 of the present invention, although not illustrated in FIG. 25 but as is the case with the semiconductor integrated circuit according to Embodiment 2 of the present invention illustrated in FIG. 11, the local power line of the logic circuit (logic) and the local power line of the first SRAM module (SRAM1) share the first local power line vssl21, and the local power line of the second SRAM module (SRAM2) and the local power line of the third SRAM module (SRAM3) share the second local power line vssm22. The first power switch PWSW21 coupled between the shared first local power line vssl21 and the ground potential Vss is shared by the logic circuit (logic) and the first SRAM module (SRAM1). Furthermore, the second power switch PWSW22 and the third power switch PWSW23, which are coupled between the shared second local power line vssm22 and the ground potential Vss, are shared by the second SRAM module (SRAM2) and the third SRAM module (SRAM3).

In the first SRAM module (SRAM1) of the semiconductor integrated circuit according to Embodiment 11 of the present invention, a peripheral circuit power switch PESW21 is coupled between the peripheral circuit (peripheral) and the first local power line vssl21, and a source line potential control circuit (to be explained below) is coupled between the cell array source line arvss21 of the cell array (cell_array) and the first local power line vssl21. Also in the second SRAM module (SRAM2), a peripheral circuit power switch PESW22 is coupled between the peripheral circuit (peripheral) and the second local power line vssm22, and a source line potential control circuit (to be explained below) is coupled between the cell array source line arvss22 of the cell array (cell_array) and the second local power line vssm22. Furthermore, also in the third SRAM module (SRAM3), a peripheral circuit power switch PESW23 is coupled between the peripheral circuit (peripheral) and the second local power line vssm22, and a source line potential control circuit (to be explained below) is coupled between the cell array source line arvss23 of the cell array (cell_array) and the second local power line vssm22. Furthermore, a bias circuit (to be explained below) is coupled to the source line potential control circuit.

<<Source Line Potential Control Circuit>>

As illustrated in FIG. 25, the source line potential control circuit of each SRAM module of three SRAM modules (SRAM1, SRAM2, SRAM3) of the semiconductor integrated circuit according to Embodiment 11 of the present invention comprises an active power switch SW1, an N-channel MOS transistor MNI1, and a deep standby switch MNI2, arranged between the cell array source line arvss and the local power line vssm. The N-channel MOS transistor MNI1 and the deep standby switch MNI2 are coupled in series, and the present series coupling body is coupled with the active power switch SW1 in parallel.

<<Bias Circuit>>

As illustrated in FIG. 25, a bias circuit is coupled to the source line potential control circuit of each SRAM module of three SRAM modules (SRAM1, SRAM2, SRAM3) of the semiconductor integrated circuit according to Embodiment 11 of the present invention. The bias circuit comprises a resistor RN2, a P-channel MOS transistor MP_ICNT, and an N-channel MOS transistor MN_MIR, which are coupled in series between the power supply voltage Vdd and the local power line vssm.

In the bias circuit, a source of the P-channel MOS transistor MP_ICNT is coupled to the power supply voltage Vdd via the resistor RN2. A control signal ibiase is supplied to a control gate of the P-channel MOS transistor MP_ICNT, and a drain of the P-channel MOS transistor MP_ICNT is coupled to the N-channel MOS transistor MN_MIR. By coupling a drain and a control gate of the N-channel MOS transistor MN_MIR, the diode coupling of the N-channel MOS transistor MN_MIR is established. The diode coupling N-channel MOS transistor MN_MIR of the bias circuit and the N-channel MOS transistor MNI1 of the source line potential control circuit form a current mirror.

<<Active State>>

In an active state of the SRAM module illustrated in FIG. 25, the control signal cnt and the control signal rsb1 are set at a high level and a high level, respectively, and the power switch PWSW is set to an on state. Therefore, the local power line vssm is set at the ground potential Vss and the peripheral circuit power switch PESW is set to an on state; accordingly the peripheral circuit (peripheral) is set to an active state. Furthermore, the potential of the cell array source line arvss is set at the ground potential Vss due to the on state of the active power switch SW1, and the cell array (cell_array) is also set to an active state; accordingly, it is possible to execute write operation or read operation of the SRAM module illustrated in FIG. 25.

<<Standby State>>

In a standby state of the SRAM module illustrated in FIG. 25, the control signal ibiase is first set at a low level, and the P-channel MOS transistor MP_ICNT of the bias circuit is set to an on state. The control signal cnt, the control signal rsb1, and the control signal rs2 are set to a high level, a low level, and a high level, respectively; accordingly, the power switch PWSW is set to an on state, the peripheral circuit power switch PESW is set to an off state, the peripheral circuit (peripheral) is set in a standby state, and the deep standby switch MNI2 is set to an on state. Furthermore, the potential of the cell array source line arvss is set at a level a little higher than the ground potential Vss, by the operation of the current mirror which is formed by the diode coupling N-channel MOS transistor MN_MIR of the bias circuit and the N-channel MOS transistor MNI1 of the source line potential control circuit. Therefore, current of the cell array (cell_array) is reduced to such an extent that retained data of the cell array are not destroyed.

<<Deep Standby State>>

In a deep standby state of the SRAM module illustrated in FIG. 25, the control signal rsb1 and the control signal rs2 are set at a low level and a low level, respectively; accordingly, the peripheral circuit power switch PESW is set to an off state, and the deep standby switch MNI2 is set to an off state. Therefore, it is possible to reduce greatly the operating current of a cell array (cell_array) of the SRAM module.

Embodiment 12

<<A Configuration of a Semiconductor Integrated Circuit According to Embodiment 12>>

Figure 26:
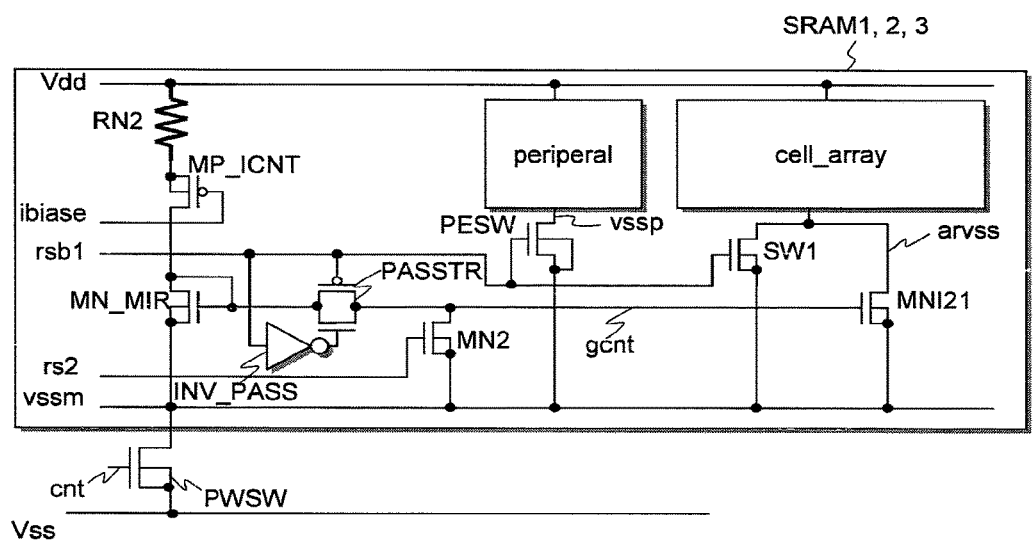
FIG. 26 is a drawing illustrating a configuration of each SRAM module of three SRAM modules (SRAM1, SRAM2, SRAM3) included in a semiconductor integrated circuit according to Embodiment 12 of the present invention.

FIG. 26 illustrates a configuration of each SRAM module of three SRAM modules (SRAM1, SRAM2, SRAM3) included in a semiconductor integrated circuit according to Embodiment 12 of the present invention.

In a semiconductor integrated circuit according to Embodiment 12 of the present invention, although not illustrated in FIG. 26 but as is the case with the semiconductor integrated circuit according to Embodiment 2 of the present invention illustrated in FIG. 11, the local power line of the logic circuit (logic) and the local power line of the first SRAM module (SRAM1) share the first local power line vssl21, and the local power line of the second SRAM module (SRAM2) and the local power line of the third SRAM module (SRAM3) share the second local power line vssm22. The first power switch PWSW21 coupled between the shared first local power line vssl21 and the ground potential Vss is shared by the logic circuit (logic) and the first SRAM module (SRAM1). Furthermore, the second power switch PWSW22 and the third power switch PWSW23, which are coupled between the shared second local power line vssm22 and the ground potential Vss, are shared by the second SRAM module (SRAM2) and the third SRAM module (SRAM3).

In the first SRAM module (SRAM1) of the semiconductor integrated circuit according to Embodiment 12 of the present invention, a peripheral circuit power switch PESW21 is coupled between the peripheral circuit (peripheral) and the first local power line vssl21, and a source line potential control circuit (to be explained below) is coupled between the cell array source line arvss21 of the cell array (cell_array) and the first local power line vssl21. Also in the second SRAM module (SRAM2), a peripheral circuit power switch PESW22 is coupled between the peripheral circuit (peripheral) and the second local power line vssm22, and a source line potential control circuit (to be explained below) is coupled between the cell array source line arvss22 of the cell array (cell_array) and the second local power line vssm22. Furthermore, also in the third SRAM module (SRAM3), a peripheral circuit power switch PESW23 is coupled between the peripheral circuit (peripheral) and the second local power line vssm22, and a source line potential control circuit (to be explained below) is coupled between the cell array source line arvss23 of the cell array (cell_array) and the second local power line vssm22. Furthermore, a bias circuit (to be explained below) is coupled to the source line potential control circuit.

<<The Source Line Potential Control Circuit and the Bias Circuit>>

As illustrated in FIG. 26, the source line potential control circuit of each SRAM module of three SRAM modules (SRAM1, SRAM2, SRAM3) of the semiconductor integrated circuit according to Embodiment 12 of the present invention comprises an active power switch SW1, an N-channel MOS transistor MNI21, a deep standby switch MN2, a CMOS transfer switch PASSTR, and a CMOS inverter INV_PASS, arranged between the cell array source line arvss and the local power line vssm. In the source line potential control circuit, the active power switch SW1 and the N-channel MOS transistor MNI21 are coupled in parallel between the cell array source line arvss and the local power line vssm. A drain-to-source path of the deep standby switch MN2 is coupled between a control gate of the N-channel MOS transistor MNI21 and the local power line vssm. The control signal rs2 is supplied at a control gate of the deep standby switch MN2.

As illustrated in FIG. 26, a bias circuit is coupled to the source line potential control circuit of each SRAM module of three SRAM modules (SRAM1, SRAM2, SRAM3) of the semiconductor integrated circuit according to Embodiment 12 of the present invention. The bias circuit comprises a resistor RN2, a P-channel MOS transistor MP_ICNT, and an N-channel MOS transistor MN_MIR, which are coupled in series between the power supply voltage Vdd and the local power line vssm.

In the bias circuit, a source of the P-channel MOS transistor MP_ICNT is coupled to the power supply voltage Vdd via the resistor RN2. The control signal ibiase is supplied to a control gate of the P-channel MOS transistor MP_ICNT, and a drain of the P-channel MOS transistor MP_ICNT is coupled to the N-channel MOS transistor MN_MIR. By coupling a drain and a control gate of the N-channel MOS transistor MN_MIR, the diode coupling of the N-channel MOS transistor MN_MIR is established. The diode coupling N-channel MOS transistor MN_MIR of the bias circuit and the N-channel MOS transistor MNI21 of the source line potential control circuit are coupled via a drain-to-source path of parallel-coupled P-channel MOS transistor and N-channel MOS transistor serving as the CMOS transfer switch PASSTR. The control signal rsb1 is supplied to a control gate of the P-channel MOS transistor of the CMOS transfer switch PASSTR and to an input terminal of the CMOS inverter INV_PASS, and an output signal of the CMOS inverter INV_PASS is supplied to a control gate of the N-channel MOS transistor of the CMOS transfer switch PASSTR. In a standby state, the control signal rsb1 is set at a low level, and the parallel-coupled P-channel MOS transistor and N-channel MOS transistor of the CMOS transfer switch PASSTR are both set to an on state; accordingly, the diode coupling N-channel MOS transistor MN_MIR of the bias circuit and the N-channel MOS transistor MNI21 of the source line potential control circuit form a current mirror.

<<Active State>>

In an active state of the SRAM module illustrated in FIG. 26, the control signal cnt and the control signal rsb1 are set at a high level and a high level, respectively, and the power switch PWSW is set to an on state. Therefore, the local power line vssm is set at the ground potential Vss, and the peripheral circuit power switch PESW is also set to an on state; accordingly, the peripheral circuit (peripheral) is set to an active state. Furthermore, the potential of the cell array source line arvss is set at the ground potential Vss due to the on state of the active power switch SW1, and the cell array (cell_array) is also set to an active state; accordingly, it becomes possible to execute write operation or read operation of the SRAM module illustrated in FIG. 26.

<<Standby State>>

In a standby state of the SRAM module illustrated in FIG. 26, the control signal ibiase is first set at a low level, and the P-channel MOS transistor MP_ICNT of the bias circuit is set to an on state. The control signal cnt, the control signal rsb1, and the control signal rs2 are set to a high level, a low level, and a low level, respectively; accordingly, the power switch PWSW is set to an on state, the peripheral circuit power switch PESW is set to an off state, the peripheral circuit (peripheral) is set in a standby state, and the active power switch SW1 is set to an off state. Furthermore, the potential of the cell array source line arvss is set at a level a little higher than the ground potential Vss, by the operation of the current mirror which is formed by the diode coupling N-channel MOS transistor MN_MIR of the bias circuit and the N-channel MOS transistor MNI21 of the source line potential control circuit. Therefore, current of the cell array (cell_array) is reduced to such an extent that retained data of the cell array are not destroyed.

<<Deep Standby State>>

In a deep standby state of the SRAM module illustrated in FIG. 26, the control signal ibiase is set at a high level, and the control signal rsb1 and the control signal rs2 are set at a low level and a high level, respectively; accordingly, the peripheral circuit power switch PESW is set to an off state, the bias circuit is set to an off state, the deep standby switch MN2 is set to an on state, and the N-channel MOS transistor MNI21 is set to an off state. Therefore, it is possible to reduce greatly the operating current of a cell array (cell_array) of the SRAM module.

Embodiment 13

<<A Configuration of a Semiconductor Integrated Circuit According to Embodiment 13>>

Figure 27:
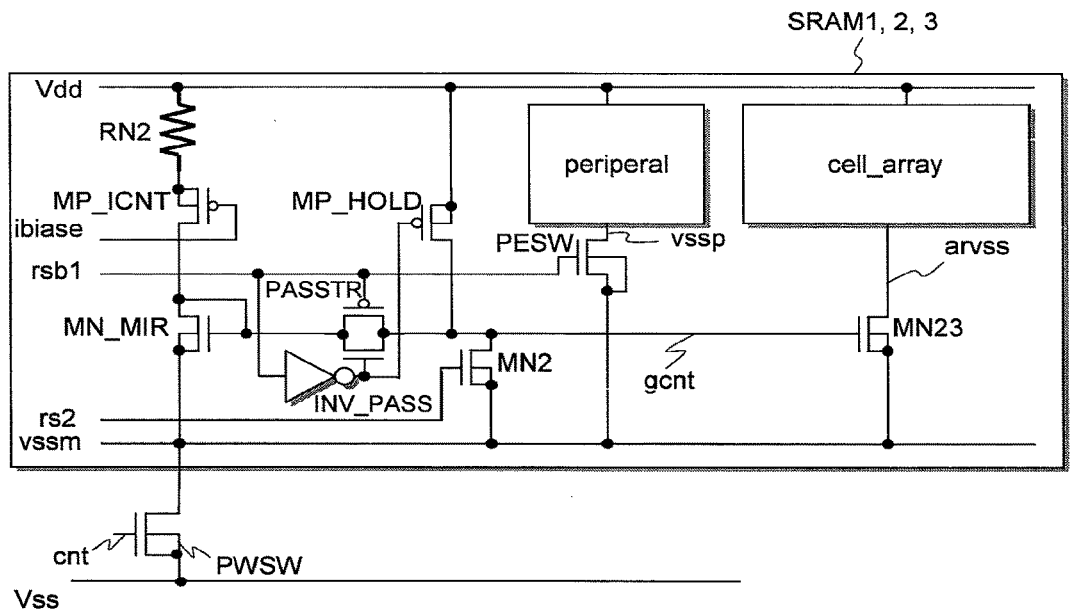
FIG. 27 is a drawing illustrating a configuration of each SRAM module of three SRAM modules (SRAM1, SRAM2, SRAM3) included in a semiconductor integrated circuit according to Embodiment 13 of the present invention.

FIG. 27 illustrates a configuration of each SRAM module of three SRAM modules (SRAM1, SRAM2, SRAM3) included in a semiconductor integrated circuit according to Embodiment 13 of the present invention.

A semiconductor integrated circuit according to Embodiment 13 of the present invention illustrated in FIG. 27 is different from the semiconductor integrated circuit according to Embodiment 12 of the present invention illustrated in FIG. 26 only in the following points.

The first different point is that the parallel coupling of the active power switch SW1 and the N-channel MOS transistor MNI21 of the source line potential control circuit of the semiconductor integrated circuit according to Embodiment 12 of the present invention, illustrated in FIG. 26, is replaced by a single N-channel MOS transistor MN23 in the source line potential control circuit of the semiconductor integrated circuit according to Embodiment 13 of the present invention, illustrated in FIG. 27.

Furthermore, the second different point is that a P-channel MOS transistor MP_HOLD is added to the source line potential control circuit of the semiconductor integrated circuit according to Embodiment 13 of the present invention illustrated in FIG. 27, and that a source and a control gate and a drain of the P-channel MOS transistor MP_HOLD are coupled to the power supply voltage Vdd, the control signal rsb1, and a control gate of the N-channel MOS transistor MN23, respectively.

<<Active State>>

In an active state of the SRAM module illustrated in FIG. 27, the control signal cnt and the control signal rsb1 are set at a high level and a high level, respectively, and the power switch PWSW is set to an on state. Therefore, the local power line vssm is set at the ground potential Vss and the peripheral circuit power switch PESW is set to an on state; accordingly the peripheral circuit (peripheral) is set to an active state. Furthermore, by the control signal rsb1 set at a high level, the output signal of the CMOS inverter INV_PASS is set at a low level, and the P-channel MOS transistor MP_HOLD and the N-channel MOS transistor MN23 are set to an on state. As the result, the potential of the cell array source line arvss is set at the ground potential Vss, and the cell array (cell_array) is also set to an active state; accordingly, it is possible to execute write operation or read operation of the SRAM module illustrated in FIG. 27.

<<Standby State>>

In a standby state of the SRAM module illustrated in FIG. 27, the control signal ibiase is first set at a low level, and the P-channel MOS transistor MP_ICNT of the bias circuit is set to an on state. The control signal cnt, the control signal rsb1, and the control signal rs2 are set co a high level, a low level, and a low level, respectively; accordingly, the power switch PWSW is set to an on state, the peripheral circuit power switch PESW is set to an off state, and the peripheral circuit (peripheral) is set in a standby state. By the control signal rsb1 set at a low level, an output signal of the CMOS inverter INV_PASS is set at a high level, the P-channel MOS transistor MP_HOLD is set to an off state, and the parallel-coupled P-channel MOS transistor and N-channel MOS transistor of the CMOS transfer switch PASSTR are both set to an on state. Therefore, the potential of the cell array source line arvss is set at a level a little higher than the ground potential Vss, by the operation of the current mirror which is formed by the diode coupling N-channel MOS transistor MN_MIR of the bias circuit and the N-channel MOS transistor MNI23 of the source line potential control circuit. Therefore, current of the cell array (cell_array) is reduced to such an extent that retained data of the cell array are not destroyed.

<<Deep Standby State>>

In a deep standby state of the SRAM module illustrated in FIG. 27, the control signal ibiase is set at a high level, the control signal rsb1 and the control signal rs2 are set at a low level and a high level, respectively; accordingly, the peripheral circuit power switch PESW is set to an off state, the bias circuit is set to an off state, the deep standby switch MN2 is set to an on state, and the N-channel MOS transistor MNI23 is set to an off state. Therefore, it is possible to reduce greatly the operating current of a cell array (cell_array) of the SRAM module.

Embodiment 14

<<A Configuration of a Semiconductor Integrated Circuit According to Embodiment 14>>

Figure 28:
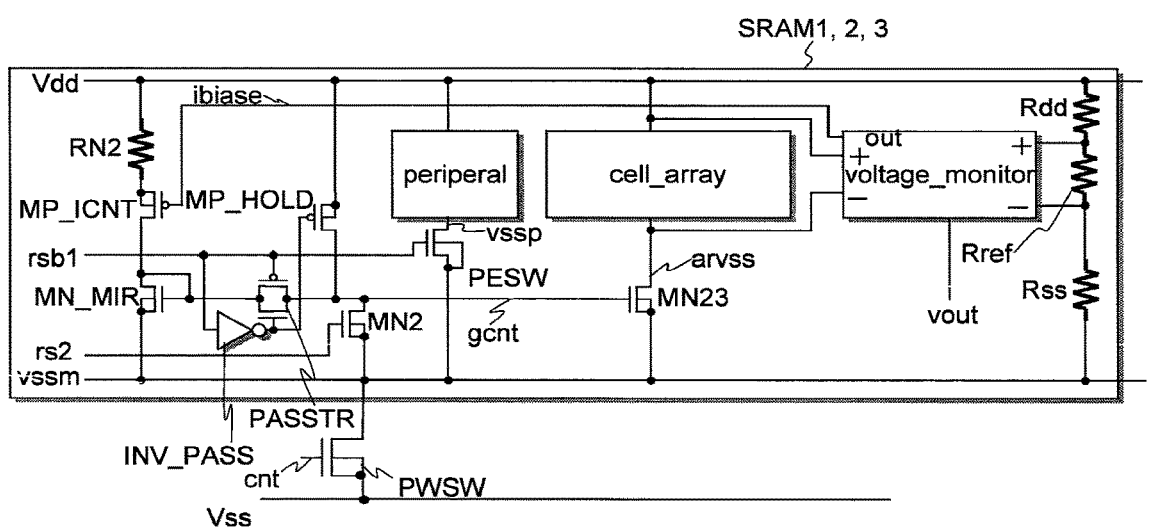
FIG. 28 is a drawing illustrating a configuration of each SRAM module of three SRAM modules (SRAM1, SRAM2, SRAM3) included in a semiconductor integrated circuit according to Embodiment 14 of the present invention.

FIG. 28 illustrates a configuration of each SRAM module of three SRAM modules (SRAM1, SRAM2, SRAM3) included in a semiconductor integrated circuit according to Embodiment 14 of the present invention.

A semiconductor integrated circuit according to Embodiment 14 of the present invention illustrated in FIG. 28 is different from the semiconductor integrated circuit according to Embodiment 13 of the present invention illustrated in FIG. 27 only in the following point.

That is, the difference is that a voltage monitoring circuit (voltage_monitor) and a voltage divider circuit (Rdd, Rref, Rss) are added in a source line potential control circuit of the semiconductor integrated circuit according to Embodiment 14 of the present invention illustrated in FIG. 28.

Three voltage dividing resistors Rdd, Rref, and Rss of the voltage divider circuit are coupled in series between the power supply voltage Vdd and the local power line vssm, and the potential difference across the middle voltage dividing resistor Rref is supplied to one difference input terminal of the voltage monitoring circuit (voltage_monitor). The potential difference between the power supply voltage Vdd of the cell array (cell_array) and the cell array source line arvss is supplied to another difference input terminal of the voltage monitoring circuit (voltage_monitor).

Therefore, the voltage monitoring circuit (voltage_monitor) in a standby state compares the potential difference between the power supply voltage Vdd of the cell array (cell_array) and the cell array source line arvss with the potential difference of the middle voltage dividing resistor Rref, and controls a voltage level of the control signal ibiase supplied to the control gate of the P-channel MOS transistor MP_ICNT of the bias circuit, so that both the potential differences agree with each other. That is, the output control signal ibiase generated from a comparison output terminal (out) of the voltage monitoring circuit (voltage_monitor) is supplied to a control gate of the P-channel MOS transistor MP_ICNT of the bias circuit.

Furthermore, the voltage monitoring circuit (voltage_monitor) can also detect a short-circuit state between the power supply voltage Vdd and the cell array source line arvss of the cell array (cell_array). In the short-circuit state, the potential difference between the power supply voltage Vdd and the cell array source line arvss of the cell array (cell_array) falls more markedly than the potential difference of the middle voltage dividing resistor Rref. A detection result of the short-circuit state can be generated from another output terminal Vout of the voltage monitoring circuit (voltage_monitor).

Embodiment 15

<<A Configuration of a Semiconductor Integrated Circuit According to Embodiment 15>>

Figure 29:
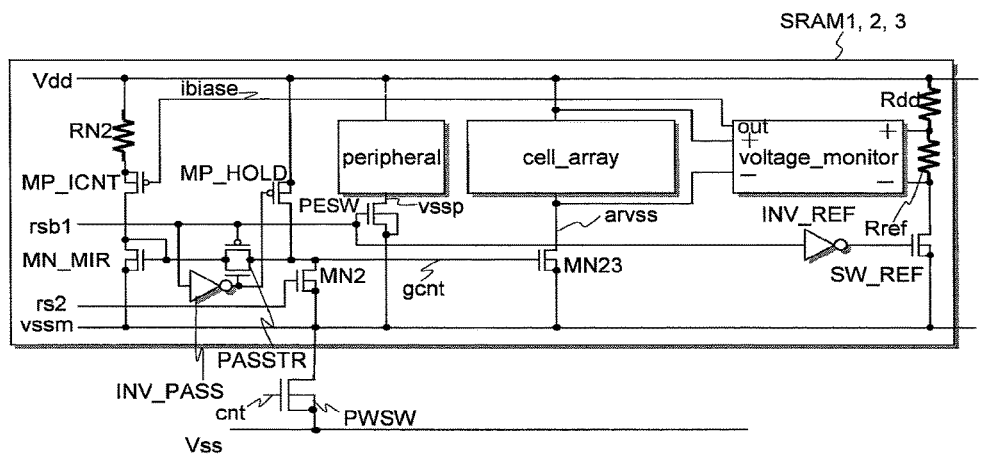
FIG. 29 is a drawing illustrating a configuration of each SRAM module of three SRAM modules (SRAM1, SRAM2, SRAM3) included in a semiconductor integrated circuit according to Embodiment 15 of the present invention.

FIG. 29 illustrates a configuration of each SRAM module of three SRAM modules (SRAM1, SRAM2, SRAM3) included in a semiconductor integrated circuit according to Embodiment 15 of the present invention.

A semiconductor integrated circuit according to Embodiment 15 of the present invention illustrated in FIG. 29 is different from the semiconductor integrated circuit according to Embodiment 14 of the present invention illustrated in FIG. 28 only in the following point.

That is, the difference is that, in a source line potential control circuit of the semiconductor integrated circuit according to Embodiment 15 of the present invention illustrated in FIG. 29, the bottom voltage dividing resistor Rss of the voltage divider circuit of the source line potential control circuit of the semiconductor integrated circuit according to Embodiment 14 of the present invention illustrated in FIG. 28 is replaced by an N-channel MOS transistor SW_REF and a CMOS inverter INV_REF.

That is, in the source line potential control circuit of the semiconductor integrated circuit according to Embodiment 15 of the present invention illustrated in FIG. 29, a drain-to-source path of the N-channel MOS transistor SW_REF is coupled between the middle voltage dividing resistor Rref of the voltage divider circuit and the local power line vssm. A control gate of the N-channel MOS transistor SW_REF is coupled to an output terminal of the CMOS inverter INV_REF, and the control signal rsb1 is supplied to the input terminal of the CMOS inverter INV_REF.

Therefore, in an active state of the SRAM module illustrated in FIG. 29, the control signal rsb1 is set at a high level, and the N-channel MOS transistor SW_REF is set to an off state; accordingly, the consumption current of the voltage divider circuit is reduced. In a standby state and a deep standby state, the control signal rsb1 is set at a low level, and the N-channel MOS transistor SW_REF is set to an on state; accordingly, the operating current is supplied to the middle voltage dividing resistor Rref of the voltage divider circuit.

Embodiment 16

<<A Configuration of a Semiconductor Integrated Circuit According to Embodiment 16>>

Figure 30:
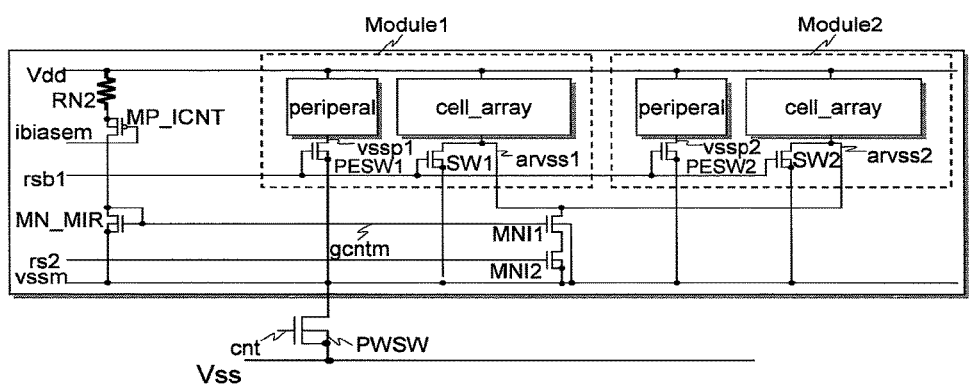
FIG. 30 is a drawing illustrating a configuration of each SRAM module of three SRAM modules (SRAM1, SRAM2, SRAM3) included in a semiconductor integrated circuit according to Embodiment 16 of the present invention.

FIG. 30 illustrates a configuration of each SRAM module of three SRAM modules (SRAM1, SRAM2, SRAM3) included in a semiconductor integrated circuit according to Embodiment 16 of the present invention.

A semiconductor integrated circuit according to Embodiment 16 of the present invention illustrated in FIG. 30 is different from the semiconductor integrated circuit according to Embodiment 11 of the present invention illustrated in FIG. 25 only in the following point.

That is, the difference is that, in the semiconductor integrated circuit according to Embodiment 16 of the present invention illustrated in FIG. 30, the bias circuit comprising the resistor RN2, the P-channel MOS transistor MP_ICNT, and the N-channel MOS transistor MN_MIR, which are coupled in series between the power supply voltage Vdd and the local power line vssm, is shared by plural source line potential control circuits of plural SRAM modules Module1 and Module2. The plural SRAM modules Module1 and Module2 may be the first and the second SRAM module (SRAM1, SRAM2), the second and the third SRAM module (SRAM2, SRAM3), or the first and the third SRAM module (SRAM1, SRAM3).

In the semiconductor integrated circuit according to Embodiment 16 of the present invention illustrated in FIG. 30, an N-channel MOS transistor MNI1 and a deep standby switch MNI2 are coupled in series between the local power line vssm and plural cell array source line arvss1 and arvss2 of plural cell arrays (cell_array) of the plural SRAM modules Module1 and Module2. The series-coupled N-channel MOS transistor MNI1 and deep standby switch MNI2 are shared by the plural source line potential control circuits of the plural cell arrays (cell_array) of the plural SRAM modules Module1 and Module2. A control gate of the shared N-channel MOS transistor MNI1 is coupled to the N-channel MOS transistor MN_MIR of the bias circuit in the form of a current mirror. In this way, in the semiconductor integrated circuit according to Embodiment 16 of the present invention illustrated in FIG. 30, the bias circuit is shared by the plural SRAM modules. Therefore, it is possible to reduce the number of bias circuits and the bias current.

Embodiment 17

<<A Configuration of a Semiconductor Integrated Circuit According to Embodiment 17>>

Figure 31:
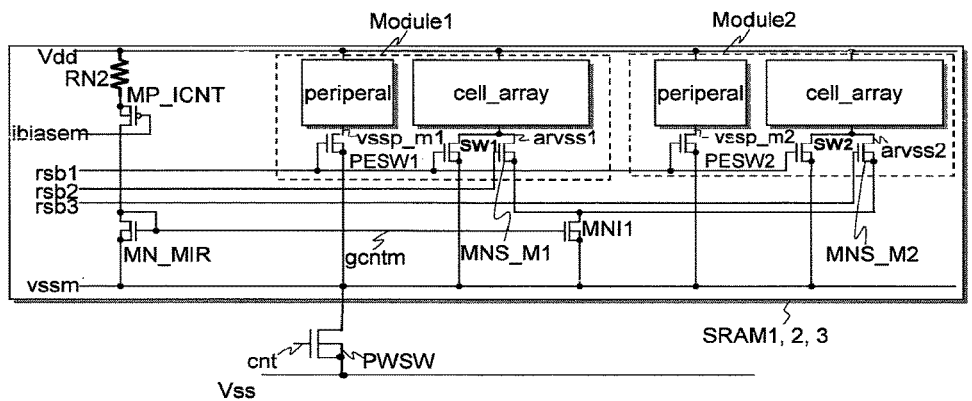
FIG. 31 is a drawing illustrating a configuration of each SRAM module of three SRAM modules (SRAM1, SRAM2, SRAM3) included in a semiconductor integrated circuit according to Embodiment 17 of the present invention.

FIG. 31 illustrates a configuration of each SRAM module of three SRAM modules (SRAM1, SRAM2, SRAM3) included in a semiconductor integrated circuit according to Embodiment 17 of the present invention.

A semiconductor integrated circuit according to Embodiment 17 of the present invention illustrated in FIG. 31 is different from the semiconductor integrated circuit according to Embodiment 16 of the present invention illustrated in FIG. 30 only in the following points.

The first difference is that, in a source line potential control circuit of the semiconductor integrated circuit according to Embodiment 17 of the present invention illustrated in FIG. 31, the deep standby switch MNI2 of the source line potential control circuit illustrated in FIG. 30 is deleted and the source of the N-channel MOS transistor MNI1 is directly coupled to the local power line vssm.

The second difference is that, in the semiconductor integrated circuit according to Embodiment 17 of the present invention illustrated in FIG. 31, a drain-to-source path of a first deep standby switch MNS_M1 is coupled between the cell array source line arvss1 of the cell array (cell_array) of the first SRAM module Module1 and the drain of the N-channel MOS transistor MNI1, and that a drain-to-source path of a second deep standby switch MNS_M2 is coupled between the cell array source line arvss2 of the cell array (cell_array) of the second SRAM module Module2 and the drain of the N-channel MOS transistor MNI1.

In a deep standby state of the first SRAM module Module1, a control signal rsb2 is set at a low level, and the first deep standby switch MNS_M1 coupled between the cell array source line arvss1 of the cell array (cell_array) of the first SRAM module Module1 and the drain of the N-channel MOS transistor MNI1 is set to an off state. In a deep standby state of the second SRAM module Module2, a control signal rsb3 is set at a low level, and the second deep standby switch MNS_M2 coupled between the cell array source line arvss2 of the cell array (cell_array) of the second SRAM module Module2 and the drain of the N-channel MOS transistor MNI1 is set to an off state.

Embodiment 18

<<A Configuration of a Semiconductor Integrated Circuit According to Embodiment 18>>

Figure 32:
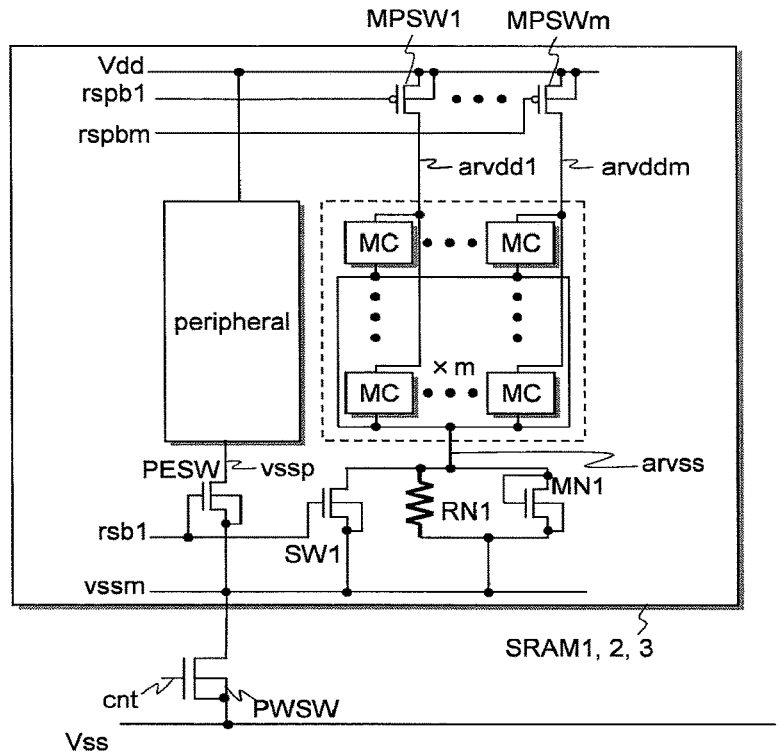
FIG. 32 is a drawing illustrating a configuration of each SRAM module of three SRAM modules (SRAM1, SRAM2, SRAM3) included in a semiconductor integrated circuit according to Embodiment 18 of the present invention.

FIG. 32 illustrates a configuration of each SRAM module of three SRAM modules (SRAM1, SRAM2, SRAM3) included in a semiconductor integrated circuit according to Embodiment 18 of the present invention.

A semiconductor integrated circuit according to Embodiment 18 of the present invention illustrated in FIG. 32 is different from the semiconductor integrated circuit according to Embodiment 3 of the present invention illustrated in FIG. 14 only in the following points.

The first difference is that the deep standby switch which comprises a P-channel MOS transistor coupled between the power supply voltage Vdd and the cell array (cell_array) in FIG. 14 comprises plural P-channel MOS transistors MPSW1, - - - , MPSWm in FIG. 32.

The second difference is that the plural P-channel MOS transistors MPSW1, - - - , MPSWm of the deep standby switch are respectively coupled to plural cell array source lines arvdd1, - - -, arvddm, which are arranged in the column direction (in the direction of a complementary bit-line pair) of the cell array (cell_array). Each cell array source line of the plural cell array source lines arvdd1, - - -, arvddm is coupled with each of plural memory cells (MC) arranged in the column direction (in the direction of the complementary bit-line pair) of the cell array (cell_array).

The third difference is that plural control signals rspb1, - - -, rspbm are supplied to the control gates of the plural P-channel MOS transistors MPSW1, - - -, MPSWm.

The standby current of all the memory cells (MC) included in one cell array (cell_array) can be restricted by one resistor RN1 and one diode coupling MOS transistor MN1 of the source line potential control circuit.

In a deep standby state, by a control signal set at a high level among the plural control signals rspb1, - - -, rspbm, it is possible to cut off the current of a memory cell (MC) of a cell array source line which is coupled to a P-channel MOS transistor in an off state among the plural P-channel MOS transistors MPSW1, - - -, MPSWm.

Embodiment 19

<<A Configuration of a Semiconductor Integrated Circuit According to Embodiment 19>>

Figure 33:
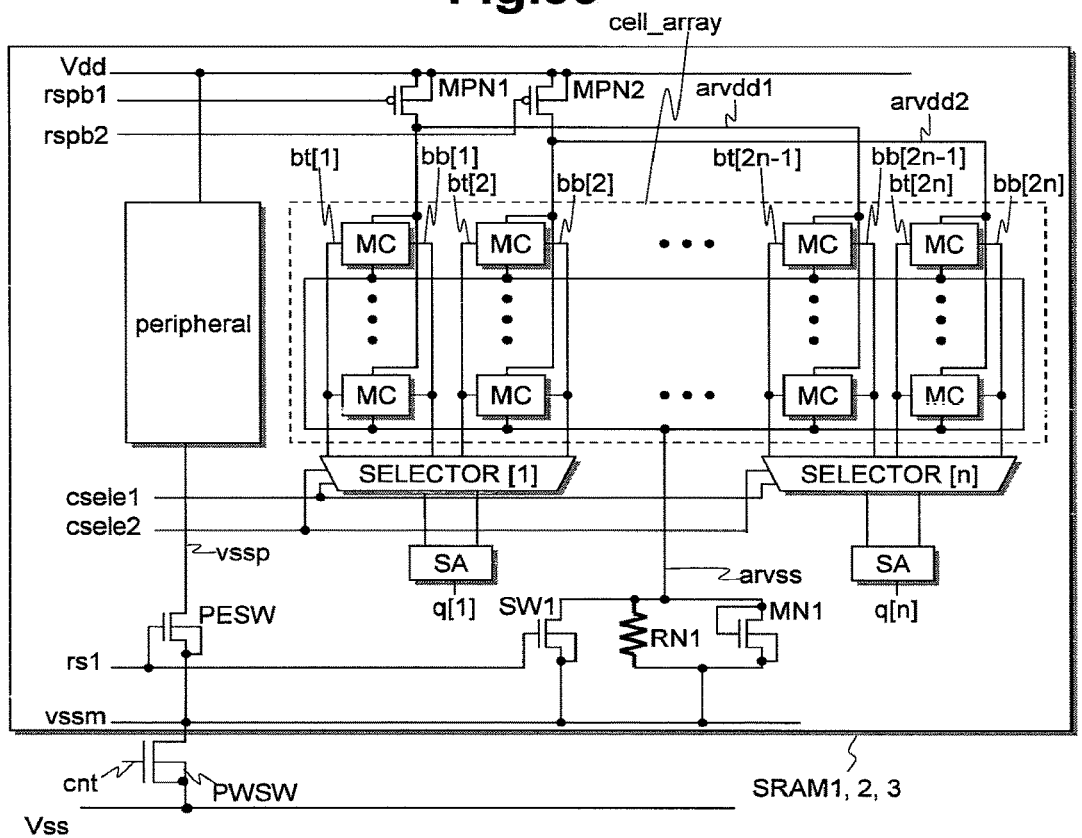
FIG. 33 is a drawing illustrating a configuration of each SRAM module of three SRAM modules (SRAM1, SRAM2, SRAM3) included in a semiconductor integrated circuit according to Embodiment 19 of the present invention.

FIG. 33 illustrates a configuration of each SRAM module of three SRAM modules (SRAM1, SRAM2, SRAM3) included in a semiconductor integrated circuit according to Embodiment 19 of the present invention.

A semiconductor integrated circuit according to Embodiment 19 of the present invention illustrated in FIG. 33 is different from the semiconductor integrated circuit according to Embodiment 18 of the present invention illustrated in FIG. 32 only in the following point.

That is, the difference is that each SRAM module of the semiconductor integrated circuit according to Embodiment 19 of the present invention illustrated in FIG. 33 adopts a two-column multiplex system, as is the case with each SRAM module of the semiconductor integrated circuit according to Embodiment 1 of the present invention illustrated in FIG. 7. Therefore, in each SRAM module illustrated in FIG. 33, two pairs of complementary bit-line pairs are coupled to each selector (SELECTOR[1], - - -, SELECTOR[n]).

A drain-to-source path of a first P-channel MOS transistor MPSW1 of the deep standby switch, to the control gate of which the first control signal rspb1 is supplied, is coupled between the power supply voltage Vdd and the first cell array source line arvdd1 of a memory cell (MC) which is coupled to the left-hand first complementary bit-line pair coupled to each selector (SELECTOR[1], - - -, SELECTOR[n]). When the first control signal rspb1 is set at a low level, the first P-channel MOS transistor MPSW1 is set to an on state, and when the first control signal rspb1 is set at a high level, the first P-channel MOS transistor MPSW1 is set to an off state. In addition, a drain-to-source path of a second P-channel MOS transistor MPSW2 of the deep standby switch, to the control gate of which the second control signal rspb2 is supplied, is coupled between the power supply voltage Vdd and the second cell array source line arvdd2 of a memory cell (MC) which is coupled to the right-hand second complementary bit-line pair coupled to each selector (SELECTOR[1], - - -, SELECTOR[n]). When the second control signal rspb2 is set at a low level, the second P-channel MOS transistor MPSW2 is set to an on state, and when the second control signal rspb2 is set at a high level, the second P-channel MOS transistor MPSW2 is set to an off state.

However, even in Embodiment 19 of the present invention illustrated in FIG. 33, as is the case with Embodiment 18 of the present invention illustrated in FIG. 32, the standby current of all the memory cells (MC) included in one cell array (cell_array) can be restricted by one resistor RN1 and one diode coupling MOS transistor MN1 of the source line potential control circuit.

Embodiment 20

<<A Configuration of a Semiconductor Integrated Circuit According to Embodiment 20>>

Figure 34:
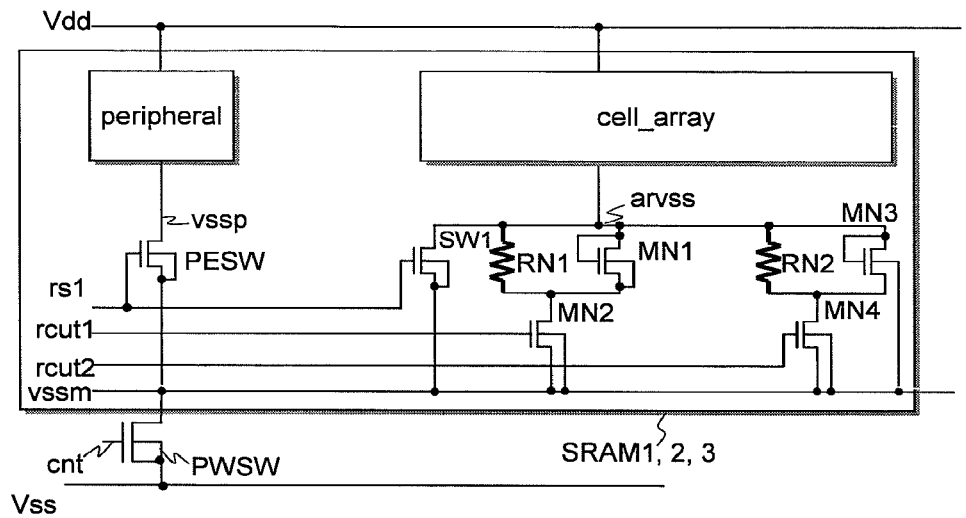
FIG. 34 is a drawing illustrating a configuration of each SRAM module of three SRAM modules (SRAM1, SRAM2, SRAM3) included in a semiconductor integrated circuit according to Embodiment 20 of the present invention.

FIG. 34 illustrates a configuration of each SRAM module of three SRAM modules (SRAM1, SRAM2, SRAM3) included in a semiconductor integrated circuit according to Embodiment 20 of the present invention.

In a semiconductor integrated circuit according to Embodiment 20 of the present invention, although not illustrated in FIG. 34 but as is the case with the semiconductor integrated circuit according to Embodiment 2 of the present invention illustrated in FIG. 11, the local power line of the logic circuit (logic) and the local power line of the first SRAM module (SRAM1) share the first local power line vssl21, and the local power line of the second SRAM module (SRAM2) and the local power line of the third SRAM module (SRAM3) share the second local power line vssm22. The first power switch PWSW21 coupled between the shared first local power line vssl21 and the ground potential Vss is shared by the logic circuit (logic) and the first SRAM module (SRAM1). Furthermore, the second power switch PWSW22 and the third power switch PWSW23, which are coupled between the shared second local power line vssm22 and the ground potential Vss, are shared by the second SRAM module (SRAM2) and the third SRAM module (SRAM3).

In the first SRAM module (SRAM1) of the semiconductor integrated circuit according to Embodiment 20 of the present invention, a peripheral circuit power switch PESW21 is coupled between the peripheral circuit (peripheral) and the first local power line vssl21, and a source line potential control circuit (to be explained below) is coupled between the cell array source line arvss21 of the cell array (cell_array) and the first local power line vssl21. Also in the second SRAM module (SRAM2), a peripheral circuit power switch PESW22 is coupled between the peripheral circuit (peripheral) and the second local power line vssm22, and a source line potential control circuit (to be explained below) is coupled between the cell array source line arvss22 of the cell array (cell_array) and the second local power line vssm22. Furthermore, also in the third SRAM module (SRAM3), a peripheral circuit power switch PESW23 is coupled between the peripheral circuit (peripheral) and the second local power line vssm22, and a source line potential control circuit (to be explained below) is coupled between the cell array source line arvss23 of the cell array (cell_array) and the second local power line vssm22.

<<Source Line Potential Control Circuit>>

As illustrated in FIG. 34, the source line potential control circuit of each SRAM module of three SRAM modules (SRAM1, SRAM2, SRAM3) of the semiconductor integrated circuit according to Embodiment 20 of the present invention comprises a first source line potential control circuit and a second source line potential control circuit.

The first source line potential control circuit comprises a resistor RN1, a diode coupling N-channel MOS transistor MN1, and a deep standby switch MN2, arranged between the cell array source line arvss and the local power line vssm. A parallel coupling body of the resistor RN1 and the diode coupling N-channel MOS transistor MN1 is coupled with the deep standby switch MN2 in series. A deep standby control signal rcut1 is supplied to a control gate of the deep standby switch MN2. In a deep standby state, the deep standby control signal rcut1 is set at a low level, and the deep standby switch MN2 is set to an off state. A P-well of the diode coupling N-channel MOS transistor MN1 is coupled to a source.

The second source line potential control circuit comprises a resistor RN2, a diode coupling N-channel MOS transistor MN3, and a deep standby switch MN4, arranged between the cell array source line arvss and the local power line vssm. A parallel coupling body of the resistor RN2 and the diode coupling N-channel MOS transistor MN3 is coupled with the deep standby switch MN4 in series. A deep standby control signal rcut2 is supplied to a control gate of the deep standby switch MN4. In a deep standby state, the deep standby control signal rcut2 is set at a low level, and the deep standby switch MN4 is set to an off state. A P-well of the diode coupling N-channel MOS transistor MN3 is coupled to the local power line Vssm.

Embodiment 21

<<A Configuration of a Semiconductor Integrated Circuit According to Embodiment 21>>

Figure 35:
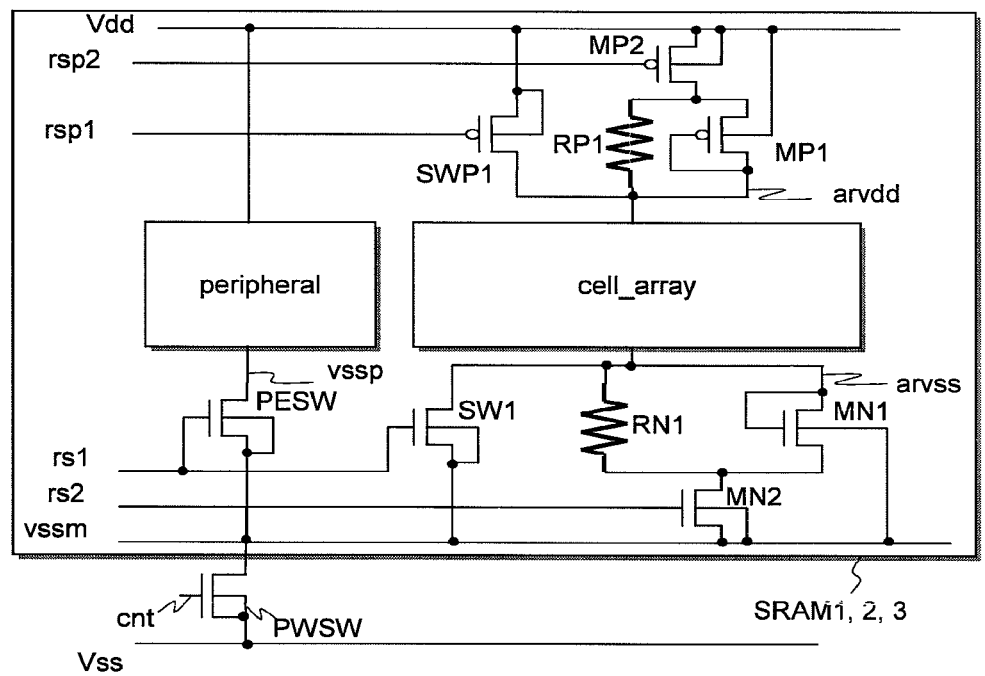
FIG. 35 is a drawing illustrating a configuration of each SRAM module of three SRAM modules (SRAM1, SRAM2, SRAM3) included in a semiconductor integrated circuit according to Embodiment 21 of the present invention.

FIG. 35 illustrates a configuration of each SRAM module of three SRAM modules (SRAM1, SRAM2, SRAM3) included in a semiconductor integrated circuit according to Embodiment 21 of the present invention.

In a semiconductor integrated circuit according to Embodiment 21 of the present invention, although not illustrated in FIG. 35 but as is the case with the semiconductor integrated circuit according to Embodiment 2 of the present invention illustrated in FIG. 11, the local power line of the logic circuit (logic) and the local power line of the first SRAM module (SRAM1) share the first local power line vssl21, and the local power line of the second SRAM module (SRAM2) and the local power line of the third SRAM module (SRAM3) share the second local power line vssm22. The first power switch PWSW21 coupled between the shared first local power line vssl21 and the ground potential Vss is shared by the logic circuit (logic) and the first SRAM module (SRAM1). Furthermore, the second power switch PWSW22 and the third power switch PWSW23, which are coupled between the shared second local power line vssm22 and the ground potential Vss, are shared by the second SRAM module (SRAM2) and the third SRAM module (SRAM3).

In the first SRAM module (SRAM1) of the semiconductor integrated circuit according to Embodiment 21 of the present invention illustrated in FIG. 35, a peripheral circuit power switch PESW21 is coupled between the peripheral circuit (peripheral) and the first local power line vssl21, and an active power switch SW21 and a ground-side source line potential control circuit (to be explained below) are coupled between the cell array source line arvss21 of the cell array (cell_array) and the first local power line vssl21. Also in the second SRAM module (SRAM2), a peripheral circuit power switch PESW22 is coupled between the peripheral circuit (peripheral) and the second local power line vssm22, and an active power switch SW22 and a ground-side source line potential control circuit (to be explained below) are coupled between the cell array source line arvss22 of the cell array (cell_array) and the second local power line vssm22. Furthermore, also in the third SRAM module (SRAM3), a peripheral circuit power switch PESW23 is coupled between the peripheral circuit (peripheral) and the second local power line vssm22, and an active power switch SW23 and a ground-side source line potential control circuit (to be explained below) are coupled between the cell array source line arvss23 of the cell array (cell_array) and the second local power line vssm22.

Furthermore, in the first SRAM module (SRAM1) of the semiconductor integrated circuit according to Embodiment 21 of the present invention illustrated in FIG. 35, an active power switch SWP21 and a power-supply-side source line potential control circuit (to be explained below) are coupled between the cell array source line arvdd21 of the cell array (cell_array) and the power supply voltage Vdd. Also in the second SRAM module (SRAM2), an active power switch SWP22 and a power-supply-side source line potential control circuit (to be explained below) are coupled between the cell array source line arvdd22 of the cell array (cell_array) and the power supply voltage Vdd. Furthermore, also in the third SRAM module (SRAM3), an active power switch SWP23 and a power-supply-side source line potential control circuit (to be explained below) are coupled between the cell array source line arvdd23 of the cell array (cell_array) and the power supply voltage Vdd.

<<The Source Line Potential Control Circuit on the Ground Side>>

As illustrated in FIG. 35, the source line potential control circuit on the ground side of each SRAM module of three SRAM modules (SRAM1, SRAM2, SRAM3) of the semiconductor integrated circuit according to Embodiment 21 of the present invention comprises a resistor RN1, a diode coupling N-channel MOS transistor MN1, and a deep standby switch MN2, arranged between the cell array source line arvss and the local power line vssm. A parallel coupling body of the resistor RN1 and the diode coupling N-channel MOS transistor MN1 is coupled with the deep standby switch MN2 in series. A control signal rs2 is supplied to a control gate of the deep standby switch MN2. In a deep standby state, the control signal rs2 is set at a low level, and the deep standby switch MN2 is set to an off state. A P-well of the diode coupling N-channel MOS transistor MN1 is coupled to the local power line vssm.

<<A Source Line Potential Control Circuit on the Power Supply Side>>

As illustrated in FIG. 35, the source line potential control circuit on the power supply side of each SRAM module of three SRAM modules (SRAM1, SRAM2, SRAM3) of the semiconductor integrated circuit according to Embodiment 21 of the present invention comprises a resistor RP1, a diode coupling P-channel MOS transistor MP1, and a deep standby switch MP2, arranged between the cell array source line arvdd and the power supply voltage Vdd. A parallel coupling body of the resistor RP1 and the diode coupling P-channel MOS transistor MP1 is coupled with the deep standby switch MP2 in series. A control signal rsp2 is supplied to a control gate of the deep standby switch MP2. In a deep standby state, the control signal rsp2 is set at a high level, and the deep standby switch MP2 is set to an off state. An N-well of the diode coupling P-channel MOS transistor MP1 is coupled to the power supply voltage Vdd.

<<Active State>>

In an active state of the SRAM module illustrated in FIG. 35, the control signal cnt, the control signal rs1, the control signal rs2, the control signal rsp1, and the control signal rsp2 are set at a high level, a high level, a high level, a low level, and a low level, respectively.

Therefore, the power switch PWSW, the peripheral circuit power switch PESW21, and the active power switches SW1 and SWP1 are set to an on state, the deep standby switch MN2 of the source line potential control circuit on the ground side is set to an on state, and the deep standby switch MP2 of the source line potential control circuit on the power supply side is set to an on state.

Therefore, the local power line vssm is set at the ground potential Vss and the peripheral circuit power switch PESW is set to an on state; accordingly, the peripheral circuit (peripheral) is set to an active state. Furthermore, the potential of the power-source-side cell array source line arvdd is set at the power supply voltage Vdd, the potential of the ground-side cell array source line arvss is set at the ground potential Vss, and the cell array (cell_array) is also set to an active state; accordingly, it is possible to execute write operation or read operation of the SRAM module illustrated in FIG. 35.

<<Standby State>>

In a standby state of the SRAM module illustrated in FIG. 35, the control signal cnt, the control signal rs1, the control signal rs2, the control signal rsp1, and the control signal rsp2 are set at a high level, a low level, a high level, a high level, and a low level, respectively.

Therefore, the power switch PWSW, the peripheral circuit power switch PESW21, and the active power switches SW1 and SWP1 are set to an off state; accordingly, the peripheral circuit (peripheral) is set in a standby state. The deep standby switch MN2 of the source line potential control circuit on the ground side is set to an on state, and the deep standby switch MP2 of the source line potential control circuit of the power supply side is set to an on state. Furthermore, in the source line potential control circuit on the ground side, the potential of the cell array source line arvss is set at a level a little higher than the ground potential Vss due to the diode operation of the N-channel MOS transistor MN1. In the source line potential control circuit on the power supply side, the potential of the cell array source line arvdd is set at a level a little lower than the power supply voltage Vdd due to the diode operation of the P-channel MOS transistor MP1. Accordingly, current of the cell array (cell_array) is reduced to such an extent that retained data of the cell array are not destroyed.

<<Deep Standby State>>

In a deep standby state of the SRAM module illustrated in FIG. 35, the control signal cnt, the control signal rs1, the control signal rs2, the control signal rsp1, and the control signal rsp2 are set at a high level, a low level, a low level, a high level, and a high level, respectively.

Therefore, the power switch PWSW, the peripheral circuit power switch PESW21, and the active power switches SW1 and SWP1 are set to an off state. The deep standby switch MN2 of the source line potential control circuit on the ground side is set to an off state, and the deep standby switch MP2 of the source line potential control circuit on the power supply side is set to an off state. As the result, it is possible to reduce greatly the operating current of a cell array (cell_array) of the SRAM module.

Embodiment 22

<<A Configuration of a Semiconductor Integrated Circuit According to Embodiment 22>>

Figure 36:
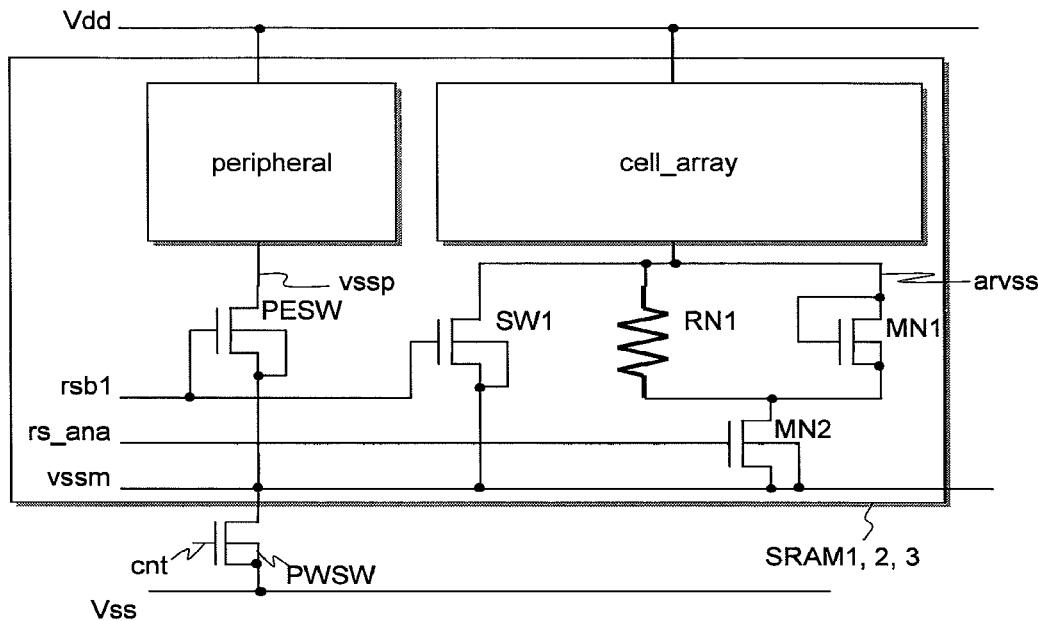
FIG. 36 is a drawing illustrating a configuration of each SRAM module of three SRAM modules (SRAM1, SRAM2, SRAM3) included in a semiconductor integrated circuit according to Embodiment 22 of the present invention.

FIG. 36 illustrates a configuration of each SRAM module of three SRAM modules (SRAM1, SRAM2, SRAM3) included in a semiconductor integrated circuit according to Embodiment 22 of the present invention.

A semiconductor integrated circuit according to Embodiment 22 of the present invention illustrated in FIG. 36 is different from the semiconductor integrated circuit according to Embodiment 20 of the present invention illustrated in FIG. 34 only in the following point.

That is, the difference is that, in each SRAM module of the semiconductor integrated circuit according to Embodiment 20 of the present invention illustrated in FIG. 36, the resistor RN2, the diode coupling N-channel MOS transistor MN3, and the deep standby switch MN4 are omitted from the second source line potential control circuit coupled between the local power line vssm and the cell array source line arvss of each SRAM module of the semiconductor integrated circuit according to Embodiment 20 of the present invention illustrated in FIG. 34.

Embodiment 23

<<A Configuration of a Semiconductor Integrated Circuit According to Embodiment 23>>

Figure 37:
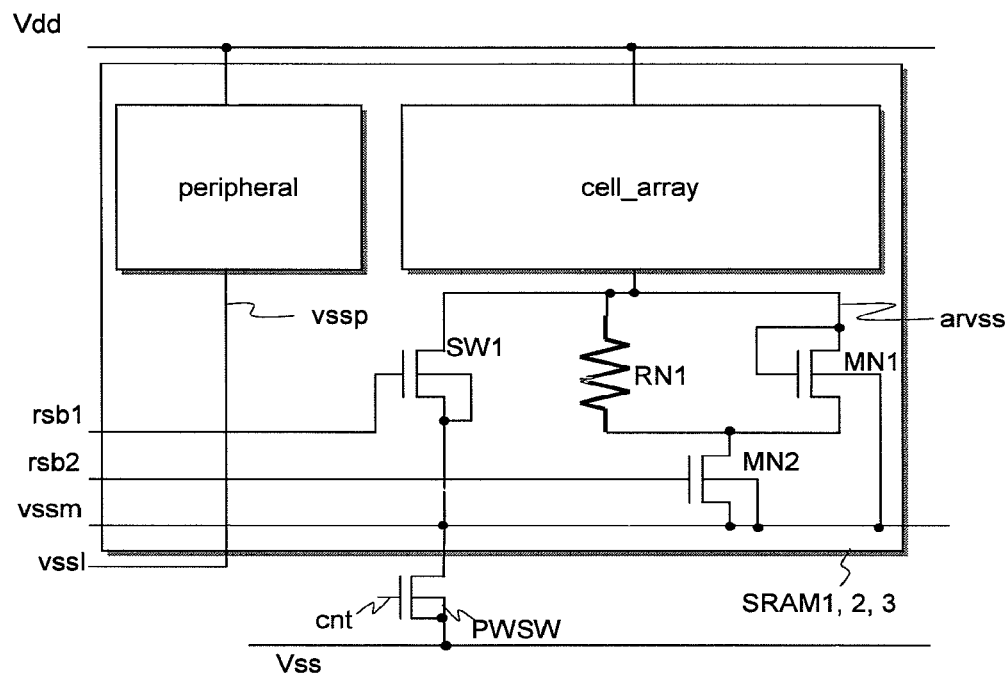
FIG. 37 is a drawing illustrating a configuration of each SRAM module of three SRAM modules (SRAM1, SRAM2, SRAM3) included in a semiconductor integrated circuit according to Embodiment 23 of the present invention.

FIG. 37 illustrates a configuration of each SRAM module of three SRAM modules (SRAM1, SRAM2, SRAM3) included in a semiconductor integrated circuit according to Embodiment 23 of the present invention.

A semiconductor integrated circuit according to Embodiment 23 of the present invention illustrated in FIG. 37 is different from the semiconductor integrated circuit according to Embodiment 22 of the present invention illustrated in FIG. 36 only in the following point.

That is, the difference is that the P-well of the diode coupling N-channel MOS transistor MN1 of the source line potential control circuit of each SRAM module of three SRAM modules (SRAM1, SRAM2, SRAM3) included in the semiconductor integrated circuit according to Embodiment 23 of the present invention illustrated in FIG. 37, is coupled to the local power line vssm instead of the source.

Embodiment 24

<<A Configuration of a Semiconductor Integrated Circuit According to Embodiment 24>>

FIG. 1 illustrates an example of a configuration of a semiconductor integrated circuit according to Embodiment 24 of the present invention which comprises three built-in SRAM modules (SRAM1, SRAM2, SRAM3) according to one of Embodiment 1 through Embodiment 23 of the present invention.

A semiconductor chip of the semiconductor integrated circuit illustrated in FIG. 1 comprises a first central processing unit (CPU1) and a second central processing unit (CPU2) which form a multiple-processor, and an image processing unit (Video) and an audio processing unit (Audio) for moving image encoding/decoding of MPEG2 (MPEG: Moving Picture Expert Group).

Each unit of the first central processing unit (CPU1), the second central processing unit (CPU2), the image processing unit (Video), and the audio processing unit (Audio) comprises three built-in SRAM modules (SRAM1, SRAM2, SRAM3) according to one of Embodiment 1 through Embodiment 23 of the present invention described above. In each unit, the amount of saved data in a deep standby state of the built-in SRAM modules (SRAM1, SRAM2, SRAM3) of each unit changes depending on the operating states of each unit.

According to the semiconductor integrated circuit according to Embodiment 24 of the present invention illustrated in FIG. 1, it becomes possible to respond suitably to such a change of the amount of saved data in a deep standby state.

As described above, the invention accomplished by the present inventors has been concretely explained based on various embodiments. However, it cannot be overemphasized that the present invention is not restricted to the embodiments, and it can be changed variously in the range which does not deviate from the gist.

For example, in the semiconductor integrated circuit according to Embodiment 2 of the present invention illustrated in FIG. 11, or Embodiment 4 of the present invention illustrated in FIG. 18, it is possible to omit either one of the second power switch PWSW22 or the third power switch PWSW23, which are coupled between the ground potential Vss and the second local power line vssm22 shared by the second SRAM module (SRAM2) and the third SRAM module (SRAM3).

Furthermore, in addition to the semiconductor integrated circuit employed for moving image encoding/decoding illustrated in FIG. 1, the present invention can be applied to various system on a chips (SoC), for example, which are usable to various applications, such as plural central processing units which form a multiple-processor for engine control of a car, a micro controller which has an A/D converter or a D/A converter built in, and others.

What is claimed is:

1. A semiconductor device, comprising:
a memory cell array having a plurality of memory cells;
a first power line coupled to the memory cell array;
a second power line coupled to a first potential;
a third power line coupled to a second potential;
a first N-channel transistor which has a first electrode coupled to the first power line, a second electrode coupled to the second power line and a first control gate, the first N-channel transistor controlling conductivity between the first electrode and the second electrode;
a second N-channel transistor which has a third electrode coupled to the first power line, a fourth electrode coupled to the first control gate and a second control gate, the second N-channel transistor controlling conductivity between the third electrode and the fourth electrode;
a third N-channel transistor which has a fifth electrode coupled to the second power line, a sixth electrode coupled to the control gate of the first N-channel transistor and a third control gate, the third N-channel transistor controlling conductivity between the fifth electrode and the sixth electrode;
a P-channel transistor which has a seventh electrode coupled to the third power line, an eighth electrode coupled to the control gate of the first N-channel transistor and a sixth control gate, the P-channel transistor controlling conductivity between the seventh electrode and the eighth electrode; and
a resistor coupled in between the first power line and the second power line,
wherein each of the plurality of memory cells comprising
a fourth N-channel transistor having a first source electrode coupled to the first power line, a first drain electrode and a fourth control gate, and a fifth N-channel transistor having a second source electrode coupled to the first power line, a second drain electrode coupled to the fourth control gate and a fifth control gate coupled to the first drain electrode,
wherein the first, the second, the third and sixth control gates receive signals which control on and off states of each of the transistors based on a first control signal and a second control signal.

2. The semiconductor device according to claim 1, wherein the first control gate is electrically connected to the sixth electrode of the third N-channel transistor, regardless of whether the second N-channel transistor is in an on-state or in an off-state.

3. The semiconductor device according to claim 2, wherein the first control gate is electrically connected to the sixth electrode of the third N-channel transistor, regardless of whether the P-channel transistor is in an on-state or in an off-state.

4. The semiconductor device according to claim 1, wherein the first control gate is electrically connected to the sixth electrode of the third N-channel transistor, regardless of whether the P-channel transistor is in an on-state or in an off-state.

5. The semiconductor device according to claim 1, wherein by setting the third N-channel transistor into on-state, the semiconductor device is capable to be set in a first operating state in which the first N-channel transistor is in an off-state.

6. The semiconductor device according to claim 5, wherein by setting the third N-channel transistor into off-state and setting the second N-channel transistor into on-state, the semiconductor device is capable to be set in a second operating state in which the control gate and the first electrode of the first N-channel transistor are electrically connected.

7. The semiconductor device according to claim 6, wherein by setting the third N-channel transistor into off-state and setting the P-channel transistor into on-state, the semiconductor device is capable to be set in a third operating state in which the first N-channel transistor is in an on-state.

8. A semiconductor device, comprising:
a memory cell array having a plurality of memory cells;
a first power line coupled to the memory cell array;
a second power line coupled to a first potential;
a third power line coupled to a second potential;
a first N-channel transistor which has a first electrode coupled to the first power line, a second electrode coupled to the second power line and a first control gate, the first N-channel transistor controlling conductivity between the first electrode and the second electrode;
a second N-channel transistor which has a third electrode coupled to the first power line, a fourth electrode and a second control gate, the second N-channel transistor controlling conductivity between the third electrode and the fourth electrode;
a third N-channel transistor which has a fifth electrode coupled to the second power line, a sixth electrode coupled to the first control gate and a third control gate, the third N-channel transistor controlling conductivity between the fifth electrode and the sixth electrode; and
a P-channel transistor which has a seventh electrode coupled to the third power line, an eighth electrode coupled to the first control gate and a sixth control gate, the P-channel transistor controlling conductivity between the seventh electrode and the eighth electrode, wherein each of the plurality of memory cells comprising a fourth N-channel transistor having a first source electrode coupled to the first power line, a first drain electrode and a fourth control gate, and a fifth N-channel transistor having a second source electrode coupled to the first power line, a second drain electrode coupled to the fourth control gate and a fifth control gate coupled to the first drain electrode, wherein the first control gate is electrically connected to the sixth electrode, without passing through any transistors having an electrode coupled to the control gate of the P-channel transistor.

9. A semiconductor device, comprising:
a memory cell array having a plurality of memory cells;
a first power line coupled to the memory cell array;
a second power line coupled to a first potential;
a third power line coupled to a second potential;
a first N-channel transistor which has a first electrode coupled to the first power line, a second electrode coupled to the second power line and a first control gate, the first N-channel transistor controlling conductivity between the first electrode and the second electrode;
a second N-channel transistor which has a third electrode coupled to the first power line, a fourth electrode coupled to the first control gate and a third control gate controlled on the basis of a control signal, the second N-channel transistor controlling conductivity between the third electrode and the fourth electrode;
a third N-channel transistor which has a fifth electrode coupled to the second power line, a sixth electrode coupled to the first control gate and a third control gate, the third N-channel transistor controlling conductivity between the fifth electrode and the sixth electrode; and
a P-channel transistor which has a seventh electrode coupled to the third power line, an eighth electrode coupled to the first control gate and a sixth control gate controlled on the basis of the control signal, and which controls conductivity between the seventh electrode and the eighth electrode, wherein each of the plurality of memory cells comprising a fourth N-channel transistor having a first source electrode coupled to the first power line, a first drain electrode and a fourth control gate, and a fifth N-channel transistor having a second source electrode coupled to the first power line, a drain electrode coupled to the fourth control gate and a fifth control gate coupled to the first drain electrode, wherein the first control gate is electrically connected to the sixth electrode, without passing through the second N-channel transistor.

* * * * *